United States Patent [19]
Takahashi

[11] Patent Number: 5,636,066
[45] Date of Patent: Jun. 3, 1997

[54] OPTICAL APPARATUS

[75] Inventor: Tomowaki Takahashi, Yokohama, Japan

[73] Assignee: Nikon Corporation, Japan

[21] Appl. No.: 212,639

[22] Filed: Mar. 10, 1994

[30] Foreign Application Priority Data

Mar. 12, 1993 [JP] Japan .................................. 5-051718
Jun. 8, 1993 [JP] Japan .................................. 5-137641

[51] Int. Cl.⁶ .................................................. G02B 17/00
[52] U.S. Cl. .......................... 359/726; 359/727; 359/629
[58] Field of Search .................................... 359/726, 727, 359/618, 627, 629, 633, 634, 636, 850, 855

[56] References Cited

U.S. PATENT DOCUMENTS

| | | | |
|---|---|---|---|
| 4,747,678 | 5/1988 | Shafer et al. | 350/505 |
| 4,953,960 | 9/1990 | Williamson | 340/442 |
| 5,052,763 | 10/1991 | Singh et al. | 359/355 |
| 5,241,423 | 8/1993 | Chiu et al. | 359/727 |

FOREIGN PATENT DOCUMENTS 51-27116  8/1976  Japan .

*Primary Examiner*—David C. Nelms
*Assistant Examiner*—F. Niranjan
*Attorney, Agent, or Firm*—Pennie & Edmonds

[57] ABSTRACT

Exposure light from a pattern on a first surface advances through a first converging group, is then reflected at the periphery around an aperture on a first plane mirror, thereafter is reflected by a second converging group including a first concave reflecting mirror, and forms a first intermediate image of the pattern in the aperture of first plane mirror. A beam from the first intermediate image passes through a third converging group to form a second intermediate image of the pattern in an aperture of a second plane mirror. A beam from the second intermediate image is reflected by a fourth converging group including a second concave reflecting mirror, thereafter is reflected at the periphery around the aperture of second plane mirror, and then passes through a fifth converging group to form an image of the second intermediate image on a second surface. A projection optical system is arranged as described without using a beam splitter. The projection optical system is composed of a reflecting optical system and a refracting optical system and has little eclipse of beam and a large numerical aperture. Use of such a projection optical system permits a catadioptric projection exposure apparatus excellent in imaging performance to be provided.

64 Claims, 32 Drawing Sheets

OPTICAL APPARATUS

BACKGROUND OF THE INVENTION

1. Field of the Invention

The present invention relates to an optical apparatus used in producing, for example, semiconductor elements or liquid crystal display elements by a photolithography process. More particularly, the invention relates to a catadioptric projection exposure apparatus using a catadioptric projection optical system suitably applicable as a projection optical system for 1:1 projection or for demagnification projection while attaining a resolution of submicron order in the ultraviolet wavelength region.

2. Related Background Art

A projection exposure apparatus is used in producing semiconductor elements or liquid crystal display elements by a photolithography process. The projection exposure apparatus demagnifies, for example, at a ratio of about 5:1 a pattern formed on a photomask or reticle (hereinafter generally referred to as "reticle") through a projection optical system to transfer a demagnified image of the pattern onto a substrate (wafer, glass plate or the like) coated with a photosensitive material (photoresist or the like). With an increase in degree of integration for semiconductor elements, a demand becomes vivid to attain a projection optical system with a higher resolving power for use in a projection exposure apparatus.

To satisfy the demand, the wavelength of illumination light must be shortened, or the numerical aperture (NA) of projection optical system must be increased. However, as the wavelength of illumination light becomes shorter, influence of optical absorption increases so as to limit types of glass materials which can be practically used. Particularly, with wavelength below 300 nm, practically usable glass materials are only synthetic quartz and fluorite. In this case, the two materials have respective Abbe's numbers which are too close to each other to correct the chromatic aberration. Thus, correction of chromatic aberration is extremely difficult if the projection optical system is constituted only by a refracting optical system. Also, the fluorite has bad change characteristics of index of refraction with a change in temperature. That is, it has large changes in temperature characteristics. Further, the fluorite has various problems in machining, e.g., in lens polishing. Because of such problems, the fluorite cannot be used for many parts in the projection optical system. Consequently, it is very difficult to enhance the resolution by the projection optical system constituted only by the refracting optical system.

On the other hand, an attempt has been made to construct a projection optical system only of a reflection optical system, because the reflection optical system causes no chromatic aberration. In this case, the projection optical system must be large in scale and have an aspherical reflection surface. It is also very difficult to constitute the projection optical system only by the reflection optical system.

Then, there are various techniques proposed to construct a reduction projection optical system of a so-called catadioptric optical system which is an optical system in a combination of a reflection optical system and a refracting optical system. An example is the reduction projection exposure apparatus provided with a ring field optical system, as disclosed in Japanese Laid-open Patent Application No. 63-163319. The ring field optical system is so arranged that exposure is carried out by the slit scan exposure method only for an image of a pattern portion in an off-axial annular zone, using an off-axial beam without causing interference between incident light and reflected light.

Another example is a reduction projection exposure apparatus provided with a projection optical system in which a beam splitter composed of a semitransparent mirror is set, as disclosed in Japanese Patent Publication No. 51-27116, Japanese Laid-open Patent Application No. 2-66510, U.S. Patent No. 4953960 or U.S. Pat. No. 5052763. The projection optical system is so arranged that an image of a pattern is projected by the full exposure method using a near-axial beam.

SUMMARY OF THE INVENTION

A first optical apparatus according to the present invention comprises a projection optical system having a first partial imaging optical system for forming a first intermediate image of a pattern existing on a first surface and a second partial imaging optical system for re-imaging the first intermediate image to form an image thereof on a second surface. The first partial imaging optical system comprises a first selection optical system obliquely arranged relative to the optical axis of the first partial imaging optical system and having a reflecting portion and a transmitting portion, a first converging group for converging a beam from the pattern toward the first selection optical system, and a second converging group having a first concave reflecting mirror, for reflecting a beam reflected by the first selection optical system to form the first intermediate image of the pattern in the transmitting portion of the first selection optical system.

In the first optical apparatus as so arranged, the first intermediate image of the pattern on the first surface is formed by the first partial imaging optical system near the optical axis in the transmitting portion of first selection optical system and the first intermediate image is relayed by the second partial imaging optical system onto the second surface. The first partial imaging optical system employs the first concave reflecting mirror, and the first selection optical system having the reflecting portion and the transmitting portion as means for bending the optical path between the first concave reflecting mirror and the refracting optical system. The optical system obviates a beam splitter of half mirror type as employed in the conventional apparatus, which could cause the flare and have a lot of waste of illumination light. The optical system can effectively use most of exposure light. Therefore, the total resolving power is improved and the utilization rate of illumination light is high.

A part of beam is interrupted near the optical axis of first selection optical system and does not contribute to image formation. Thus, the projection optical system has an annular pupil. The imaging properties of projection optical system will be affected depending upon a shielding rate of the pupil. It should be noted, however, that the so-called irregular illumination method is recently proposed to enhance the resolving power by intentionally interrupting light around the optical axis of illumination optical system even for projection exposure apparatus employing a projection optical system which is an ordinary refracting optical system having no shielding portion. A change of image according to the change in imaging properties can be supplemented by properties of photosensitive material or by design of reticle. Even with the interruption of beam, the arrangement of the invention is more advantageous in which a total loss in quantity of light is smaller than that in the arrangement using a half mirror.

A first modification of the above first optical apparatus may be so arranged that the second partial imaging optical system comprises a third converging group having a second concave reflecting mirror for reflecting a beam from the first intermediate image again toward the first selection optical system, and a fourth converging group for converging a beam again reflected by the first selection optical system to form an image of the first intermediate image.

In the first modification of the first optical apparatus, the second partial imaging optical system employs the second concave reflecting mirror. The first selection optical system having the reflecting portion and the transmitting portion as means for bending the optical path between the second concave reflecting mirror and the refracting optical system. Since the two concave reflecting mirrors are used, each concave reflecting mirror may have a doubled radius of curvature as compared with a case using a single concave reflecting mirror, which can reduce the various aberrations.

A second modification of the above first optical apparatus may be so arranged that the second partial imaging optical system comprises a second selection optical system obliquely arranged relative to the optical axis of the second partial imaging optical system and having a reflecting portion and a transmitting portion, a third converging group for converging a beam from the first intermediate image to form a second intermediate image of the pattern in the transmitting portion of the second selection optical system, a fourth converging group having a second concave reflecting mirror for reflecting a beam from the second intermediate image again toward the second selection optical system, and a fifth converging group for converging a beam reflected by the second selection optical system to form an image of the second intermediate image.

In the second modification of the first optical apparatus, the second partial imaging optical system employs the second concave reflecting mirror. The second selection optical system having the reflecting portion and the transmitting portion as means for bending the optical path between the second concave reflecting mirror and the refracting optical system. The second intermediate image is formed as an image of the first intermediate image near the optical axis in the transmitting portion of second selection optical system. Since the two concave reflecting mirrors are used, each concave reflecting mirror may have a doubled radius of curvature as compared with a case using a single concave reflecting mirror, which can reduce the various aberrations. Also, the second partial imaging optical system has the third converging group for relay between the first intermediate image and the second intermediate image, which increases a control range of projection magnification or aberrations.

A second optical apparatus according to the present invention comprises a projection optical system having a first partial imaging optical system for forming an intermediate image of a pattern existing on a first surface and a second partial imaging optical system for re-imaging the intermediate image to form an image thereof on a second surface. The second partial imaging optical system comprises a selection optical system obliquely arranged relative to the optical axis of the second partial imaging optical system and having a reflecting portion and a transmitting portion, a first converging group having a concave reflecting mirror for reflecting a beam from the intermediate image focused in the transmitting portion of the selection optical system again toward the selection optical system, and a second converging group for converging the beam reflected by the selection optical system to form an image of the intermediate image.

In the second optical apparatus, the intermediate image of the pattern on the first surface is formed by the first partial imaging optical system near the optical axis in the transmitting portion of the selection optical system, and the intermediate image is relayed by the second partial imaging optical system onto the second surface. The second partial imaging optical system employs the concave reflecting mirror and the selection optical system having the reflecting portion and the transmitting portion as means for bending the optical path between the concave reflecting mirror and the refracting optical system. The optical system obviates a beam splitter of half mirror type as employed in the conventional apparatus, which could cause the flare and have a lot of waste of illumination light. The optical system can effectively use most of exposure light. Therefore, the total resolving power is improved and the utilization rate of illumination light is high.

A part of beam is interrupted near the optical axis of the selection optical system and does not contribute to image formation. Thus, the projection optical system has an annular pupil. The imaging properties of the projection optical system will be affected depending upon a shielding rate of the pupil. It should be noted, however, that the so-called irregular illumination method is recently proposed to enhance the resolving power by intentionally interrupting light around the optical axis of illumination optical system even for a projection exposure apparatus employing a projection optical system which is an ordinary refracting optical system having no shielding portion. A change of image according to the change in imaging properties can be supplemented by properties of photosensitive material or by design of reticle. Even with the interruption of beam, the arrangement of the invention is more advantageous in which a total loss in quantity of light is smaller than that in the arrangement using a half mirror.

A third optical apparatus according to the present invention comprises a projection optical system having a first partial imaging optical system for forming a first intermediate image of a pattern existing on a first surface and a second partial imaging optical system for re-imaging the first intermediate image to form an image thereof on a second surface. The first partial imaging optical system comprises a first reflecting mirror obliquely arranged relative to the optical axis of the first partial imaging optical system, a first converging group for converging a beam from the pattern, and a second converging group having a first concave reflecting mirror for reflecting a beam from the first converging group to form the first intermediate image of the pattern in the first reflecting mirror.

In the third optical apparatus, the first intermediate image of the pattern on the first surface is formed by the first partial imaging optical system near the optical axis in the first reflecting mirror, and the first intermediate image is relayed by the second partial imaging optical system onto the second surface. The first partial imaging optical system employs the first concave reflecting mirror and the first reflecting mirror as means for bending the optical path between the first concave reflecting mirror and the refracting optical system. The optical system obviates a beam splitter of half mirror type as employed in the conventional apparatus, which could cause the flare and have a lot of waste of illumination light. The optical system can effectively use most of exposure light. Therefore, the total resolving power is improved and the utilization rate of illumination light is high.

A part of beam is interrupted near the optical axis of the first selection optical system and does not contribute to image formation. Thus, the projection optical system has an annular pupil. The imaging properties of the projection optical system will be affected depending upon a shielding rate of the pupil. It should be noted, however, that the so-called irregular illumination method is recently proposed to enhance the resolving power by intentionally interrupting light around the optical axis of illumination optical system even for a projection exposure apparatus employing a projection optical system which is an ordinary refracting optical system having no shielding portion. A change of image according to the change in imaging properties can be supplemented by properties of photosensitive material or by design of reticle. Even with the interruption of beam, the arrangement of the invention is more advantageous in which a total loss in quantity of light is smaller than that in the arrangement using a half mirror.

A first modification of the above third optical apparatus may be so arranged that the second partial imaging optical system comprises a third converging group having a second concave reflecting mirror for reflecting a beam from the first intermediate image, and a fourth converging group for converging a beam from the third converging group to form an image of the first intermediate image.

In the first modification of the third optical apparatus, the second partial imaging optical system employs the second concave reflecting mirror, and the first reflecting mirror as means for bending the optical path between the second concave reflecting mirror and the refracting optical system. Since the two concave reflecting mirrors are used, each concave reflecting mirror may have a doubled radius of curvature as compared with a case using a single concave reflecting mirror, which can reduce the various aberrations.

A second modification of the above third optical apparatus may be so arranged that the second partial imaging optical system comprises a second reflecting mirror obliquely arranged relative to the optical axis of the second partial imaging system, a third converging group for converging a beam from the first intermediate image to form a second intermediate image of the pattern in the second reflecting mirror, a fourth converging group having a second concave reflecting mirror for reflecting a beam from the second intermediate image, and a fifth converging group for converging a beam from the fourth converging group to form an image of the second intermediate image of the pattern.

In the second modification of the third optical apparatus, the second partial imaging optical system employs the second concave reflecting mirror and the second reflecting mirror as means for bending the optical path between the second concave reflecting mirror and the refracting optical system, and the second intermediate image is formed as an image of the first intermediate image near the optical axis in the second reflecting mirror. Since the two concave reflecting mirrors are used, each concave reflecting mirror may have a doubled radius of curvature as compared with a case using a single concave reflecting mirror, which can reduce the various aberrations. Also, the second partial imaging optical system has the third converging group for relay between the first intermediate image and the second intermediate image, which can increase a control range of projection magnification or aberrations.

A fourth optical apparatus according to the present invention comprises a projection optical system having a first partial imaging optical system for forming an intermediate image of a pattern existing on a first surface and a second partial imaging optical system for re-imaging the intermediate image to form an image thereof on a second surface. The second partial imaging optical system comprises a reflecting mirror obliquely arranged relative to the optical axis, a first converging group having a concave reflecting mirror for reflecting a beam from the intermediate image focused in the reflecting mirror, and a second converging group for converging a beam from the first converging group to form an image of the intermediate image.

In the fourth optical apparatus, the intermediate image of the pattern on the first surface is formed by the first partial imaging optical system near the optical axis in the reflecting mirror, and the first intermediate image is relayed by the second partial imaging optical system onto the second surface. The second partial imaging optical system employs the concave reflecting mirror and the reflecting mirror as means for bending the optical path between the concave reflecting mirror and the refracting optical system. The optical system obviates a beam splitter of half mirror type as employed in the conventional apparatus, which could cause the flare and have a lot of waste of illumination light. The optical system can effectively use most of exposure light. Therefore, the total resolving power is improved and the utilization rate of illumination light is high.

A part of beam is interrupted near the optical axis of the first reflecting mirror and does not contribute to image formation. Thus, the projection optical system has an annular pupil. The imaging properties of projection optical system will be affected depending upon a shielding rate of the pupil. It should be noted, however, that the so-called irregular illumination method is recently proposed to enhance the resolving power by intentionally interrupting light around the optical axis of illumination optical system even for a projection exposure apparatus employing a projection optical system which is an ordinary refracting optical system having no shielding portion. A change of image according to the change in imaging properties can be supplemented by properties of photosensitive material or by design of reticle. Even with the interruption of beam, the arrangement of the invention is more advantageous in which a total loss in quantity of light is smaller than that in the arrangement using a half mirror.

In either one of the first to fourth optical apparatus, the projection optical system may further comprise first running means for running the first surface in a first direction with respect to a slit illumination area on the first surface, second running means for running the second surface in a second direction conjugate with the first direction with respect to an exposure area conjugate with the illumination area on the second surface, and controlling means for controlling the first running means and the second running means to synchronize the running of the first surface with the running of the second surface.

In such first to fourth optical apparatus, in case of a projection magnification of the total projection optical system being $\beta$, the first surface is run at velocity V by the controlling means through the first and second running means, and the second surface is run at velocity $\beta V$ in synchronism therewith, whereby images of pattern segments appearing one by one in the illumination area are consecutively formed in the exposure area.

It is preferred in the above first or second optical apparatus that the first selection optical system, the second selection optical system or the selection optical system is a reflecting mirror having an aperture of a predetermined shape as the transmitting portion.

Also, it is preferred in the above third or fourth optical apparatus that the first reflecting mirror, the second reflecting mirror or the reflecting mirror is a small reflecting mirror of a predetermined shape.

Also, it is preferred in the above first or third optical apparatus that Petzval sums $p_1$, $p_2$ and $p_3$ of the first converging group, the second converging group and the second partial imaging optical system satisfy the following conditional equations:

$$p_1 + p_3 > 0 \tag{1'}$$

$$p_2 < 0 \tag{2'}$$

$$-0.1 < p_1 + p_2 + p_3 < 0.1 \tag{3'}$$

It is also preferred that an imaging magnification $\beta_{12}$ of the first intermediate image by the first converging group and the second converging group, and an imaging magnification $\beta_3$ of the image of the first intermediate image by the second partial imaging optical system satisfy the following conditional equations:

$$0.1 \leq |\beta_{12}| \leq 2 \tag{4}$$

$$0.1 \leq |\beta_3| \leq 2 \tag{5}$$

It is preferred that an apparent index of refraction $n_2$, a Petzval sum $p_2$ and a radius of curvature $R_2$ of the first concave reflecting mirror in the second converging group satisfy the following conditional equation:

$$0 \leq n_2 p_2 \leq 2/|R_2| \tag{7}$$

It is preferred that a conjugate relation is established between a peripheral portion where the first intermediate image is focused in the first selection optical system or the first reflecting mirror, and a pupil plane of the second partial imaging optical system. It is preferred that a distance between a rear principal point of the first converging group and a focused position of the first intermediate image in the first selection optical system or the first reflecting mirror is set approximately equal to a focal length of the first converging group so that the projection optical system may be substantially telecentric on the side of the first surface. It is preferred that a distance between a focused position of the first intermediate image in the first selection optical system or the first reflecting mirror and a front principal point of the second partial imaging optical system is set approximately equal to a focal length of the second partial imaging optical system so that the projection optical system is substantially telecentric on the side of the second surface. It is preferred that a distance between a rear principal point of the first converging group and a focused position of the first intermediate image in the first selection optical system or the first reflecting mirror is set approximately equal to a focal length of the first converging group, and that a distance between a focused position of the first intermediate image in the first selection optical system or the first reflecting mirror and a front principal point of the second partial imaging optical system is set approximately equal to a focal length of the second partial imaging optical system so that the projection optical system is substantially telecentric on the side of the first surface and on the side of the second surface.

In such first or third optical apparatus, the Petzval sum of the total projection optical system is set to approximately zero as indicated in Equation (3'), which improves the imaging performance and makes the surface of projected image flatter. If the Petzval sum were not set to approximately zero, the surface of projected image would not have been flat but curved. Unless at least the condition of Equation (3') is satisfied, the surface of projected image is not flat enough. If the Petzval sum is lower than the lower limit of Equation (3'), the surface of projected image would be curved as concave to the first surface. If the Petzval sum is over the upper limit of Equation (3'), the surface of projected image would be curved as convex to the first surface.

Also, the Petzval sum of the total projection optical system is composed of two partial sums, which are opposite in sign to each other and satisfy the conditions of Equations (1') and (2'), respectively. Thus, the condition of Equation (3') can be satisfied more easily.

The imaging magnifications of the first intermediate image and the image of the first intermediate image are set as indicated in Equation (4) and Equation (5), which enhances the utilization rate of illumination light and improves the imaging performance. If the imaging magnification of the first intermediate image is lower than the lower limit of Equation (4), the transmitting portion of the first selection optical system or the first reflecting mirror must be largely increased, which increases the shielding rate and the loss in quantity of light and degrades the imaging performance. If the imaging magnification of the first intermediate image is over the upper limit of Equation (4), the aberrations increase in image formation of the first intermediate image to degrade the imaging performance. If the imaging magnification of the image of the first intermediate image is lower than the lower limit of Equation (5), the aberrations increase in image formation of the image of the first intermediate image to degrade the imaging performance. If the imaging magnification of the image of the first intermediate image is over the upper limit of Equation (5), the transmitting portion of the first selection optical system or the first reflecting mirror must be largely increased, which increases the shielding rate so as to increase the loss in quantity of light and degrades the imaging performance.

Also, the product of the apparent index of refraction and the Petzval sum in the second converging group is set as shown in Equation (7). The condition of Equation (3') can be satisfied more easily. If the product in the second converging group is lower than the lower limit of Equation (7), the Petzval sum of the total projection optical system will become positively too large. If the product in the second converging group is over the upper limit of Equation (7), the Petzval sum of the total projection optical system will be negatively too large.

Also, if the conjugate relation is established between the peripheral portion where the first intermediate image is focused in the first selection optical system or the first reflecting mirror and the pupil plane of the second partial imaging optical system, the imaging properties of the total projection optical system can remain excellent irrespective of the image height. If the above conjugate relation were destroyed, the shielding portion by the transmitting portion of first selection optical system or the first reflecting mirror would have been shifted from the center on the pupil plane of the second partial imaging optical system in accordance with the image height. This could cause a disadvantage such that the imaging properties of the total projection optical system change depending upon the image height.

Further, if the projection optical system is substantially telecentric on the first surface side, the illumination optical system can be constructed in a compact scale, which is advantageous. If the optical system is substantially telecentric on the second surface side, the magnification may remain unchanged even with a slight change in distance between the projection optical system and the second surface. This is advantageous in that no deviation in dimensions occurs upon superimposed printings of patterns. If the optical system is substantially telecentric on the first surface side and on the second surface side, the illumination optical system can be constructed in a compact size, and the magnification can remain unchanged even with a slight change in distance between the projection optical system and the second surface. This is also advantageous in which no deviation in dimensions occurs upon superimposed printings of patterns.

It is also preferred in the first modification of the above first or third optical apparatus that the Petzval sums $p_1$, $p_2$, $p_4$ and $p_5$ of the first converging group, the second converging group, the third converging group and the fourth converging group satisfy the following conditional equations:

$$p_1 + p_3 > 0 \tag{1'}$$

$$p_2 + p_4 < 0 \tag{2}$$

$$|p_1 + p_2 + p_4 + p_5| < 0.1 \tag{3''}$$

It is preferred that an imaging magnification $\beta_{12}$ of the first intermediate image by the first converging group and the image of the first converging group, and an imaging magnification $\beta_{45}$ of the second intermediate image by the third converging group and the fourth converging group satisfy the following conditional equations:

$$0.1 \leq |\beta_{12}| \leq 2 \tag{4}$$

$$0.1 \leq |\beta_{45}| \leq 2 \tag{6}$$

It is preferred that an apparent index of refraction $n_2$, a Petzval sum $p_2$ and a radius of curvature $R_2$ of the first concave reflecting mirror in the second converging group satisfy the following conditional equation:

$$0 \leq n_2 p_2 \leq 2/|R_2| \tag{7}$$

and that an apparent index of refraction $n_4$, a Petzval sum $p_4$ and a radius of curvature $R_4$ of the second concave reflecting mirror in the third converging group satisfy the following conditional equation:

$$0 \leq n_4 p_4 \leq 2/|R_4| \tag{8}$$

It is preferred that a distance between a rear principal point of the first converging group and a focused position of the first intermediate image in the first selection optical system or the first reflecting mirror is set approximately equal to a focal length of the first converging group so that the projection optical system may be substantially telecentric on the side of the first surface. It is preferred that a distance between a focused position of the first intermediate image in the first selection optical system or the first reflecting mirror and a front principal point of the fourth converging group is set approximately equal to a focal length of the fourth converging group so that the projection optical system may be substantially telecentric on the side of the second surface. It is preferred that a distance between a rear principal point of the first converging group and a focused position of the first intermediate image in the first selection optical system or the first reflecting mirror is set approximately equal to a focal length of the first converging group, and a distance between a focused position of the first intermediate image in the first selection optical system or the first reflecting mirror and a front principal point of the fourth converging group is set approximately equal to a focal length of the fourth converging group so that the projection optical system is substantially telecentric on the side of the first surface and on the side of the second surface.

In such first modification of the first or third optical apparatus, the Petzval sum of the total projection optical system is set to approximately zero as shown in Equation (3") to improve the imaging performance and make the surface of projected image flatter. If the Petzval sum were not set to approximately zero, the surface of projected image would have been flat but curved. Unless at least the condition of Equation (3") is satisfied, the surface of projected image cannot be flat enough. If the Petzval sum is lower than the lower limit of Equation (3"), the surface of projected image would be curved as concave to the first surface. If the Petzval sum is over the upper limit of Equation (3"), the surface of projected image would be curved as convex to the first surface.

The Petzval sum of the total projection optical system is composed of two partial sums, which are opposite in sign to each other and satisfy Equation (1') and Equation (2), respectively. This arrangement permits the condition of Equation (3") to be satisfied more easily.

Further, the imaging magnifications of the first and second intermediate images are set as indicated in Equation (4) and Equation (6) to enhance the utilization rate of illumination light and improve the imaging performance. If the imaging magnification of the first intermediate image is lower than the lower limit of Equation (4), the transmitting portion of the first selection optical system or the first reflecting mirror must be largely increased, which increases the shielding rate so as to increase the loss in quantity of light and degrades the imaging performance. If the imaging magnification of the first intermediate image is over the upper limit of Equation (4), the aberrations increase in image formation of the first intermediate image to degrade the imaging performance. If the imaging magnification of the second intermediate image is lower than the lower limit of Equation (6), the aberrations increase in image formation of the second intermediate image to degrade the imaging performance. If the imaging magnification of the image of the first intermediate image is over the upper limit of Equation (6), the transmitting portion of the second selection optical system or the second reflecting mirror must be largely increased, which increases the shielding rate so as to increase the loss in quantity of light and degrades the imaging performance.

Also, since the product of the apparent index of refraction and the Petzval sum for each of the second and third converging groups is set as indicated in Equation (7) or Equation (8), the condition of Equation (3') can be satisfied more easily. If the product in either the second or third converging group is lower than the lower limit of Equation (7) or Equation (8), the Petzval sum of the total projection optical system would be positively too large. If the product in either the second or third converging group is over the upper limit of Equation (7) or Equation (8), the Petzval sum of the total projection optical system would be negatively too large.

Further, if the projection optical system is substantially telecentric on the first surface side, the illumination optical system can be constructed in a compact scale, which is advantageous. If the optical system is substantially telecentric on the second surface side, the magnification may be kept unchanged even with a slight change in distance between the projection optical system and the second surface. This is advantageous in which no deviation in dimensions occurs upon superimposed printings of patterns. If the optical system is substantially telecentric on the first surface side and on the second surface side, the illumination optical system can be constructed in a compact size, and the magnification can be kept unchanged even with a slight change in distance between the projection optical system and the second surface. This is also advantageous in which no deviation in dimensions occurs upon superimposed printings of patterns.

Also, it is preferred in the second modification of the first or third optical apparatus that Petzval sums $p_1$, $p_2$, $p_3$, $p_4$ and $p_5$ of the first converging group, the second converging group, the third converging group, the fourth converging group and the fifth converging group satisfy the following conditional equations:

$$p_1+p_3+p_5>0 \qquad (1)$$

$$p_2+p_4<0 \qquad (2)$$

$$|p_1+p_2+p_3+p_4+p_5|<0.1 \qquad (3).$$

It is preferred that an imaging magnification $\beta_{12}$ of the first intermediate image by the first converging group and the second converging group, an imaging magnification $\beta_3$ of the second intermediate image by the third converging group, and an imaging magnification $\beta_{45}$ of the image of the second intermediate image by the fourth converging group and the fifth converging group satisfy the following conditional equations:

$$0.1 \leq |\beta_{12}| \leq 2 \qquad (4)$$

$$0.1 \leq |\beta_3| \leq 2 \qquad (5)$$

$$0.1 \leq |\beta_{45}| \leq 2 \qquad (6)$$

It is preferred that an apparent index of refraction $n_2$, a Petzval sum $p_2$ and a radius of curvature $R_2$ of the first concave reflecting mirror in the second converging group satisfy the following conditional equation:

$$0 \leq n_2 p_2 \leq 2/|R_2| \qquad (7)$$

and that an apparent index of refraction $n_4$, a Petzval sum $p_4$ and a radius of curvature $R_4$ of the second concave reflecting mirror in the fourth converging group satisfy the following conditional equation:

$$0 \leq n_4 p_4 \leq 2/|R_4| \qquad (8).$$

It is preferred that a conjugate relation is established between a peripheral portion where the first intermediate image is focused in the first selection optical system or the first reflecting mirror, and a pupil plane of the third converging group and wherein another conjugate relation is also established between a peripheral portion where the second intermediate image is focused in the second selection optical system or the second reflecting mirror, and the pupil plane of the third converging group. It is preferred that a distance between a rear principal point of the first converging group and a focused position of the first intermediate image in the first selection optical system or the reflecting mirror is set approximately equal to a focal length of the first converging group so that the projection optical system may be substantially telecentric on the side of the first surface. It is preferred that a distance between a focused position of the second intermediate image in the second selection optical system or the second reflecting mirror and a front principal point of the fifth converging group is set approximately equal to a focal length of the fifth converging group so that the projection optical system may be substantially telecentric on the side of the second surface. It is preferred that a distance between a rear principal point of the first converging group and a focused position of the first intermediate image in the first selection optical system or the first reflecting mirror is set approximately equal to a focal length of the first converging group and a distance between a focused position of the second intermediate image in the second selection optical system or the second reflecting mirror and a front principal point of the fifth converging group is set approximately equal to a focal length of the fifth converging group so that the projection optical system may be substantially telecentric on the side of the first surface and on the side of the second surface.

In the second modification of the first or third optical apparatus, the Petzval sum of the total projection optical system is set to approximately zero as shown in Equation (3) to improve the imaging performance and make the surface of projected image flatter. If the Petzval sum were not set to approximately zero, the surface of projected image would not have been flat but curved. Unless at least the condition of Equation (3) is satisfied, the surface of projected image cannot be flat enough. If the Petzval sum is lower than the lower limit of Equation (3), the surface of the projected image would be curved as concave to the first surface. If the Petzval sum is over the upper limit of Equation (3), the surface of the projected image would be curved as convex to the first surface.

Also, the Petzval sum of the total projection optical system is composed of two partial sums, which are opposite in sign to each other and satisfy Equation (1) and Equation (2), respectively. This arrangement permits the condition of Equation (3) to be satisfied more easily.

Further, the imaging magnifications of the first and second image and the image of the second intermediate images are set as indicated in Equation (4) to Equation (6) to enhance the utilization rate of illumination light and improve the imaging performance. If the imaging magnification of the first intermediate image is lower than the lower limit of Equation (4), the transmitting portion of the first selection optical system or the first reflecting mirror must be largely increased, which increases the shielding rate so as to increase the loss in quantity of light and degrades the imaging performance. If the imaging magnification of the first intermediate image is over the upper limit of Equation (4), the aberrations increase in image formation of the first intermediate image to degrade the imaging performance. If the imaging magnification of the second intermediate image is lower than the lower limit of Equation (5), the transmitting portion of the second selection optical system or the second reflecting mirror must be largely increased, which increases the shielding rate so as to increase the loss in quantity of light and degrades the imaging performance. If the imaging magnification of the second intermediate image is over the upper limit of Equation (5), the aberrations increase in image formation of the second intermediate image so as to degrade the imaging performance. If the imaging magnification of the image of the second intermediate image is lower than the lower limit of Equation (6), the aberrations increase in image formation of the image of the second intermediate image to degrade the imaging performance. If the imaging magnification of the image of the second intermediate image is over the upper limit of Equation (6), the transmitting portion of the second selection optical system or the second reflecting mirror must be largely increased, which increases the shielding rate so as to increase the loss in quantity of light and degrades the imaging performance.

Also, since the product of the apparent index of refraction and the Petzval sum in the second converging group is set as indicated in Equation (7), the condition of Equation (3') can be satisfied more easily. If the product in the second converging group is lower than the lower limit of Equation (7), the Petzval sum of the total projection optical system would be positively too large. If the product in the second converging group is over the upper limit of Equation (7), the Petzval sum of the total projection optical system would be negatively too large.

Also, if the conjugate relation is established between the peripheral portion where the first intermediate image is focused in the first selection optical system or the first reflecting mirror and the pupil plane of second partial imaging optical system and between the peripheral portion where the second intermediate image is focused in the second selection optical system or the second reflecting mirror and the pupil plane of the third converging group, the imaging properties of the total projection optical system can be kept excellent irrespective of the image height. If the above conjugate relation were destroyed, the shielding portion by the transmitting portion of the first or second selection optical system or the first or second reflecting mirror would have been shifted from the center on the pupil plane of the third converging group in accordance with the image height. This could cause a disadvantage such that the imaging properties of the total projection optical system change depending upon the image height.

Further, if the projection optical system is substantially telecentric on the first surface side, the illumination optical system can be constructed in a compact scale, which is advantageous. If the optical system is substantially telecentric on the second surface side, the magnification may remain unchanged even with a slight change in distance between the projection optical system and the second surface. This is advantageous in which no deviation in dimensions occurs upon superimposed printings of patterns. If the optical system is substantially telecentric on the first surface side and on the second surface side, the illumination optical system can be constructed in a compact size, and the magnification can remain unchanged even with a slight change in the distance between the projection optical system and the second surface. This is also advantageous in which no deviation in dimensions occurs upon superimposed printings of patterns.

Also, it is preferred that Petzval sums $p_3$, $p_4$ and $p_5$ of the first partial imaging optical system, the converging group and the second converging group satisfy the following conditional equations:

$$p_3+p_5>0 \qquad (1''')$$

$$p_4<0 \qquad (2''')$$

$$|p_3+p_4+p_5|<0.1 \qquad (3''')$$

It is preferred that an imaging magnification $\beta_3$ of the intermediate image by the first partial imaging optical system, and an imaging magnification $\beta_{45}$ of the image of the intermediate image by the first converging group and the second converging group satisfy the following conditional equations:

$$0.1 \leq |\beta_3| \leq 2 \qquad (5)$$

$$0.1 \leq |\beta_{45}| \leq 2 \qquad (6).$$

It is preferred that an apparent index of refraction $n_4$, a Petzval sum $p_4$ and a radius of curvature $R_4$ of the concave reflecting mirror in the first converging group satisfy the following conditional equation:

$$0 \leq n_4 p_4 \leq 2/|R_4| \qquad (8).$$

It is preferred that a conjugate relation is established between a pupil plane of the first partial imaging optical system and a peripheral portion where the intermediate image is focused in the selection optical system on the reflecting mirror. It is preferred that a distance between a rear principal point of the first partial imaging optical system and a focused position of the intermediate image in the selection optical system on the reflecting mirror is set approximately equal to a focal length of the first partial imaging optical system so that the projection optical system may be substantially telecentric on the side of the first surface. It is preferred that a distance between a focused position of the intermediate image in the selection optical system on the reflecting mirror and a front principal point of the second converging group is set approximately equal to a focal length of the second converging group so that the projection optical system may be substantially telecentric on the side of the second surface. It is preferred that a distance between a rear principal point of the first partial imaging optical system and a focused position of the first intermediate image in the selection optical system on the reflecting mirror is set approximately equal to a focal length of the first partial imaging optical system and a distance between the focused position of the intermediate image in the selection optical system on the reflecting mirror and a front principal point of the second converging group is set approximately equal to a focal length of the second converging group so that the projection optical system may be substantially telecentric on the side of the first surface and on the side of the second surface.

In the second or fourth optical apparatus, the Petzval sum of the total projection optical system is set to approximately zero as shown in Equation (3''') to improve the imaging performance and make the surface of projected image flatter. If the Petzval sum were not set to approximately zero, the surface of projected image would not have been flat but curved. Unless at least the condition of Equation (3''') is satisfied, the surface of projected image cannot be flat enough. If the Petzval sum is lower than the lower limit of Equation (3'''), the surface of projected image would be curved as concave to the first surface. If the Petzval sum is over the upper limit of Equation (3'''), the surface of projected image would be curved as convex to the first surface.

Also, the Petzval sum of the total projection optical system is composed of two partial sums, which are opposite in sign to each other and satisfy Equation (1''' ) and Equation (2'''), respectively. This arrangement permits the condition of Equation (3''') to be satisfied more easily.

Further, the imaging magnifications of the intermediate image and the image thereof are set as indicated in Equation (5) and Equation (6), which enhances the utilization rate of illumination light and improves the imaging performance. If the imaging magnification of the intermediate image is lower than the lower limit of Equation (5), the transmitting portion of the selection optical system on the reflecting mirror must be largely increased, which increases the shielding rate so as to increase the loss in quantity of light and degrades the imaging performance. If the imaging magnification of the intermediate image is over the upper limit of Equation (5), the aberrations increase in image formation of the intermediate image to degrade the imaging performance. If the imaging magnification of the image of the intermediate image is lower than the lower limit of Equation (6), the aberrations increase the image formation of the image of the intermediate image to degrade the imaging performance. If the imaging magnification of the intermediate image is over the upper limit of Equation (6), the transmitting portion of the selection optical system on the reflecting mirror must be largely increased, which increases the shielding rate so as to increase the loss in quantity of light and degrades the imaging performance.

Also, since the product of the apparent index of refraction and the Petzval sum in the first converging group is set as indicated in Equation (8), the condition of Equation (3''') can be satisfied more easily. If the product in the first converging group is lower than the lower limit of Equation (8), the Petzval sum of the total projection optical system would be positively too large. If the product in the first converging group is over the upper limit of Equation (8), the Petzval sum of the total projection optical system would be negatively too large.

Also, if the conjugate relation is established between the pupil plane of the first partial imaging optical system and the peripheral portion where the intermediate image is focused in the selection optical system on the reflecting mirror, the imaging properties of the total projection optical system can remain excellent irrespective of the image height. If the above conjugate relation were destroyed, the shielding portion by the transmitting portion of the selection optical system on the reflecting mirror would have been shifted from the center on the pupil plane of first partial imaging optical system in accordance with the image height. This could cause a disadvantage such that the imaging properties of the total projection optical system change depending upon the image height.

Further, if the projection optical system is substantially telecentric on the first surface side, the illumination optical system can be constructed in a compact scale, which is advantageous. If the optical system is substantially telecentric on the second surface side, the magnification may remain unchanged even with a slight change in distance between the projection optical system and the second surface. This is advantageous in which no deviation in dimensions occurs upon superimposed printings of patterns. If the optical system is substantially telecentric on the first surface side and on the second surface side, the illumination optical system can be constructed in a compact size, and the magnification can remain unchanged even with a slight change in distance between the projection optical system and the second surface. This is also advantageous in which no deviation in dimensions occurs upon superimposed printings of patterns.

The second optical apparatus is optically equivalent to what is obtained by eliminating the first selection optical system, the first converging group and the second converging group from the second modification of the first optical apparatus. Also, the fourth optical apparatus is optically equivalent to what is obtained by eliminating the first reflecting mirror, the first converging group and the second converging group from the second modification of the third optical apparatus.

Also, the third optical apparatus is optically equivalent to what is obtained by exchanging the first selection optical system and the first reflecting mirror for each other and also changing the location of the first concave reflecting mirror in the first optical apparatus. Further, the fourth optical apparatus is optically equivalent to what is obtained by exchanging the selection optical system and the reflecting mirror for each other and also changing the location of the concave reflecting mirror in the second optical apparatus.

Accordingly, the first to fourth optical apparatus are optically equivalent to each other. Assuming that a Petzval sum for a converging group or partial imaging optical system excluded from the optical apparatus is zero, Equation (1) is equivalent to Equation (1') and Equation (1''); Equation (2) to Equation (2') and Equation (2''); Equation (3) to Equation (3''), Equation (3''') and Equation (3''').

Here, in Equations (1) to (3), the Petzval sums $p_1$, $p_2$ and $p_3$ can be expressed by the following equations.

$$p_1 = 1/(f_1 n_1) \tag{9}$$

$$p_2 = 1/(f_2 n_2) \tag{10}$$

$$p_3 = 1/(f_3 n_3) \tag{11}$$

In the above equations, $f_1$ to $f_3$ are focal lengths of the converging groups and $n_1$ to $n_3$ apparent indices of refraction of the converging groups.

DESCRIPTION OF THE PREFERRED EMBODIMENTS

Figure 1:
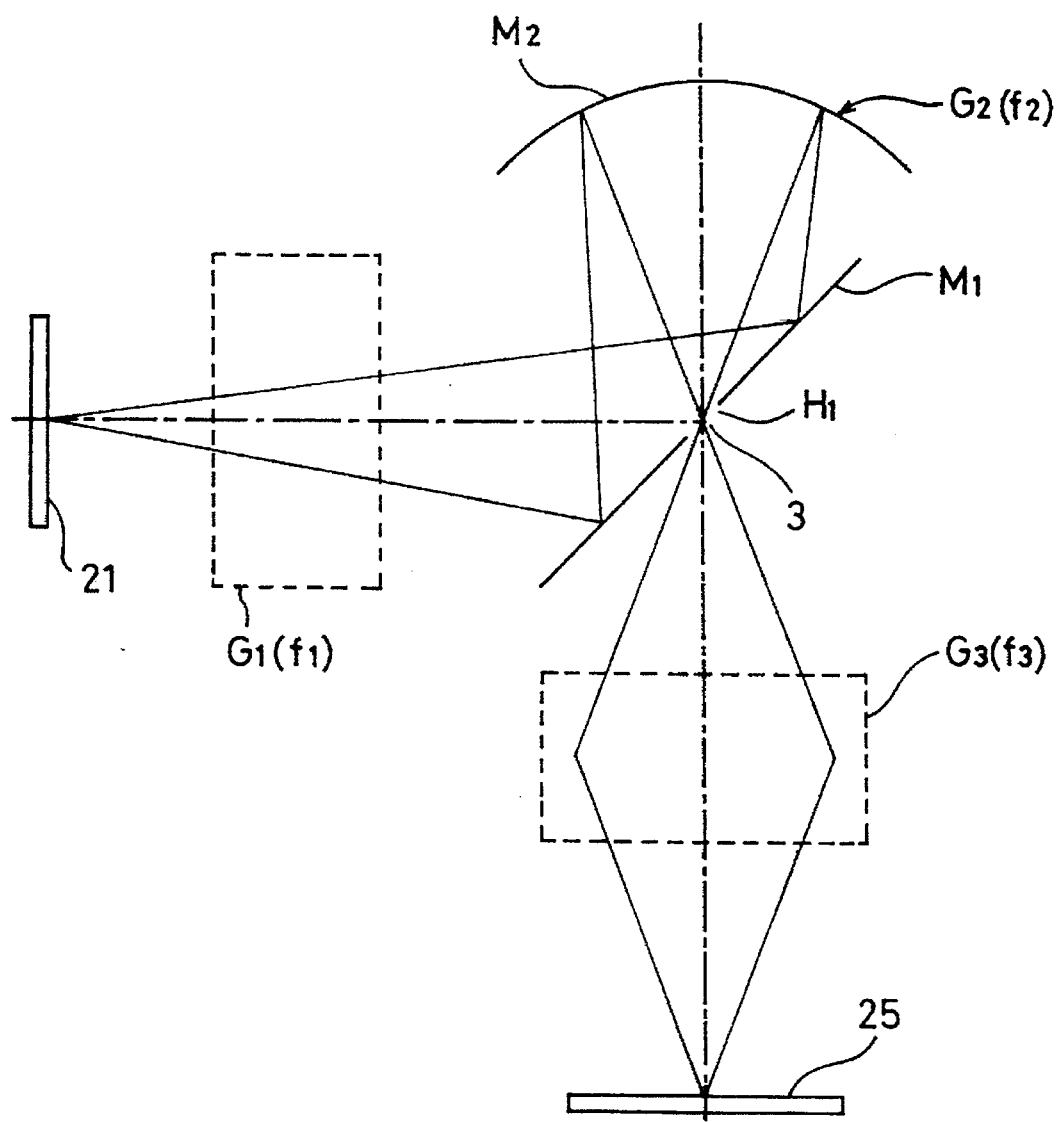
FIG. 1 is a structural drawing to show a basic structure of a catadioptric exposure apparatus of full exposure method in the first embodiment of the present invention.

The structure and operation will be described for each of various embodiments of catadioptric projection exposure apparatus according to the present invention with reference to the accompanying drawings. In the description of the drawings, identical elements will be denoted by same reference numerals and properly omitted to explain to avoid redundancy. It should be noted that the dimensions of the drawings are not always coincident with those in the description.

The following embodiments involve examples in which the present invention is applied to a projection exposure apparatus provided with a projection optical system which projects at a certain magnification ratio (including a ratio of 1:1) an image of a pattern formed on a reticle onto a wafer coated with a photoresist by the full exposure method or by the slit scan exposure method.

The following embodiments disclose the details of projection optical system and stage mechanism, whereas an alignment mechanism is not fully disclosed therein. Reference should be made, for example, to U. S. patent application Ser. No. 08/091501 disclosing the details of alignment mechanism.

Also, the reticle is illustrated as an object plane and the wafer as an image plane in each drawing as referred to in the description of the basic structure of projection optical system in each embodiment.

Further, a developed path diagram is provided to show a lens arrangement in each embodiment, in which a reflecting surface is illustrated as a transmissive surface and optical elements are arranged in the order in which a beam from the reticle passes. Also, a concave reflecting mirror portion is illustrated as a flat hypothetical plane. For indication of lens shape and separation, a pattern surface of reticle is defined as a zeroth surface and each surface as an i-th surface (i=1, 2, . . . ) in the order in which a beam outgoing from the reticle passes before reaching the wafer. A radius of curvature of the i-th surface is expressed by $r_i$ and a sign thereof is positive if the surface is convex to the reticle in each developed path diagram. Also, $d_i$ denotes a surface separation between the i-th surface and the (i+1)-th surface. As for the glass materials, $CaF_2$ represents the fluorite and $SiO_2$ the quartz glass. These quartz glass and fluorite have the following indices of refraction for operating base wavelength (248 nm):

Quartz glass: 1.508327

Fluorite: 1.467845

Also, in case of the operating base wavelength of 193 nm, the quartz glass has the following index of refraction:

Quartz glass: 1.56100

First Embodiment

In the first embodiment of a catadioptric projection exposure apparatus according to the present invention, an apparatus has the basic structure of full exposure method, for example as shown in FIG. 1, provided with a projection optical system for projecting an image of a pattern formed on a reticle (21) onto a wafer (25). The projection optical system includes a first partial imaging optical system for forming an intermediate image (3) of the pattern present on the reticle (21), and a second partial imaging optical system for re-imaging the intermediate image (3) to form an image thereof on the wafer (25).

The first partial imaging optical system is composed of a first converging group $G_1$, a plane mirror (selection optical system) $M_1$ and a second converging group $G_2$. The first converging group $G_1$ has a focal length $f_1$ and a positive refracting power, which converges a beam from the pattern on the reticle (21) toward the plane mirror $M_1$. The plane mirror $M_1$ has an aperture $H_1$ at the center and is inclined at 45° relative to the optical axis of the first partial imaging optical system. The plane mirror $M_1$ reflects a beam from the first converging group $G_1$ toward the second converging group $G_2$, and permits a beam from the second converging group $G_2$ to pass through the aperture toward the third converging group $G_3$. The second converging group $G_2$ includes a concave reflecting mirror $M_2$ and has a focal length $f_2$ and a positive refracting power. The second converging group $G_2$ reflects a beam from the plane mirror $M_1$ to form the intermediate image (3) of the pattern in the aperture $H_1$ of plane mirror $M_1$.

The second partial imaging optical system is composed of the third converging group $G_3$. The third converging group $G_3$ has a focal length $f_3$ and a positive refracting power. The third converging group $G_3$ converges a beam from the intermediate image (3) to form an image of the intermediate image (3) on the wafer (25).

As so arranged, a beam from the pattern on the reticle (21) advances through the first converging group $G_1$, is reflected at the periphery of plane mirror $M_1$, thereafter is reflected by the second converging group $G_2$ including the concave reflecting mirror $M_2$, and then forms the intermediate image (3) of the pattern in the aperture $H_1$ of plane mirror $M_1$. Subsequently, the beam from the intermediate image (3) passes through the third converging group $G_3$ to form an image of the intermediate image (3) on the surface of wafer (25).

Figure 2:
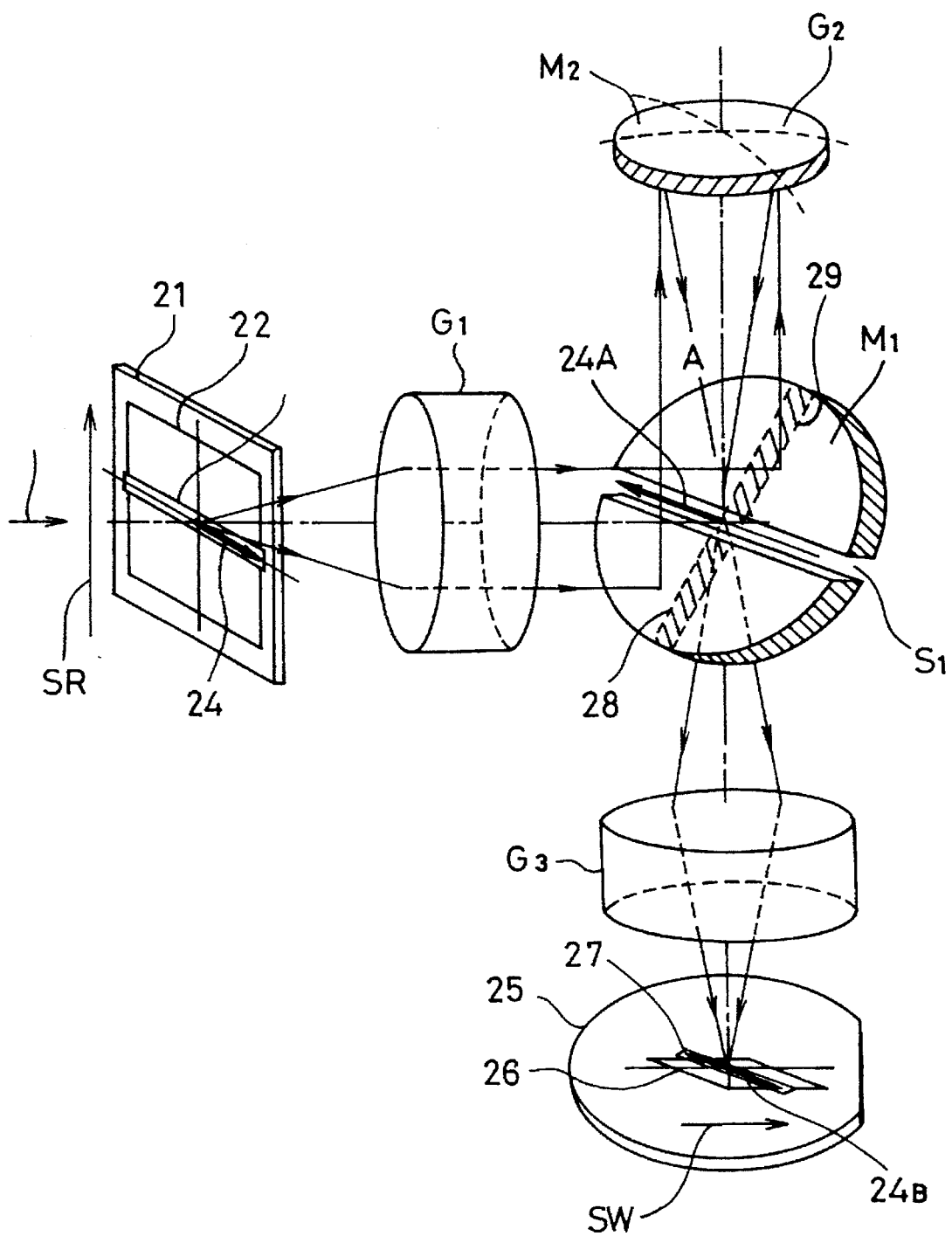
FIG. 2 is a perspective view to show the basic structure of a catadioptric projection exposure apparatus of slit scan exposure method in the first embodiment.
Figure 3:
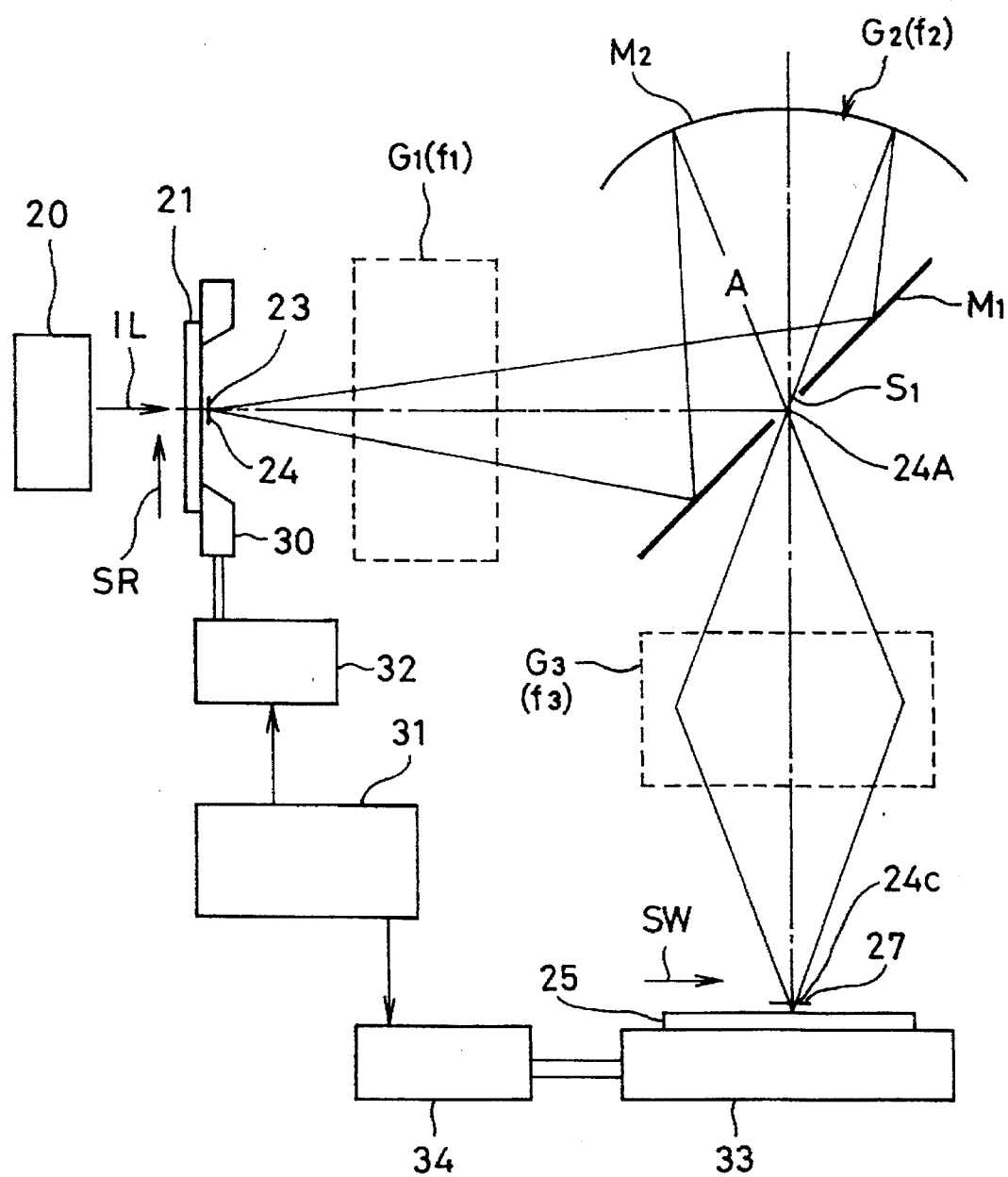
FIG. 3 is a structural drawing to show a stage mechanism in the optical apparatus of slit scan exposure method in the first embodiment.

In the next place, the basic structure of an apparatus of slit scan exposure method in the first embodiment further involves a stage mechanism for consecutively projecting images of segments of a pattern formed on the reticle (21) onto the wafer (25), for example as shown in FIG. 2 and FIG. 3. The stage mechanism is constructed of a reticle stage (30), a wafer stage (33), a reticle stage control system (32), a wafer stage control system (34) and a main control system (31).

The reticle stage (30) moves or runs the reticle (21) relative to a slit illumination area (23) formed by exposure light IL from an illumination optical system (20) in a pattern area (22) of reticle (21) in the direction of SR perpendicular to the longitudinal direction of the illumination area (23). The wafer stage (33) moves or runs the wafer (25) relative to an exposure area (27) conjugate with the slit illumination area (23) in a shot area (26) in the wafer (25) in the direction of SW conjugate with the direction of SR. The main control system (31) adjusts a relative velocity based on a projection magnification β of the overall projection optical system through the reticle stage control system (32) and the wafer stage control system (34) to set a running velocity V of reticle (21) and a running velocity βV of wafer (25) and also to set running timings of reticle (21) and wafer (25) as synchronized with each other.

In the projection optical system, the illumination area (23) is shaped in an elongate rectangle. The plane mirror $M_1$ has a slender aperture $S_1$ at the center. The longitudinal direction of the aperture $S_1$ is parallel to the longitudinal direction of the illumination area (23), and the width of the aperture $S_1$ is set 10 to 20% narrower than the width of a beam incident into the plane mirror $M_1$. Additionally, slender light shield regions (28) and (29) may be provided in the direction perpendicular to the longitudinal direction of the aperture $S_1$ on the plane mirror $M_1$ to cancel the directionality of imaging properties. Also, the optical axis of the projection optical system is parallel to the plane of FIG. 2 or FIG. 3. The longitudinal direction of the illumination area (23) and the longitudinal direction of the aperture $S_1$ both are perpendicular to the plane of FIG. 3. The plane mirror $M_1$ is set as rotated 45° relative to the optical axis of the projection optical system about the axis perpendicular to the plane of FIG. 3.

As so arranged, illumination light IL from the illumination optical system (20) is irradiated onto the illumination area (23) on the pattern area (22) of reticle (21). A beam from a pattern (24) in the illumination area (23) advances through the first converging group $G_2$ and is reflected at the periphery of plane mirror $M_1$. Subsequently, the beam is reflected by the second converging group $G_2$ including the concave reflecting mirror $M_2$ and the reflected beam A forms an intermediate image (24A) of the pattern in the aperture $S_1$ of plane mirror $M_1$. Then a beam from the intermediate image (24A) passes through the third converging group $G_3$ to form an image (24B) of the intermediate image (24A) in the exposure area (27) on the exposure field (26) in the wafer (25).

The main control system (31) sets the running velocity V and the running timing of reticle stage (30) through the reticle stage control system (32). With the projection magnification β of the overall projection optical system, the main control system (31) also sets the running velocity of wafer stage (33) to βV while adjusting the relative velocity to the reticle stage (30) through the wafer stage control system (34). The main control system (31) also sets the running timing of wafer stage (33) as synchronized with the running of reticle stage (30) through the wafer stage control system (34). Thus, the reticle (21) is run relative to the illumination area (23) by the reticle stage (30) at velocity V in the direction of SR perpendicular to the longitudinal direction of the illumination area (23). Also, the wafer (25) is run relative to the exposure area (27) conjugate with the illumination area (23) by the wafer stage (33) in the direction of SW conjugate with the direction of SR.

Figure 4:
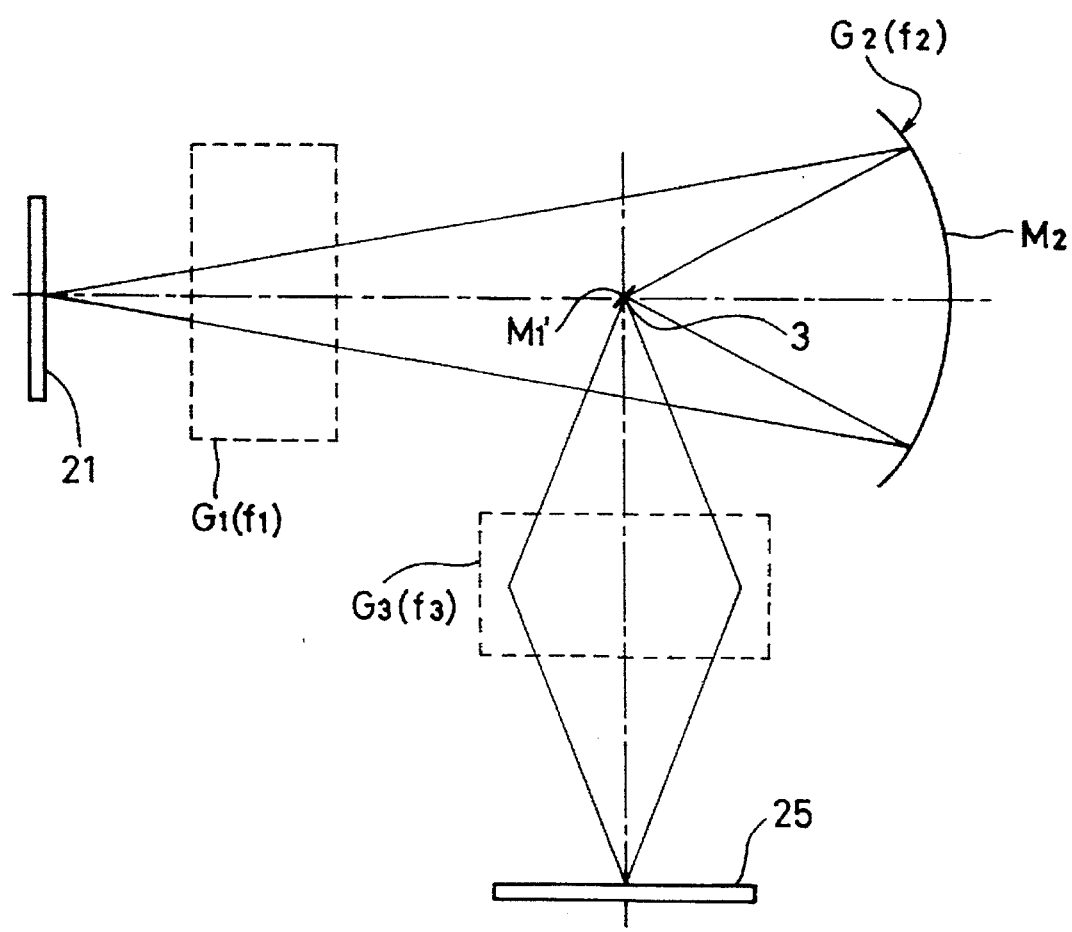
FIG. 4 is a structural drawing to show the basic structure of a catadioptric projection exposure apparatus of full exposure method in a modification of the first embodiment.

Next, a modification of the first embodiment involves an apparatus having the basic structure of full exposure method, which is provided with a projection optical system for projecting an image of a pattern formed on the reticle (21) onto the wafer (25), for example as shown in FIG. 4. The projection optical system includes a first partial imaging optical system for forming an intermediate image (3) of a pattern present on the reticle (21) and a second partial imaging optical system for re-imaging the intermediate image (3) to form an image thereof on the wafer (25).

The first partial imaging optical system is composed of a first converging group $G_1$, a second converging group $G_2$ and a small plane mirror $M'_1$. The first converging group $G_1$ has a focal length $f_1$ and a positive refracting power, which converges a beam from the pattern on the reticle (21) toward the second converging group $G_2$. The second converging group $G_2$ includes a concave reflecting mirror $M_2$ and has a focal length $f_2$ and a positive refracting power. The second converging group $G_2$ reflects a beam from the first converging group $G_1$ to form the intermediate image (3) of the pattern in the small plane mirror $M'_1$. The small plane mirror $M'_1$ is inclined at 45° relative to the optical axis and reflects a beam from the second converging group $G_2$ toward a third converging group $G_3$.

The second partial imaging optical system is composed of the third converging group $G_3$. The third converging group $G_3$ has a focal length $f_3$ and a positive refracting power, which converges a beam from the intermediate image (3) to form an image of the intermediate image (3) on the wafer (25).

As so arranged, a beam from the pattern on the reticle (21) advances through the first converging group $G_1$, is then reflected by the second converging group $G_2$ including the concave reflecting mirror $M_2$, and forms an intermediate image (3) of the pattern in the small plane mirror $M'_1$. Subsequently, a beam from the intermediate image (3) passes through the third converging group $G_3$ to form an image of the intermediate image (3) on the surface of wafer (25).

Figure 5:
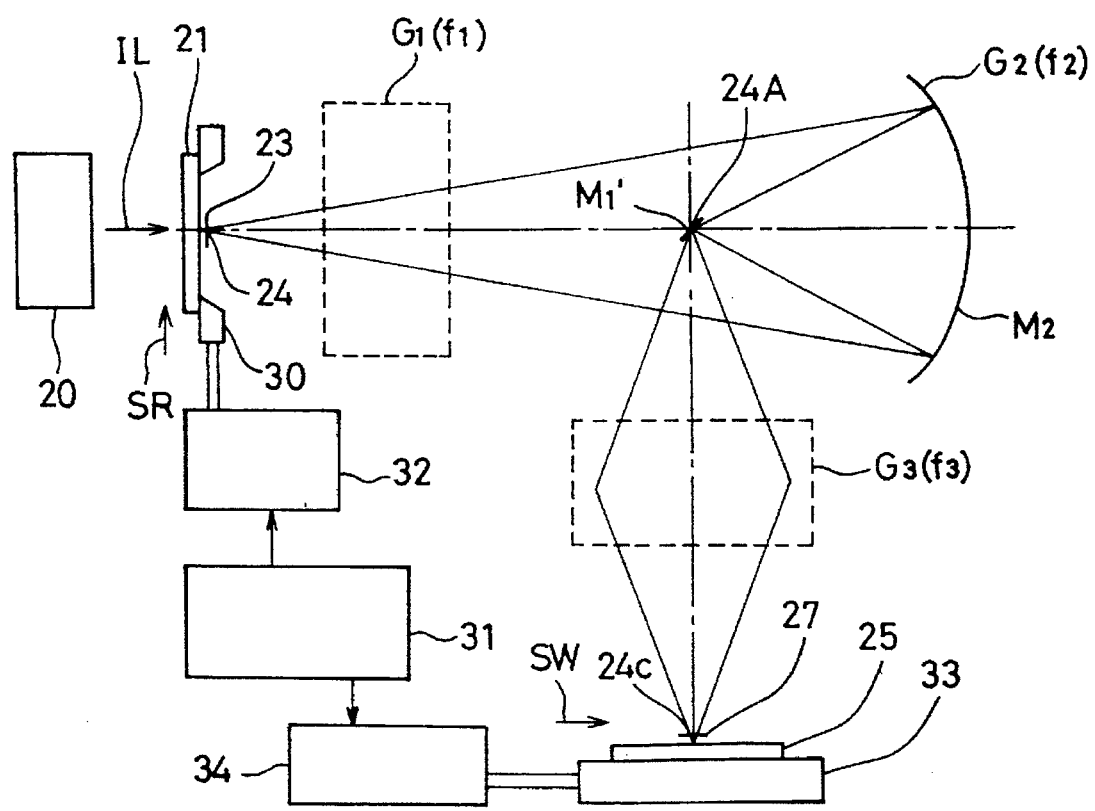
FIG. 5 is a structural drawing to show a stage mechanism in a catadioptric projection exposure apparatus of slit scan exposure method in a modification of the first embodiment.

In the modification of the first embodiment, an apparatus has the basic structure of slit scan exposure method, which is further provided with a stage mechanism for consecutively projecting images of segments of a pattern formed on the reticle (21) onto the wafer (25), for example as shown in FIG. 5. The stage mechanism is constructed of a reticle stage (30), a wafer stage (33), a reticle stage control system (32), a wafer stage control system (34) and a main control system (31).

In the projection optical system, the illumination area (23) is shaped in an elongate rectangle. The small plane mirror M'₁ is formed in the shape of slender slit. The longitudinal direction of the small plane mirror M'₁ is parallel to the longitudinal direction of the illumination area (23). Also, the optical axis of the projection optical system is parallel to the plane of the drawing. The longitudinal direction of the illumination area (23) and the longitudinal direction of the small plane mirror M'₁ both are perpendicular to the plane of the drawing. The small plane mirror M'₁ is set as rotated 45° relative to the optical axis of projection optical system about the axis perpendicular to the plane of the drawing.

As so arranged, illumination light IL from the illumination optical system (20) is irradiated onto the illumination area (23) on the pattern area (22) in the reticle (21). A beam from a pattern (24) in the illumination area (23) passes through the first converging group $G_1$, is reflected by the second converging group $G_2$ including the concave reflecting mirror $M_2$, and then forms an intermediate image (24A) of the pattern in the small plane mirror M'₁. Subsequently, a beam from the intermediate image (24A) passes through the third converging group $G_3$ to form an image (24B) of the intermediate image (24A) in the exposure area (27) on the exposure field (26) of wafer (25).

Figure 6:
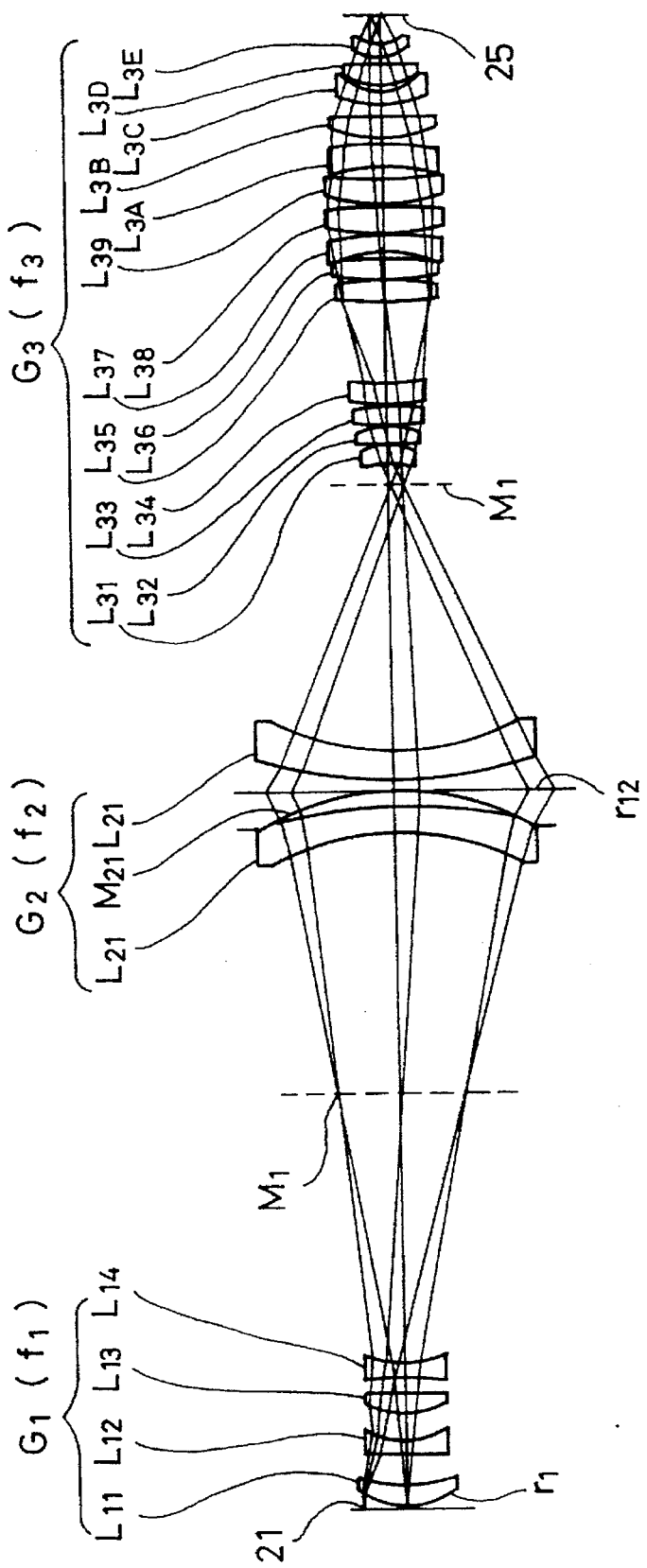
FIG. 6 is a developed path diagram to show a projection optical system in an experimental example in the first embodiment.

FIG. 6 is a developed path diagram to show a projection optical system in an experimental example of the first embodiment.

Light from a pattern on reticle (21) passes through a first converging group $G_1$ composed of four refracting lenses, is then reflected at the periphery of a plane mirror $M_1$ having a slender aperture at the center and inclined at 45° relative to the optical axis, and thereafter reaches a second converging group $G_2$ composed of a concave reflecting mirror $M_{21}$ and a negative meniscus lens $L_{21}$ disposed in front of the mirror $M_{21}$. The light reflected by the second converging group $G_2$ forms an intermediate image of the pattern in the aperture of plane mirror $M_1$. Then, light from the intermediate image passes through a third converging group $G_3$ composed of fourteen refracting lenses to form an image of the pattern on the surface of wafer (25).

The first converging group $G_1$ is constructed of a positive meniscus lens $L_{11}$ with a convex surface facing the reticle (21), a negative meniscus lens $L_{12}$ with a convex surface facing the reticle (21), a double convex lens (hereinafter referred to simply as "convex lens") $L_{13}$ and a double concave lens (hereinafter referred to simply as "concave lens") $L_{14}$, which are arranged in the named order from the side of reticle (21). The second converging group $G_2$ is composed of a negative meniscus lens $L_{21}$ with a concave surface facing the reticle (21) and a concave reflecting mirror $M_2$. Further, the third converging group $G_3$ is composed of a positive meniscus lens $L_{31}$ with a concave surface facing the reticle (21), a positive meniscus lens $L_{32}$ with a concave surface facing the reticle (21), a convex lens $L_{33}$, a negative meniscus lens $L_{34}$ with a convex surface facing the reticle (21), a convex lens $L_{35}$, a convex lens $L_{36}$, a negative meniscus lens $L_{37}$ with a concave surface facing the reticle (21), a convex lens $L_{38}$, a positive meniscus lens $L_{39}$ with a convex surface facing the reticle (21), a negative meniscus lens $L_{3A}$ with a concave surface facing the reticle (21), a convex lens $L_{3B}$, a negative meniscus lens $L_{3C}$ with a convex surface facing the reticle (21), a positive meniscus lens $L_{3D}$ with a convex surface facing the reticle (21) and a negative meniscus lens $L_{3E}$ with a convex surface facing the reticle (21).

In other words, this example is composed of a plane mirror having the central aperture, a concave mirror and nineteen refracting lenses, arranged such that the imaging magnification is 0.25, the numerical aperture 0.4, the object height 20 mm, the image height 5 mm, and the maximum mirror radius 75 mm. Also, the second converging group $G_2$ includes a negative meniscus lens, so that the second converging group $G_2$ has the structure of Mangin mirror of the type in which the refracting lens and the reflecting mirror are separated from each other. In the optical system in this example, the refracting lenses are made of fused quartz, and the axial chromatic aberration and the chromatic aberration of magnification are corrected for the wavelength band of 1 nm at wavelength of 193 nm of ultraviolet excimer laser. Also, the spherical aberration, the coma, the astigmatism and the distortion all are well corrected as deemed as negligible, which thus enables to provide a projection optical system excellent in performance. Then, the excellent performance can be maintained even if the image height is doubled or tripled in proportion.

Table 1 shows a list of radius of curvature $r_i$, surface separation $d_i$ and glass material in the experimental example in the first embodiment. In the following table, the twelfth surface is a hypothetical surface for representing the concave reflecting mirror in the developed path diagram.

TABLE 1

| i | $r_i$ | $d_i$ | Glass Material |
|---|---|---|---|
| 0 | — | 2.2 | |
| 1 | 35.81 | 8.0 | SiO₂ |
| 2 | 59.46 | 12.6 | |
| 3 | 356.73 | 6.0 | SiO₂ |
| 4 | 30.20 | 11.7 | |
| 5 | 41.51 | 8.0 | SiO₂ |
| 6 | −300.87 | 7.3 | |
| 7 | −79.79 | 6.0 | SiO₂ |
| 8 | 50.60 | 221.9 | |
| 9 | −110.93 | 10.0 | SiO₂ |
| 10 | −226.62 | 6.0 | |
| 11 | −126.76 | 0.0 | |
| 12 | ∞ | 6.0 | |
| 13 | 226.62 | 10.0 | SiO₂ |
| 14 | 110.93 | 119.9 | |
| 15 | −31.41 | 8.0 | SiO₂ |
| 16 | −28.37 | 1.0 | |
| 17 | −76.17 | 6.0 | SiO₂ |
| 18 | −38.10 | 1.0 | |
| 19 | 130.38 | 8.0 | SiO₂ |
| 20 | −122.63 | 1.0 | |
| 21 | 76.08 | 9.4 | SiO₂ |
| 22 | 61.43 | 34.9 | |
| 23 | 172.92 | 8.0 | SiO₂ |
| 24 | −139.74 | 1.0 | |
| 25 | 148.11 | 8.0 | SiO₂ |
| 26 | −277.55 | 2.6 | |
| 27 | −68.13 | 7.5 | SiO₂ |
| 28 | −144.78 | 0.3 | |
| 29 | 111.88 | 11.0 | SiO₂ |
| 30 | −244.49 | 0.5 | |
| 31 | 78.03 | 11.0 | SiO₂ |
| 32 | 335.30 | 5.0 | |
| 33 | −89.48 | 9.0 | SiO₂ |
| 34 | −178.22 | 3.0 | |
| 35 | 61.88 | 8.0 | SiO₂ |
| 36 | −734.75 | 5.0 | |
| 37 | 47.13 | 6.0 | SiO₂ |
| 38 | 22.27 | 2.0 | |
| 39 | 26.01 | 8.5 | SiO₂ |
| 40 | 208.27 | 3.0 | |
| 41 | 18.76 | 5.0 | SiO₂ |
| 42 | 15.39 | 11.9 | |

Figure 7:
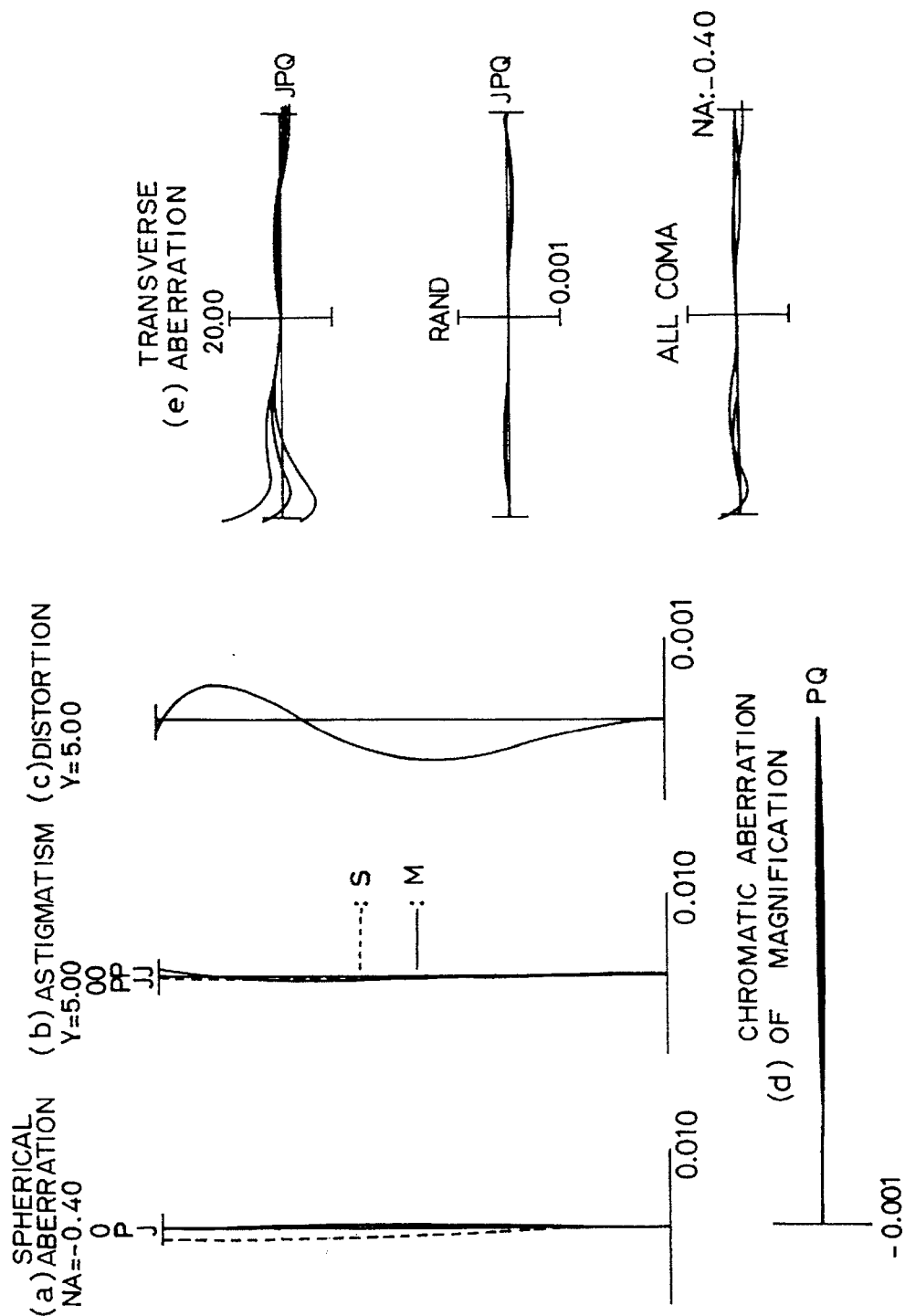
FIG. 7 is aberration diagrams for the projection optical system in the experimental example in the first embodiment.

Also, FIG. 7 is aberration diagrams, in which (a) to (c) are diagrams of longitudinal aberrations in the experimental example in the first embodiment, (d) a diagram of chromatic aberration of magnification in the experimental example in the first embodiment, and (e) a diagram of transverse aberration in the experimental example in the first embodiment. It is seen from these aberration diagrams that the various aberrations are well corrected in the region of wide image circle in this example even with the large numerical aperture of 0.4. The chromatic aberration is also well corrected.

As described above, the present embodiment is so arranged, as shown in FIG. 1, that the plane mirror $M_1$ with the aperture provided in the nearly central area to separate the incident beam from the reflected beam is employed instead of the beam splitter used in the conventional apparatus and that the second converging group $G_2$ mainly composed of the concave reflecting mirror forms its primary image at the aperture $H_1$ of plane mirror $M_1$. Then, the third converging group $G_3$ focuses the beam passing through the aperture $H_1$ of plane mirror $M_1$ to form a secondary image. Accordingly, most of the beam is available for image formation without a need to use a beam splitter which could cause the flare.

Also, since an image of a pattern in the slit illumination area (23) is formed in the aperture $S_1$ of plane mirror $M_1$, the eclipse of the beam due to the primary image is in a slender slit shield portion extending in the direction perpendicular to the running direction, giving little influence on the imaging performance.

As described above, the plane mirror $M_1$ with aperture in FIG. 1 can be replaced by a small plane mirror or elongate plane mirror $M'_1$ as shown in FIG. 4, achieving an equivalent optical system. Such arrangement can facilitate the production of the selection optical system. Also, the plane mirror $M_1$ may be replaced by a concave mirror or a convex mirror with aperture or further may be a small concave mirror or a small convex mirror.

Second Embodiment

Figure 8:
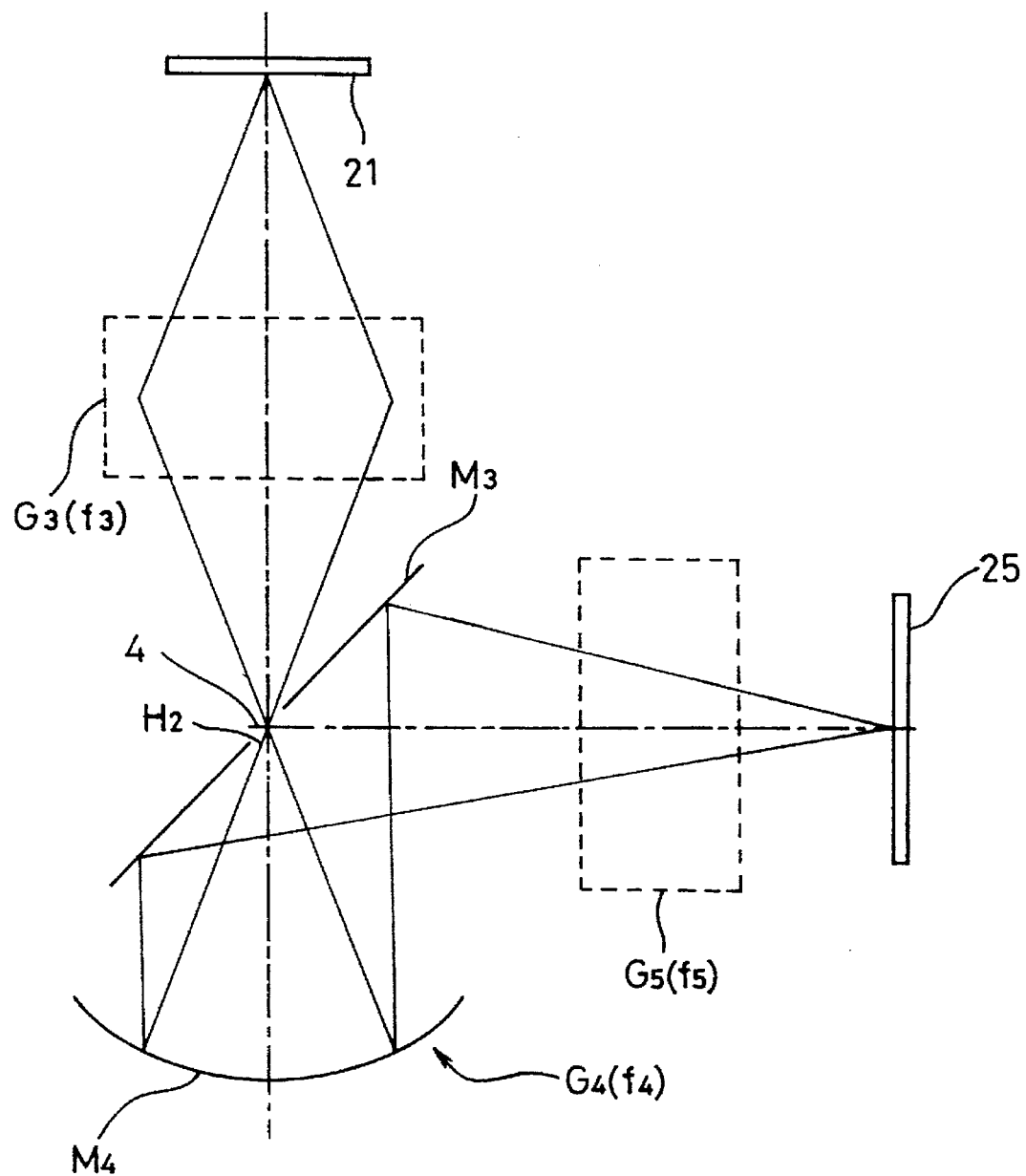
FIG. 8 is a structural drawing to show the basic structure of a catadioptric projection exposure apparatus of full exposure method in the second embodiment of the present invention.

In the second embodiment of a catadioptric projection exposure apparatus according to the present invention, an apparatus has the basic structure of full exposure method, for example as shown in FIG. 8, provided with a projection optical system for projecting an image of a pattern formed on a reticle (21) onto a wafer (25). The projection optical system includes a first partial imaging optical system for forming an intermediate image (4) of the pattern present on the reticle (21), and a second partial imaging optical system for re-imaging the intermediate image (4) to form an image thereof on the wafer (25).

The first partial imaging optical system is composed of a third converging group $G_3$. The third converging group $G_3$ has a focal length $f_3$ and a positive refracting power, which converges a beam from the pattern on the reticle (21) to form the intermediate image (4) in an aperture $H_2$ in a plane mirror (selection optical system) $M_3$.

The second partial imaging optical system is composed of a fourth converging group $G_4$, the plane mirror $M_3$ and a fifth converging group $G_5$. The fourth converging group $G_4$ includes a concave reflecting mirror $M_4$ and has a focal length $f_4$ and a positive refracting power. The fourth converging group $G_4$ reflects a beam from the intermediate image (4) toward the plane mirror of selection optical system $M_3$. The plane mirror $M_3$ has an aperture $H_2$ at the center and is inclined at 45° relative to the optical axis. The plane mirror $M_3$ permits a beam from the third converging group $G_3$ to pass through the aperture toward the fourth converging group $G_4$, and reflects a beam from the fourth converging group $G_4$ toward the fifth converging group $G_5$. The fifth converging group $G_5$ has a focal length $f_5$ and a positive refracting power, and converges a beam from the plane mirror $M_3$ to form an image of the intermediate image (4) on the wafer (25).

As so arranged, a beam from the pattern on the reticle (21) advances through the third converging group $G_3$, and forms the intermediate image (4) of the pattern in the aperture $H_2$ of plane mirror $M_3$. Subsequently, the beam from the intermediate image (4) is reflected by the fourth converging group $G_4$ including the concave reflecting mirror $M_4$, thereafter is reflected at the periphery of plane mirror $M_3$, and passes through the fifth converging group $G_5$ to form an image of the intermediate image (4) on the surface of wafer (25).

Figure 9:
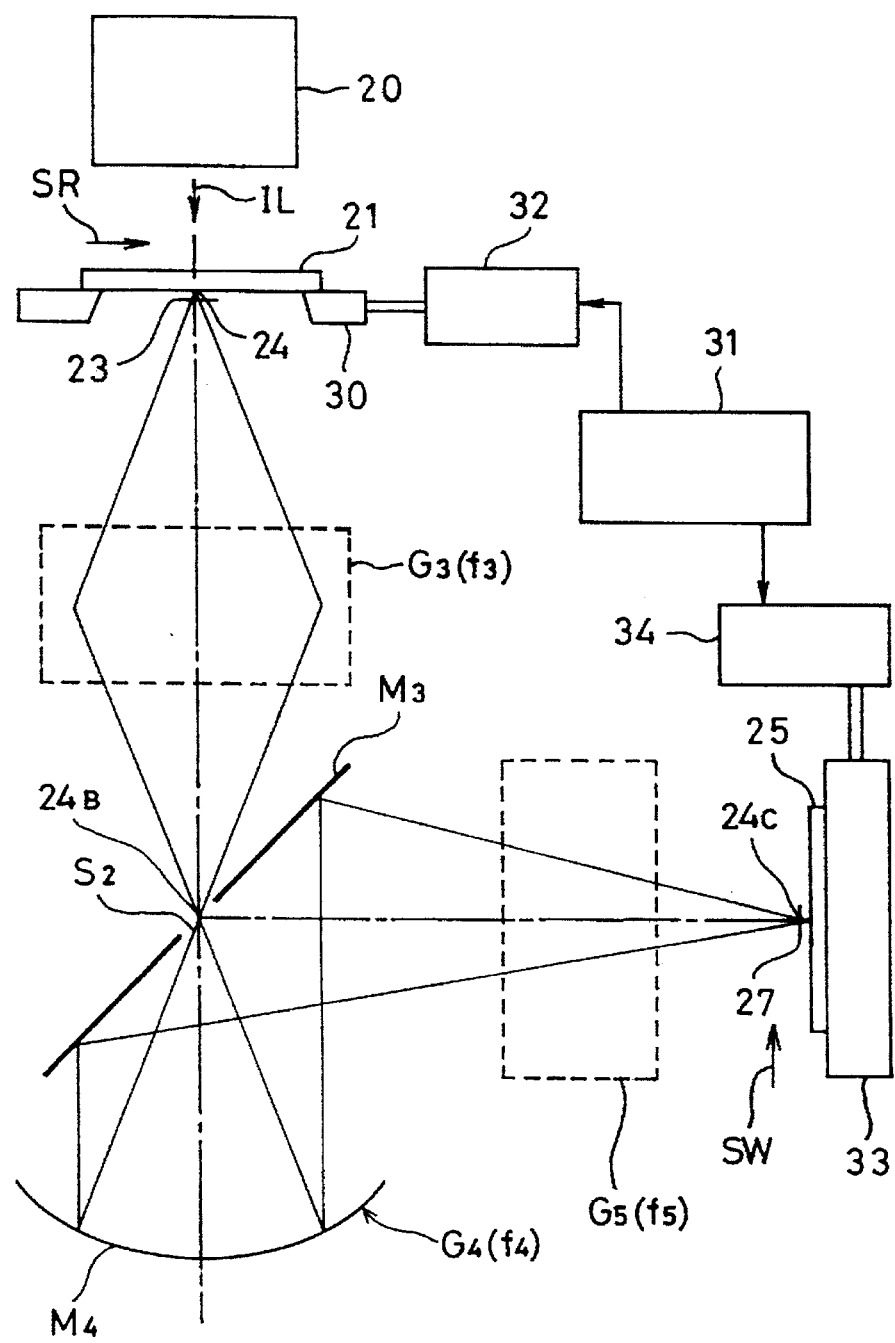
FIG. 9 is a structural drawing to show a stage mechanism in a catadioptric projection exposure apparatus of slit scan exposure method in the second embodiment.

In the next place, the basic structure of an apparatus of slit scan exposure method in the second embodiment further involves a stage mechanism for consecutively projecting images of segments of a pattern formed on the reticle (21), onto the wafer (25), for example as shown in FIG. 9. The stage mechanism is constructed of a reticle stage (30), a wafer stage (33), a reticle stage control system (32), a wafer stage control system (34) and a main control system (31).

The reticle stage (30) runs the reticle (21) relative to a slit illumination area (23) formed by exposure light IL from an illumination optical system (20) in a pattern area (22) of reticle (21) in the direction of SR perpendicular to the longitudinal direction of the illumination area (23). The wafer stage (33) runs the wafer (25) relative to an exposure area (27) conjugate with the slit illumination area (23) in a shot area (26) in the wafer (25) in the direction of SW conjugate with the direction of SR. The main control system (31) adjusts a relative velocity based on a projection magnification β of the overall projection optical system through the reticle stage control system (32) and the wafer stage control system (34) to set a running velocity V of reticle (21) and a running velocity βV of wafer (25) and also to set running timings of reticle (21) and wafer (25) as synchronized with each other.

In the projection optical system, the illumination area (23) is shaped in an elongate rectangle. The plane mirror $M_3$ has a slender aperture $S_2$ at the center. The longitudinal direction of the aperture $S_2$ is parallel to the longitudinal direction of the illumination area (23), and the width of the aperture $S_2$ is set 10 to 20% narrower than the width of a beam incident into the plane mirror $M_3$. Additionally, slender light shield regions (28) and (29) may be provided in the direction perpendicular to the longitudinal direction of the aperture $S_2$ on the plane mirror $M_3$ to cancel the directionality of imaging properties. Also, the optical axis of the projection optical system is parallel to the plane of the drawing. The longitudinal direction of the illumination area (23) and the longitudinal direction of the aperture $S_2$ both are perpendicular to the plane of the drawing. The plane mirror $M_3$ is set as rotated 45° relative to the optical axis of projection optical system about the axis perpendicular to the plane of the drawing.

As so arranged, illumination light IL from the illumination optical system (20) is irradiated onto the illumination area (23) on the pattern area (22) of reticle (21). A beam from a pattern (24) in the illumination area (23) advances through the third converging group $G_3$ and then forms an intermediate image (24B) of the pattern in the aperture $S_2$ of plane mirror $M_3$. Subsequently, a beam from the intermediate image (24B) is reflected by the fourth converging group $G_4$ including the concave reflecting mirror $M_4$. Then, a beam B reflected at the periphery of plane mirror $M_3$ passes through the fifth converging group $G_5$ to form an image (24C) of the intermediate image (24B) in the exposure area (27) on the exposure field (26) in the wafer (25).

The main control system (31) sets the running velocity V and the running timing of reticle stage (30) through the reticle stage control system (32). With the projection magnification β of the overall projection optical system, the main control system (31) also sets the running velocity of wafer stage (33) to βV while adjusting the relative velocity to the reticle stage (30) through the wafer stage control system (34). The main control system (31) also sets the running timing of wafer stage (33) as synchronized with the running of reticle stage (30) through the wafer stage control system (34). Thus, the reticle (21) is run relative to the illumination area (23) by the reticle stage (30) at velocity V in the direction of SR perpendicular to the longitudinal direction of the illumination area (23). Also, the wafer (25 is run relative to the exposure area (27) conjugate with the illumination area (23) by the wafer stage (33) in the direction of SW conjugate with the direction of SR.

Figure 10:
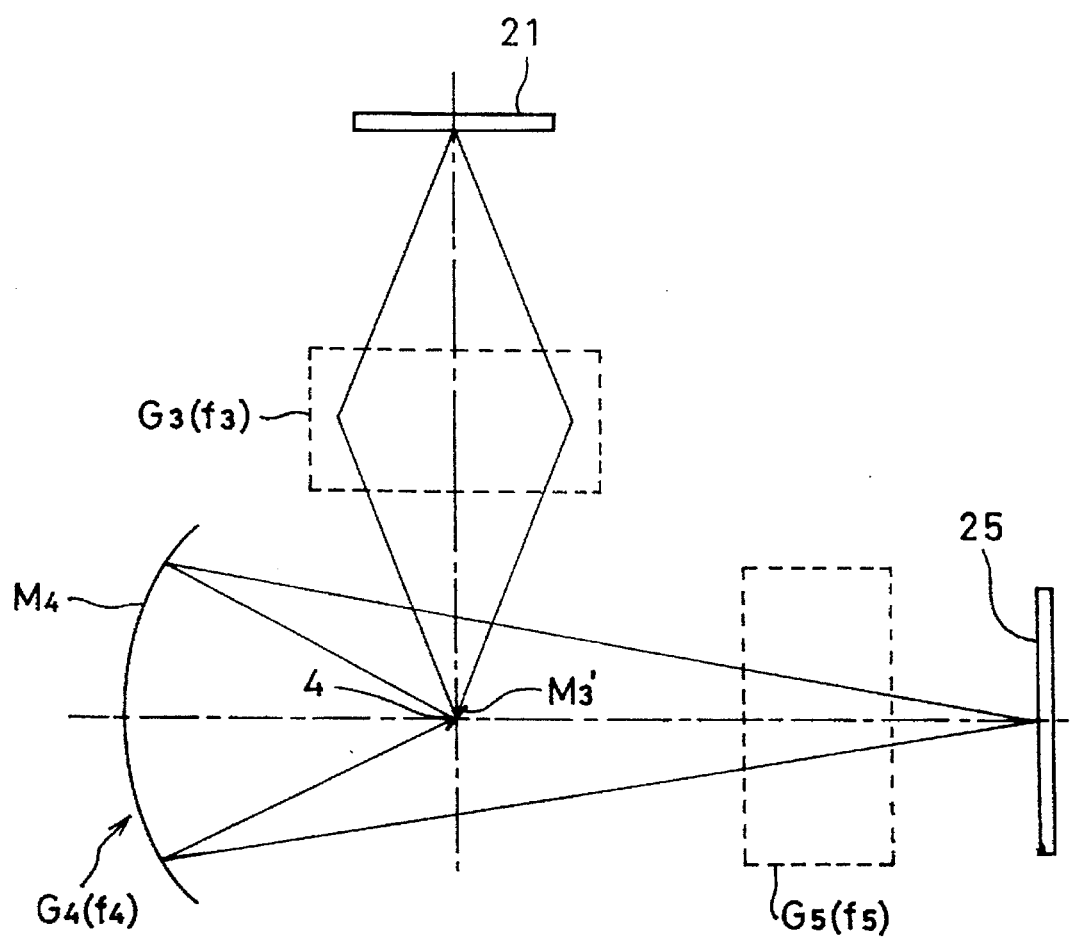
FIG. 10 is a structural drawing to show the basic structure of a catadioptric projection exposure apparatus of full exposure method in a modification of the second embodiment.

Next, a modification of the second embodiment involves an apparatus having the basic structure of full exposure method, which is provided with a projection optical system for projecting an image of a pattern formed on the reticle (21) onto the wafer (25), for example as shown in FIG. 10. The projection optical system includes a first partial imaging optical system for forming an intermediate image (4) of a pattern present on the reticle (21) and a second partial imaging optical system for re-imaging the intermediate image (4) to form an image thereof on the wafer (25).

The first partial imaging optical system is composed of a third converging group $G_3$. The third converging group $G_3$ has a focal length $f_3$ and a positive refracting power, which converges a beam from a pattern on the reticle (21) and forms the intermediate image (4) of the pattern in a small plane mirror M'$_3$.

The second partial imaging optical system is composed of the small plane mirror M'$_3$, a fourth converging group $G_4$ and a fifth converging group $G_5$. The small plane mirror M'$_3$ is inclined at 45° relative to the optical axis and reflects a beam from the intermediate image (4) toward the fourth converging group $G_4$. The fourth converging group $G_4$ includes a concave reflecting mirror $M_4$ and has a focal length $f_4$ and a positive refracting power. The fourth converging group $G_4$ reflects a beam from the small plane mirror M'$_3$ toward the fifth converging group $G_5$. The fifth converging group $G_5$ has a focal length $f_5$ and a positive refracting power, and converges a beam from the fourth converging group $G_4$ to form an image of the intermediate image (4) on the wafer (25).

As so arranged, a beam from the pattern on the reticle (21) advances through the third converging group $G_3$ and forms the intermediate image (4) in the small plane mirror $M_3$. Subsequently, a beam from the intermediate image (4) is reflected by the fourth converging group $G_4$ including the concave reflecting mirror $M_4$ and then passes through the fifth converging group $G_5$ to form an image of the intermediate image (4) on the surface of wafer (25).

Figure 11:
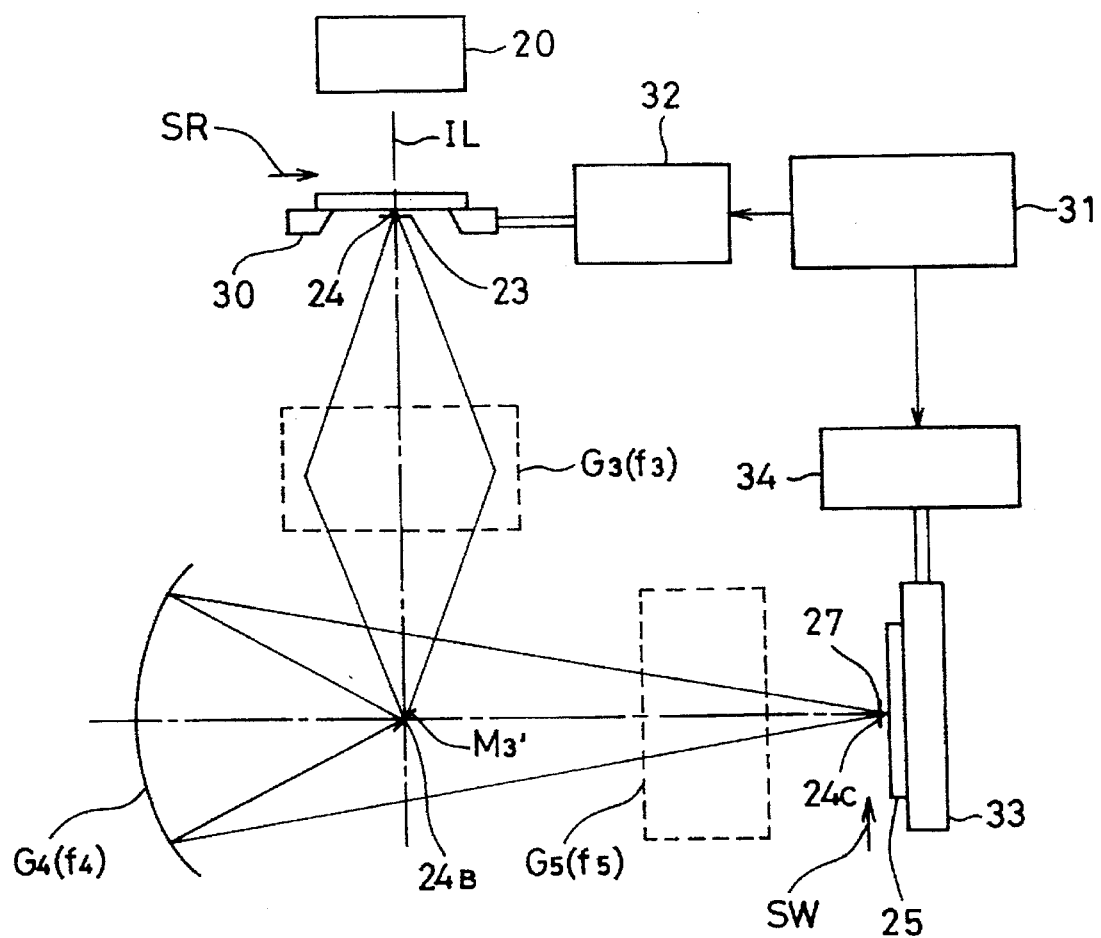
FIG. 11 is a structural drawing to show a stage mechanism in a catadioptric projection exposure apparatus of slit scan exposure method in a modification of the second embodiment.

In the modification of the second embodiment, an apparatus has the basic structure of slit scan exposure method, which is further provided with a stage mechanism for consecutively projecting images of segments of a pattern formed on the reticle (21) onto the wafer (25), for example as shown in FIG. 11. The stage mechanism is constructed of a reticle stage (30), a wafer stage (33), a reticle stage control system (32), a wafer stage control system (34) and a main control system (31).

In the projection optical system, the illumination area (23) is shaped in an elongate rectangle. The small plane mirror M'$_3$ is formed in the shape of slender slit. The longitudinal direction of the small plane mirror M'$_3$ is parallel to the longitudinal direction of the illumination area (23). Also, the optical axis of the projection optical system is parallel to the plane of the drawing. The longitudinal direction of the illumination area (23) and the longitudinal direction of the small plane mirror M'$_3$ both are perpendicular to the plane of the drawing. The small plane mirror M'$_3$ is set as rotated 45° relative to the optical axis of projection optical system about the axis perpendicular to the plane of the drawing.

As so arranged, illumination light IL from the illumination optical system (20) is irradiated onto the illumination area (23) on the pattern area (22) in the reticle (21). A beam from a pattern (24) in the illumination area (23) passes through the third converging group $G_3$ and forms an intermediate image (24B) of the pattern in the small plane mirror M'$_3$. Subsequently, a beam from the intermediate image (24B) is reflected by the fourth converging group $G_4$ including the concave reflecting mirror $M_4$ and then passes through the fifth converging group $G_5$ to form an image (24C) of the intermediate image (24B) in the exposure area (27) on the exposure field (26) of wafer (25).

Figure 12:
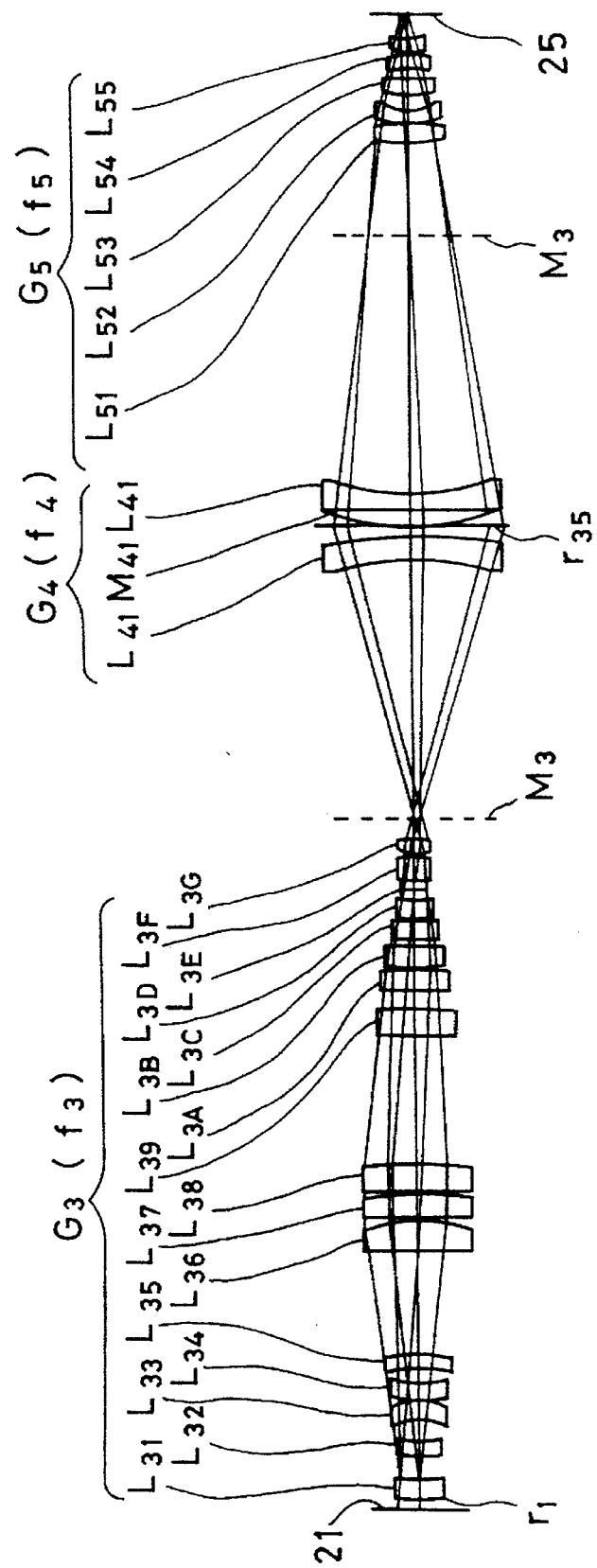
FIG. 12 is a developed path diagram to show a projection optical system in an experimental example in the second embodiment.

FIG. 12 is a developed path diagram to show a projection optical system in an experimental example of the second embodiment.

Light from a pattern on reticle (21) passes through a third converging group $G_3$ composed of sixteen refracting lenses, and forms an intermediate image of the pattern in an aperture of a plane mirror $M_3$ inclined at 45° relative to the optical axis and having the aperture at the center. Then, light from the intermediate image reaches a fourth converging group $G_4$ composed of a concave reflecting mirror $M_{41}$ and a negative meniscus lens. The light reflected by the fourth converging group $G_4$ is then reflected at the periphery of plane mirror $M_4$. The reflected light passes through a fifth converging group $G_5$ composed of five refracting lenses to form an image of the pattern on the surface of wafer (25).

The third converging group $G_3$ is constructed of a negative meniscus lens $L_{31}$ with a convex surface facing the reticle (21), a negative meniscus lens $L_{32}$ with a convex surface facing the reticle (21), a negative meniscus lens $L_{33}$ with a concave surface facing the reticle (21), a negative meniscus lens $L_{34}$ with a convex surface facing the reticle (21), a positive meniscus lens $L_{35}$ with a concave surface facing the reticle (21), a convex lens $L_{36}$, a positive meniscus lens $L_{37}$ with a concave surface facing the reticle (21), a positive lens $L_{38}$, a positive meniscus lens $L_{39}$ with a concave surface facing the reticle (21), a convex lens $L_{3A}$, a convex lens $L_{3B}$, a negative meniscus lens $L_{3C}$ with a concave surface facing the reticle (21), a negative meniscus lens $L_{3D}$ with a convex surface facing the reticle (21), a concave lens $L_{3E}$, a convex lens $L_{3F}$ and a convex lens $L_{3G}$, which are arranged in the named order from the side of reticle (21).

The fourth converging group $G_4$ is composed of a negative meniscus lens $L_{41}$ with a concave surface facing the reticle (21) and a concave reflecting mirror $M_{41}$. The fifth converging group $G_5$ is composed of a positive meniscus lens $L_{51}$ with a convex surface facing the reticle (21), a negative meniscus lens $L_{52}$ with a convex surface facing the reticle (21), a positive meniscus lens $L_{53}$ with a convex surface facing the reticle (21), a positive meniscus lens $L_{54}$ with a concave surface facing the reticle (21) and a negative meniscus lens $L_{55}$ with a convex surface facing the reticle (21).

In other words, this example is composed of a plane mirror having the central aperture, a concave reflecting mirror and twenty two refracting lenses arranged such that the imaging magnification is 0.25, the numerical aperture 0.3, the object height 12 mm, the image height 3 mm, and the maximum mirror radius 41 mm. Also, the fourth converging group $G_4$ includes a negative meniscus lens, so that the fourth converging group $G_4$ has the structure of Mangin mirror of the type in which the refracting lens and the reflecting mirror are separated from each other. In the optical system in this example, the refracting lenses are made of fused quartz, and the axial chromatic aberration and the chromatic aberration of magnification are corrected for the wavelength band of 1 nm at wavelength of 193 nm of ultraviolet excimer laser. Also, the spherical aberration, the coma, the astigmatism and the distortion all are well corrected as deemed as negligible, which thus enables to provide a projection optical system excellent in performance. Then, the excellent performance can be maintained even if the image height is doubled or tripled in proportion.

Table 2 shows a list of radius of curvature $r_i$, surface separation $d_i$ and glass material in the experimental example in the second embodiment. In the following table, the thirty fifth surface is a hypothetical surface for representing the concave reflecting mirror in the developed path diagram.

TABLE 2

| i | $r_i$ | $d_i$ | Glass Material |
|---|---|---|---|
| 0 | — | 4.0 | |
| 1 | 95.98 | 10.0 | $SiO_2$ |
| 2 | 65.75 | 12.0 | |
| 3 | 1434.55 | 7.0 | $SiO_2$ |
| 4 | 60.07 | 11.0 | |
| 5 | −23.22 | 10.0 | $SiO_2$ |
| 6 | −27.51 | 0.3 | |
| 7 | 251.93 | 8.0 | $SiO_2$ |
| 8 | 51.85 | 8.0 | |
| 9 | −68.40 | 7.0 | $SiO_2$ |
| 10 | −66.60 | 51.0 | |
| 11 | 763.14 | 15.0 | $SiO_2$ |
| 12 | −105.25 | 2.0 | |
| 13 | −2171.46 | 11.0 | $SiO_2$ |
| 14 | −398.28 | 0.6 | |
| 15 | 657.88 | 15.0 | $SiO_2$ |
| 16 | −195.65 | 65.0 | |
| 17 | −1397.29 | 14.0 | $SiO_2$ |
| 18 | −159.18 | 8.0 | |
| 19 | 238.03 | 11.0 | $SiO_2$ |
| 20 | −292.91 | 0.5 | |
| 21 | 90.28 | 11.2 | $SiO_2$ |
| 22 | −713.33 | 4.0 | |
| 23 | −101.29 | 9.0 | $SiO_2$ |
| 24 | −216.96 | 0.3 | |
| 25 | 48.77 | 10.0 | $SiO_2$ |
| 26 | 43.54 | 5.0 | |
| 27 | −112.55 | 4.0 | $SiO_2$ |
| 28 | 21.60 | 1.5 | |
| 29 | 204.26 | 12.0 | $SiO_2$ |
| 30 | −34.05 | 0.3 | |
| 31 | 24.14 | 7.5 | $SiO_2$ |
| 32 | −42.62 | 140.0 | |
| 33 | −131.63 | 10.5 | $SiO_2$ |
| 34 | −280.63 | 5.2 | |
| 35 | ∞ | 0.0 | |
| 36 | 143.16 | 5.2 | |
| 37 | 280.63 | 10.5 | $SiO_2$ |
| 38 | 131.63 | 175.6 | |
| 39 | 99.65 | 8.0 | $SiO_2$ |
| 40 | 856.91 | 0.5 | |
| 41 | 34.40 | 8.0 | $SiO_2$ |
| 42 | 28.44 | 7.0 | |
| 43 | 44.86 | 7.5 | $SiO_2$ |
| 44 | 115.52 | 5.0 | |
| 45 | −79.28 | 7.0 | $SiO_2$ |
| 46 | −66.11 | 0.5 | |
| 47 | 22.09 | 8.0 | $SiO_2$ |
| 48 | 18.08 | 11.9 | |

Figure 13:
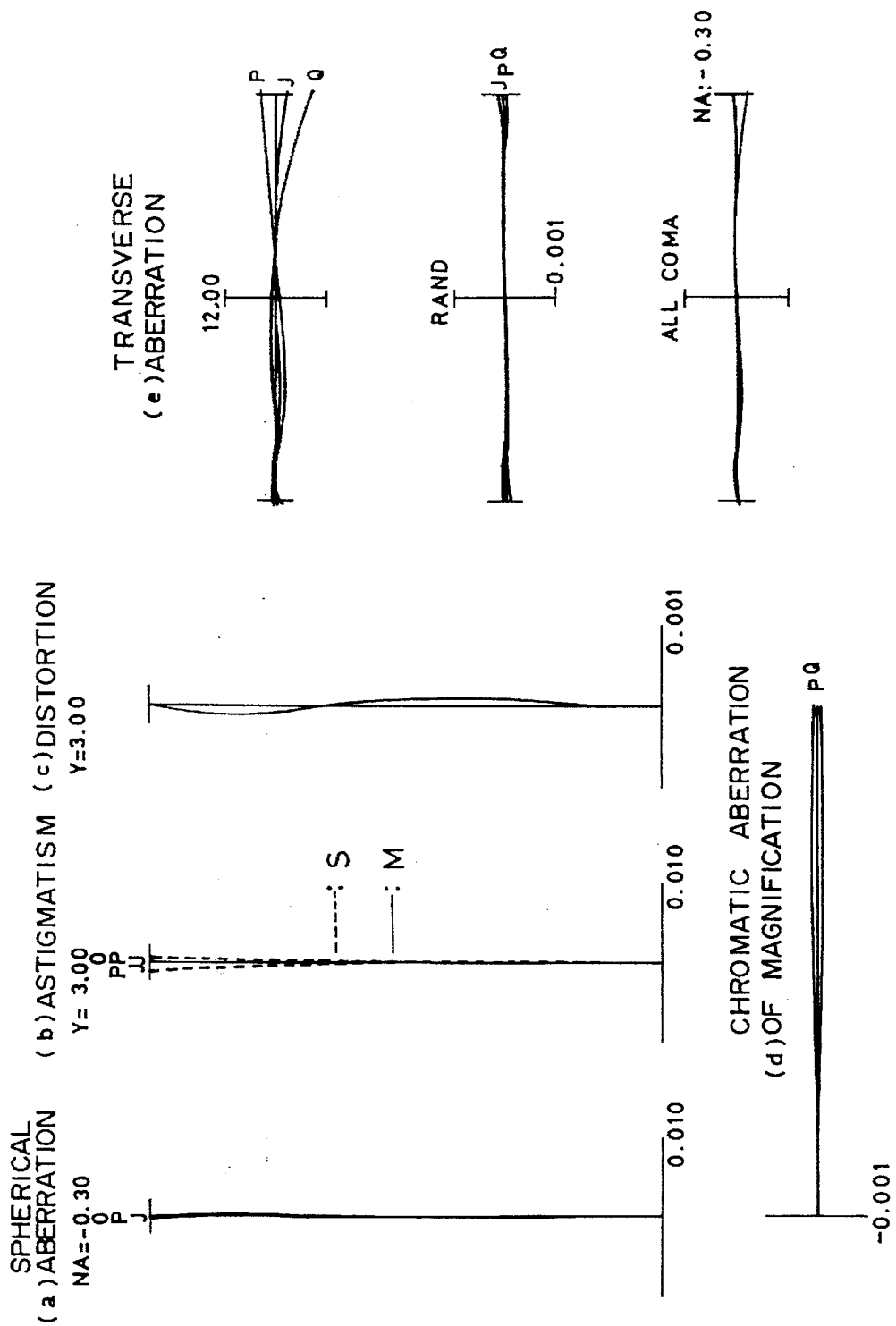
FIG. 13 is aberration diagrams for the projection optical system in the experimental example of the second embodiment.

Also, FIG. 13 is aberration diagrams, in which (a) to (c) are diagrams of longitudinal aberrations in the experimental example in the second embodiment, (d) a diagram of chromatic aberration of magnification in the experimental example in the second embodiment, and (e) a diagram of transverse aberration in the experimental example in the second embodiment. It is seen from these aberration diagrams that the various aberrations are well corrected in the region of wide image circle in this example. The chromatic aberration is also well corrected.

As described above, the plane mirror $M_3$ with aperture in FIG. 8 can be replaced by a small plane mirror or elongate plane mirror $M'_3$ as shown in FIG. 10, achieving an equivalent optical system. Such arrangement can facilitate the production of the selection optical system. Also, the plane mirror $M_3$ may be replaced by a concave mirror or a convex mirror with aperture or further may be a small concave mirror or a small convex mirror.

Third Embodiment

Figure 14:
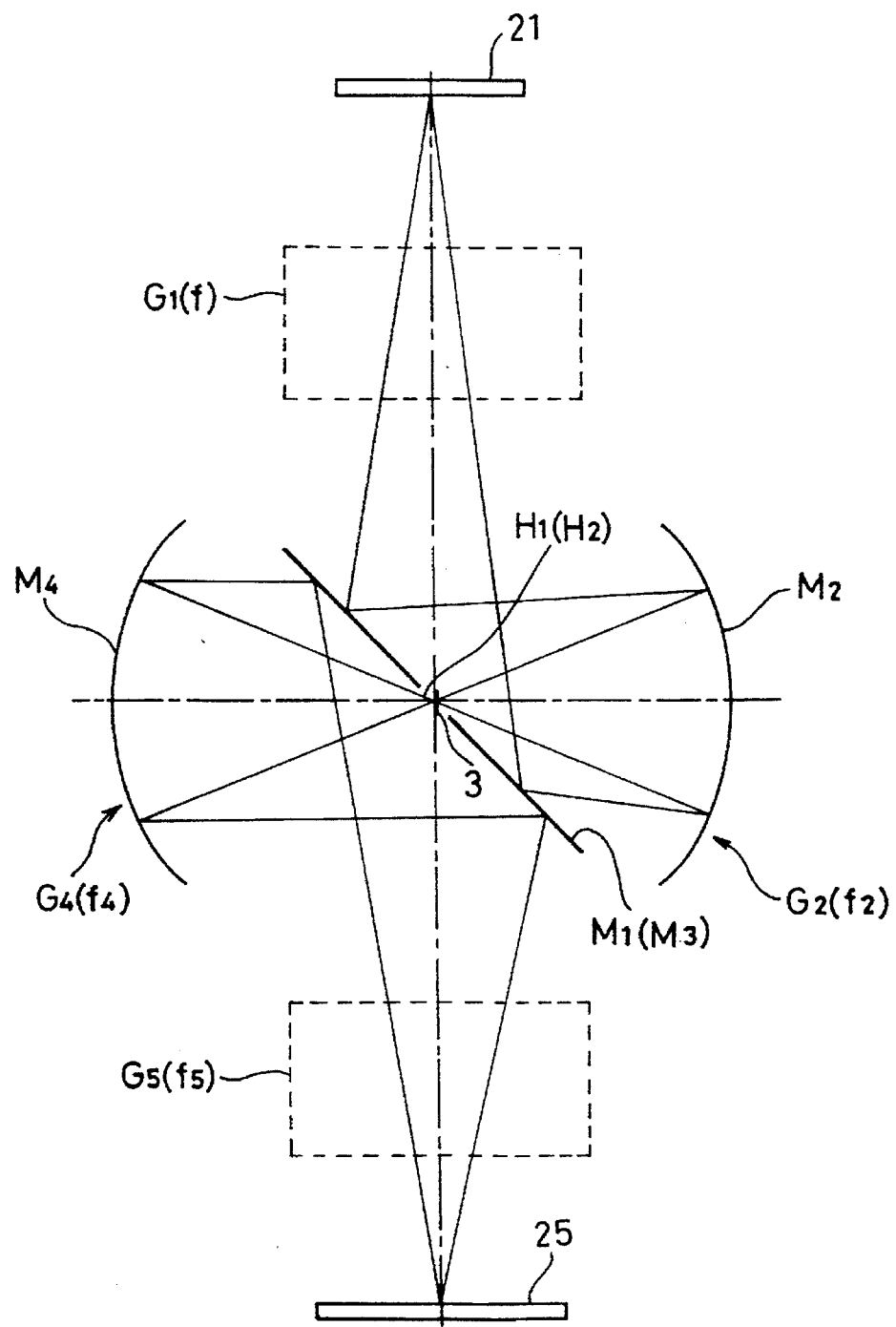
FIG. 14 is a structural drawing to show the basic structure of a catadioptric projection exposure apparatus of full exposure method in the third embodiment of the present invention.

In the third embodiment of a catadioptric projection exposure apparatus according to the present invention, an apparatus has the basic structure of full exposure method, for example as shown in FIG. 14, provided with a projection optical system for projecting an image of a pattern formed on a reticle (21) onto a wafer (25). The projection optical system includes a first partial imaging optical system for forming an intermediate image (3) of the pattern present on the reticle (21), and a second partial imaging optical system for re-imaging the intermediate image (3) to form an image thereof on the wafer (25).

The first partial imaging optical system is composed of a first converging group $G_1$, a plane mirror (selection optical system) $M_1$ ($M_3$) and a second converging group $G_2$. The first converging group $G_1$ has a focal length $f_1$ and a positive refracting power, which converges a beam from the pattern on the reticle (21) toward the plane mirror $M_1$ ($M_3$). The plane mirror $M_1$ ($M_3$) has an aperture $H_1$ ($H_2$) at the center and is inclined at 45° relative to the optical axis. The plane mirror $M_1$ ($M_3$) reflects a beam from the first converging group $G_1$ toward the second converging group $G_2$ by its surface and permits a beam from the second converging group $G_2$ to pass through the aperture toward a fourth converging group $G_4$. The second converging group $G_2$ includes a concave reflecting mirror $M_2$ and has a focal length $f_2$ and a positive refracting power. The second converging group $G_2$ reflects a beam from the plane mirror $M_1$ ($M_3$) to form the intermediate image (3) of the pattern in the aperture $H_1$ ($H_2$) of plane mirror $M_1$ ($M_3$).

The second partial imaging optical system is composed of the fourth converging group $G_4$ and a fifth converging group $G_5$. The fourth converging group $G_4$ includes a concave reflecting mirror $M_4$ and has a focal length $f_4$ and a positive refracting power. The fourth converging group $G_4$ reflects a beam from the intermediate image (3) toward the plane mirror $M_1$ ($M_3$). The fifth converging group $G_5$ has a focal length $f_5$ and a positive refracting power and converges a beam reflected by the back face o#the plane mirror $M_1$ ($M_3$) to form an image of the intermediate image (3) on the wafer (25).

As so arranged, a beam from the pattern on the reticle (21) advances through the first converging group $G_1$, is reflected at the periphery of the surface of plane mirror $M_1$ ($M_3$), thereafter is reflected by the second converging group $G_2$ including the concave reflecting mirror $M_2$, and then forms the intermediate image (3) of the pattern in the aperture $H_1$ ($H_2$) of plane mirror $M_1$ ($M_3$). Subsequently, the beam from the intermediate image (3) is reflected by the fourth converging group $G_4$ including the concave reflecting mirror $M_4$, thereafter is reflected at the periphery of the back face of plane mirror $M_1$ ($M_3$), and then passes through the fifth converging group $G_5$ to form an image of the intermediate image (3) on the surface of wafer (25).

Figure 15:
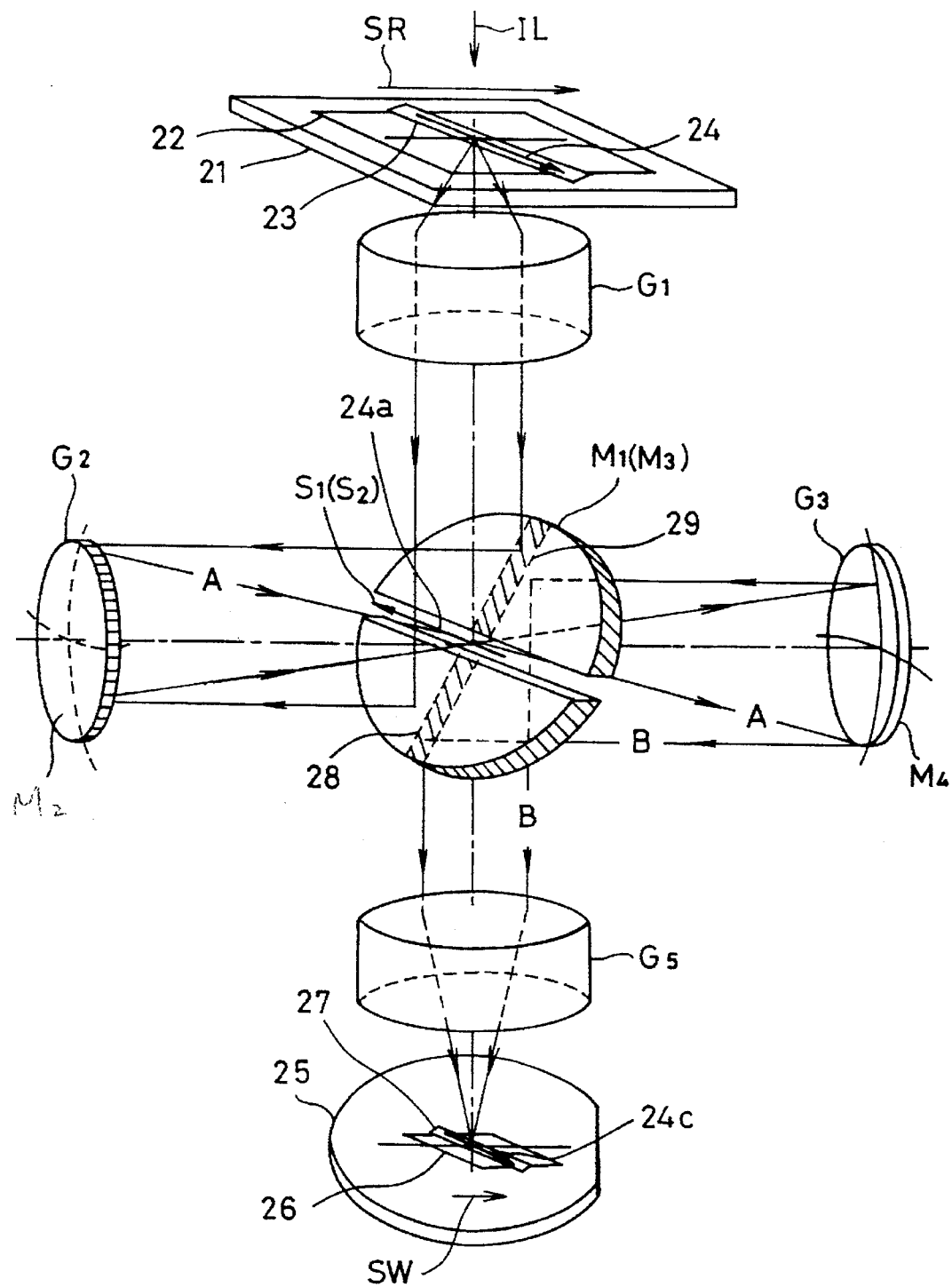
FIG. 15 is a perspective view to show the basic structure of a catadioptric projection exposure apparatus of slit scan exposure method in the third embodiment.
Figure 16:
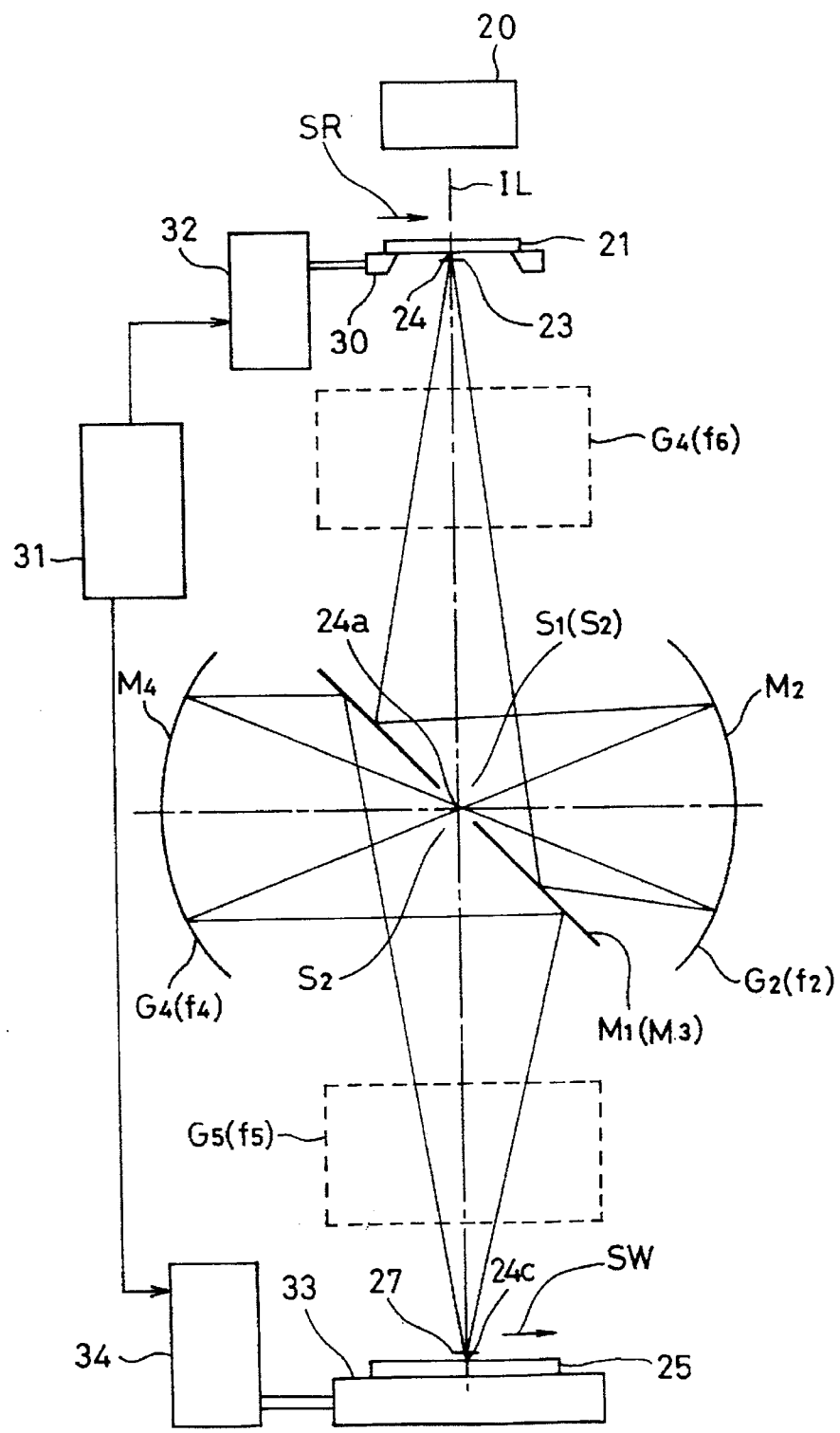
FIG. 16 is a structural drawing to show a stage mechanism in a catadioptric projection exposure apparatus of slit scan exposure method in the third embodiment.

In the next place, the basic structure of an apparatus of slit scan exposure method in the third embodiment further involves a stage mechanism for consecutively projecting images of segments of a pattern formed on the reticle (21) onto the wafer (25), for example as shown in FIG. 15 and FIG. 16. The stage mechanism is constructed of a reticle stage (30), a wafer stage (33), a reticle stage control system (32), a wafer stage control system (34) and a main control system (31).

The reticle stage (30) runs the reticle (21) relative to a slit illumination area (23) formed by exposure light IL from an illumination optical system (20) in a pattern area (22) of reticle (21) in the direction of SR perpendicular to the longitudinal direction of the illumination area (23). The wafer stage (33) runs the wafer (25) relative to an exposure area (27) conjugate with the slit illumination area (23) in a shot area (26) in the wafer (25) in the direction of SW conjugate with the direction of SR. The main control system (31) adjusts a relative velocity based on a projection magnification β of the overall projection optical system through the reticle stage control system (32) and the wafer stage control system (34) to set a running velocity V of reticle (21) and a running velocity βV of wafer (25) and also to set running timings of reticle (21) and wafer (25) as synchronized with each other.

In the projection optical system, the illumination area (23) is shaped in an elongate rectangle. The plane mirror $M_1$ ($M_3$) has a slender aperture $S_1$ ($S_2$) at the center. The longitudinal direction of the aperture $S_1$ ($S_2$) is parallel to the longitudinal direction of the illumination area (23), and the width of the aperture $S_1$ ($S_2$) is set 10 to 20% narrower than the width of a beam incident into the plane mirror $M_1$ ($M_3$). Additionally, slender light shield regions (28) and (29) may be provided in the direction perpendicular to the longitudinal direction of the aperture $S_1$ ($S_2$) on the plane mirror $M_1$ ($M_3$) to cancel the directionality of imaging properties. Also, the optical axis of the projection optical system is parallel to the plane of FIG. 15 or FIG. 16. The longitudinal direction of the illumination area (23) and the longitudinal direction of the aperture $S_1$ ($S_2$) both are perpendicular to the plane of FIG. 16. The plane mirror $M_1$ ($M_3$) is set as rotated 45°1 relative to the optical axis of projection optical system about the axis perpendicular to the plane of FIG. 16.

As so arranged, illumination light IL from the illumination optical system (20) is irradiated onto the illumination area (23) on a pattern area (22) of reticle (21). A beam from the pattern (24) in the illumination area (23) advances through the first converging group $G_1$ and is reflected at the periphery of the surface of plane mirror $M_1$. Subsequently, the beam A reflected by the second converging group $G_2$ including the concave reflecting mirror $M_2$ forms an intermediate image (24A) of the pattern in the aperture $S_1$ ($S_2$) of plane mirror $M_1$ ($M_3$). Then, the beam from the intermediate image (24A) is reflected by the fourth converging group $G_4$ including the concave reflecting mirror $M_4$ and then passes through the fifth converging group $G_5$ to form an image (24C) of the intermediate image (24A) in the exposure area (27) on the exposure field (26) in the wafer (25).

The main control system (31) sets the running velocity V and the running timing of reticle stage (30) through the reticle stage control system (32). With the projection magnification β of the overall projection optical system, the main control system (31) also sets the running velocity of wafer stage (33) to βV while adjusting the relative velocity to the reticle stage (30) through the wafer stage control system (34). The main control system (31) also sets the running timing of wafer stage (33) as synchronized with the running of reticle stage (30) through the wafer stage control system (34). Thus, the reticle (21) is run relative to the illumination area (23) by the reticle stage (30) at a velocity V in the direction of SR perpendicular to the longitudinal direction of the illumination area (23). Also, the wafer (25 is run relative to the exposure area (27) conjugate with the illumination area (23) by the wafer stage (33) in the direction of SW conjugate with the direction of SR.

Figure 17:
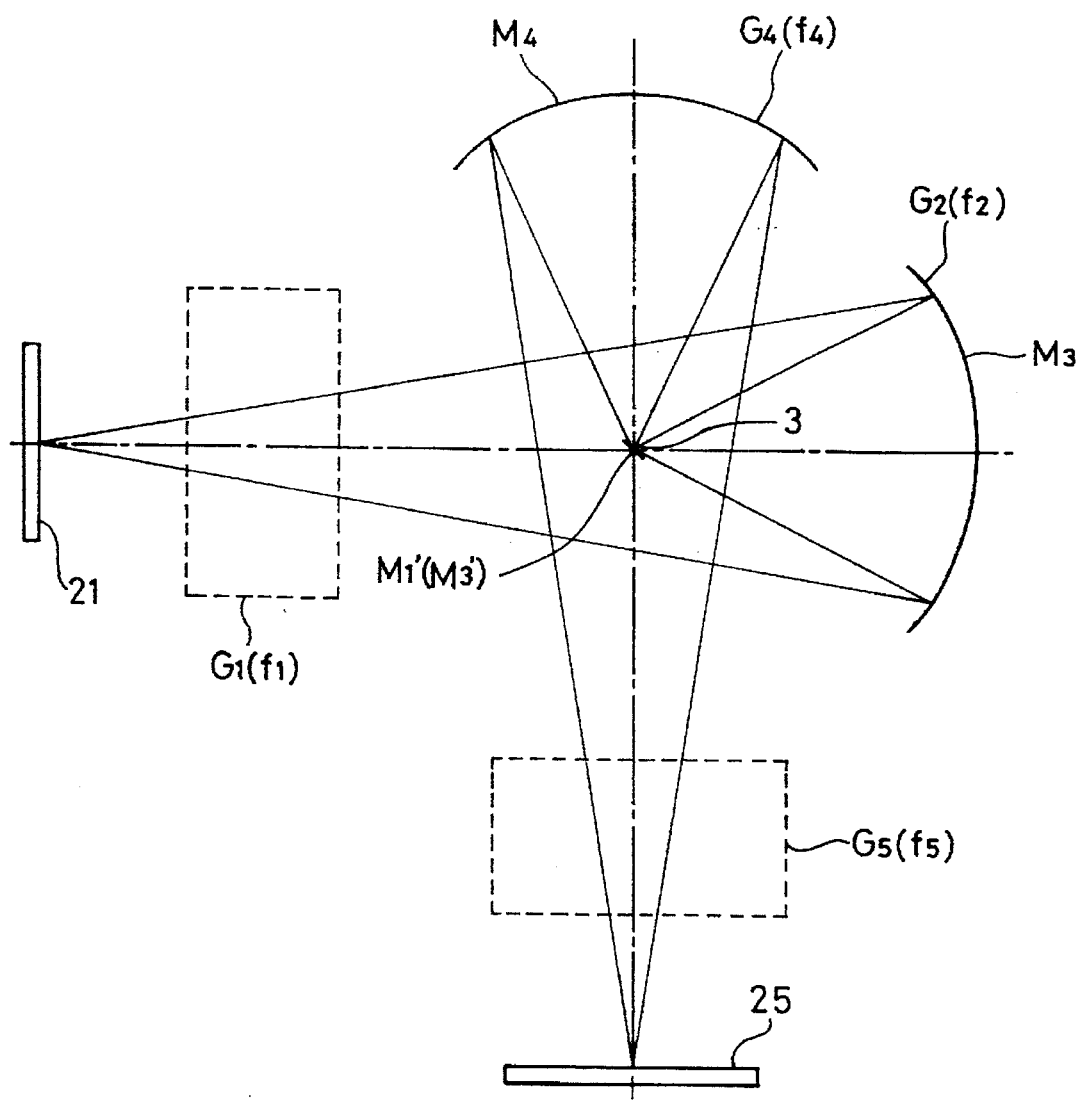
FIG. 17 is a structural drawing to show the basic structure of a catadioptric projection exposure apparatus of full exposure method in a modification of the third embodiment.

Next, a modification of the third embodiment involves an apparatus having the basic structure of full exposure method, which is provided with a projection optical system for projecting an image of a pattern formed on the reticle (21) onto the wafer (25), for example as shown in FIG. 17. The projection optical system includes a first partial imaging optical system for forming an intermediate image (3) of a pattern present on the reticle (21) and a second partial imaging optical system for re-imaging the intermediate image (3) to form an image thereof on the wafer (25).

The first partial imaging optical system is composed of a first converging group $G_1$, a second converging group $G_2$ and a small plane mirror $M'_1$ ($M'_3$). The first converging group $G_1$ has a focal length $f_1$ and a positive refracting power, which converges a beam from the pattern on the reticle (21) toward the second converging group $G_2$. The second converging group $G_2$ includes a concave reflecting mirror $M_2$ and has a focal length $f_2$ and a positive refracting power. The second converging group $G_2$ reflects a beam from the first converging group $G_1$ to form the intermediate image (3) of the pattern in the small plane mirror $M'_1$ ($M'_3$). The small plane mirror $M'_1$ ($M'_3$) is inclined at 45° relative to the optical axis and reflects a beam from the second converging group $G_2$ toward a fourth converging group $G_4$.

The second partial imaging optical system is composed of the fourth converging group $G_4$ and a fifth converging group $G_5$. The fourth converging group $G_4$ includes a concave reflecting mirror $M_4$ having a focal length $f_4$ and a positive refracting power, which reflects a beam from the small plane mirror $M'_1$ ($M'_3$) toward the fifth converging group $G_5$. The fifth converging group $G_5$ has a focal length $f_5$ and a positive refracting power, which converges a beam from the fourth converging group $G_4$ to form an image of the intermediate image (3) on the wafer (25).

As so arranged, a beam from the pattern on the reticle (21) advances through the first converging group $G_1$, is then reflected by the second converging group $G_2$ including the concave reflecting mirror $M_2$, and forms the intermediate image (3) of the pattern in the small plane mirror $M'_1$ ($M'_3$). Subsequently, a beam from the intermediate image (3) is reflected by the fourth converging group $G_4$ including the concave reflecting mirror $M_4$ and then passes through the fifth converging group $G_5$ to form an image of the intermediate image (3) on the surface of wafer (25).

Figure 18:
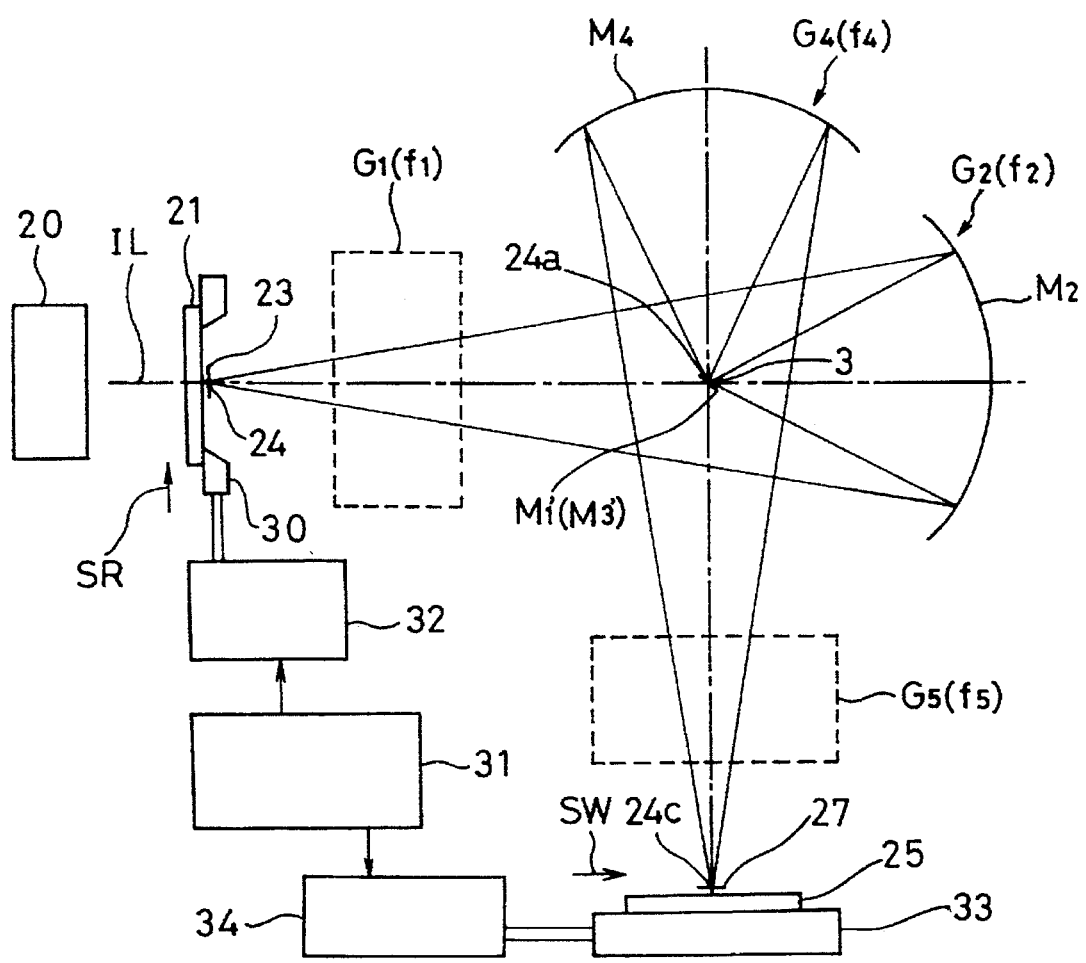
FIG. 18 is a structural drawing to show a stage mechanism in a catadioptric projection exposure apparatus of slit scan exposure method in a modification of the third embodiment.

In the modification of the third embodiment, an apparatus has the basic structure of slit scan exposure method, which is further provided with a stage mechanism for consecutively projecting images of segments of a pattern formed on the reticle (21) onto the wafer (25), for example as shown in FIG. 18. The stage mechanism is constructed of a reticle stage (30), a wafer stage (33), a reticle stage control system (32), a wafer stage control system (34) and a main control system (31).

In the projection optical system, the illumination area (23) is shaped in an elongate rectangle. The small plane mirror $M'_1$ ($M'_3$) is formed in the shape of slender slit. The longitudinal direction of the small plane mirror $M'_1$ ($M'_3$) is parallel to the longitudinal direction of the illumination area (23). Also, the optical axis of the projection optical system is parallel to the plane of the drawing. The longitudinal direction of the illumination area (23) and the longitudinal direction of the small plane mirror $M'_1$ ($M'_3$) both are perpendicular to the plane of the drawing. The small plane mirror $M'_1$ ($M'_3$) is set as rotated 45° relative to the optical axis of projection optical system about the axis perpendicular to the plane of the drawing.

As so arranged, illumination light IL from the illumination optical system (20) is irradiated onto the illumination area (23) on the pattern area (22) in the reticle (21). A beam from a pattern (24) in the illumination area (23) passes through the first converging group $G_1$, is reflected by the second converging group $G_2$ including the concave reflecting mirror $M_2$, and then forms an intermediate image (24A) of the pattern in the small plane mirror $M'_1$ ($M'_3$). Subsequently, a beam from the intermediate image (24A) is reflected by the fourth converging group $G_4$ including the concave reflecting mirror $M_4$ and passes through the fifth converging group $G_5$ to form an image (24C) of the intermediate image (24A) in the exposure area (27) on the exposure field (26) of wafer (25).

Figure 19:
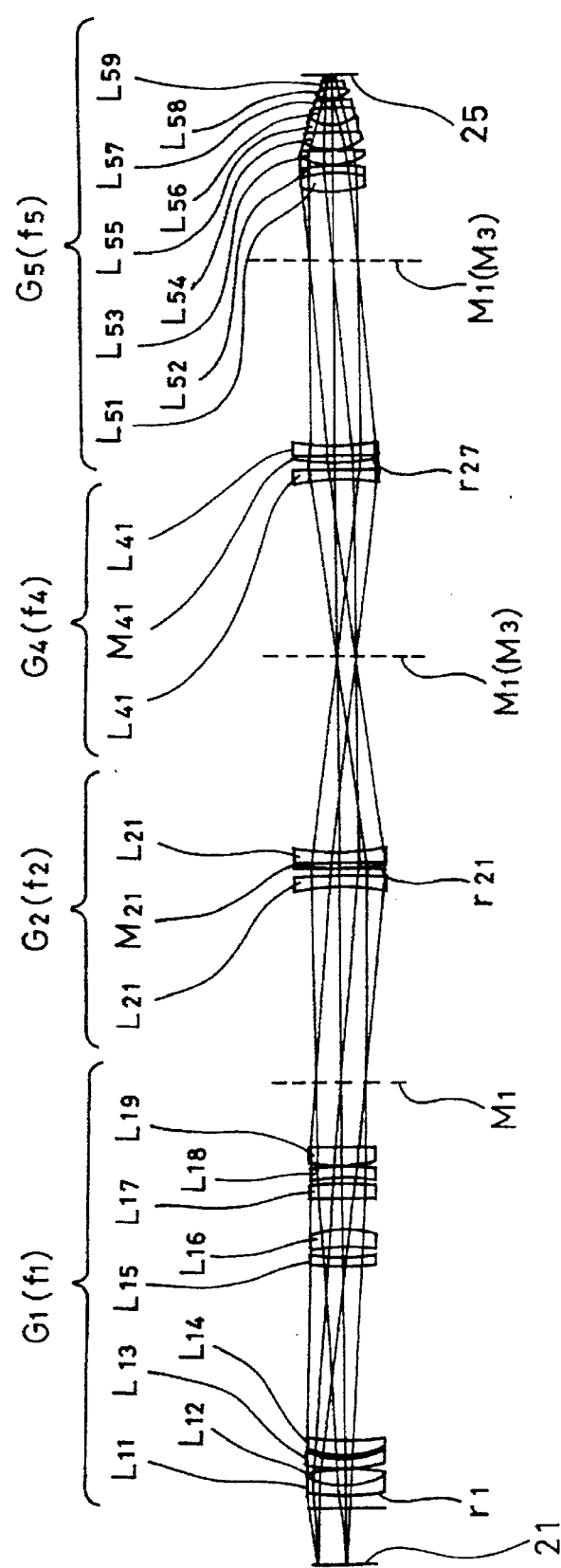
FIG. 19 is a developed path diagram to show a projection optical system in a first experimental example or in a second experimental example in the third embodiment.

FIG. 19 is a developed path diagram to show a projection optical system in first and second experimental examples of the third embodiment.

Light from a pattern on reticle (21) passes through a first converging group $G_1$ composed of nine refracting lenses, is then reflected at the periphery of a plane mirror $M_1$ having a slender aperture at the center and inclined at 45° relative to the optical axis, and thereafter reaches a second converging group $G_2$ composed of a concave reflecting mirror $M_{21}$ and a negative meniscus lens $L_{21}$ disposed in front of the mirror $M_{21}$. The light reflected by the second converging group $G_2$ forms an intermediate image of the pattern in the aperture of plane mirror $M_1$. Then, light from the intermediate image reaches a fourth converging group $G_4$ composed of a concave reflecting mirror $M_{41}$ and a negative meniscus lens disposed in front thereof, and the light reflected by the fourth converging group $G_4$ is then reflected by the plane mirror $M_3$ and passes through a fifth converging group $G_5$ composed of nine refracting lenses to form an image of the pattern on the surface of wafer (25).

The first converging group $G_1$ is constructed of a negative meniscus lens $L_{11}$ with a convex surface facing the reticle (21), a convex lens $L_{12}$, a negative meniscus lens $L_{13}$ with a convex surface facing the reticle (21), a negative meniscus lens $L_{14}$ with a convex surface facing the reticle (21), a negative meniscus lens $L_{15}$ with a convex surface facing the reticle (21), a positive meniscus lens $L_{16}$ with a concave surface facing the reticle (21), a convex lens $L_{17}$, a negative meniscus lens $L_{18}$ with a concave surface facing the reticle (21) and a positive meniscus lens $L_{19}$ with a convex surface facing the reticle 21, which are arranged in the named order from the side of reticle (21). The second converging group $G_2$ is composed of a negative meniscus lens $L_{21}$ with a concave surface facing the reticle (21) and a concave reflecting mirror $M_{21}$.

The fourth converging group $G_4$ is composed of a negative meniscus lens $L_{41}$ with a concave surface facing the reticle (21) and a concave reflecting mirror $M_{41}$. The fifth converging group $G_5$ is composed of a convex lens $L_{51}$, a negative meniscus lens $L_{52}$ with a concave surface facing the reticle (21), a positive meniscus lens $L_{53}$ with a convex surface facing the reticle (21), a positive meniscus lens $L_{54}$ with a convex surface facing the reticle (21), a negative meniscus lens $L_{55}$ with a convex surface facing the reticle (21), a convex lens $L_{56}$, a concave lens $L_{57}$, a convex lens $L_{58}$ and a concave lens $L_{59}$.

In other words, this example is composed of a plane mirror having the central aperture (more precisely a compound plane mirror in which two plane mirrors are bonded to each other), two concave reflecting mirrors and twenty refracting lenses. In the optical system in this example, the refracting lenses are made of fused quartz or fluorite, and the axial chromatic aberration and the chromatic aberration of magnification are corrected for the wavelength band of 1 nm at wavelength of 248 nm of an ultraviolet excimer laser. Also, the spherical aberration, the coma, the astigmatism and the distortion all are well corrected, which thus enables to provide a projection optical system with an excellent performance. Then, the excellent performance can be maintained even if the image height is doubled or tripled in proportion.

Also, each of the second converging group $G_2$ and the fourth converging group $G_4$ includes a negative meniscus lens, so that each group has the structure of Mangin mirror of the type in which the refracting lens and the reflecting mirror are separated from each other.

In the first experimental example of the projection optical system in the third embodiment, the imaging magnification is 0.2, the numerical aperture 0.4 and the object height 100 mm. Table 3 shows a list of radius of curvature $r_i$, surface separation $d_i$ and glass material in the first experimental example in the third embodiment. In the following table, the twenty first surface and the twenty seventh surface are hypothetical surfaces for representing the two concave reflecting mirrors in the developed path diagram.

TABLE 3

| i | $r_i$ | $d_i$ | Glass Material |
|---|---|---|---|
| 0 | — | 242.8 | |
| 1 | 692.22 | 30.0 | $SiO_2$ |
| 2 | 338.85 | 8.0 | |
| 3 | 348.61 | 51.0 | $SiO_2$ |
| 4 | −956.35 | 1.0 | |
| 5 | 643.35 | 36.0 | $SiO_2$ |
| 6 | 306.37 | 13.0 | |
| 7 | 331.41 | 47.0 | $SiO_2$ |
| 8 | 700.66 | 597.0 | |
| 9 | 1680.47 | 30.0 | $SiO_2$ |
| 10 | 487.83 | 40.0 | |
| 11 | −832.45 | 60.0 | $SiO_2$ |
| 12 | −424.04 | 100.0 | |
| 13 | 4193.07 | 60.0 | $SiO_2$ |
| 14 | −1389.72 | 19.0 | |
| 15 | −697.68 | 40.0 | $SiO_2$ |
| 16 | −1813.61 | 3.0 | |
| 17 | 690.96 | 60.0 | $SiO_2$ |
| 18 | 2468.91 | 890.2 | |
| 19 | −828.71 | 34.0 | $SiO_2$ |
| 20 | −3464.81 | 24.0 | |
| 21 | ∞ | 0.0 | |
| 22 | 858.47 | 24.0 | |
| 23 | 3464.81 | 34.0 | $SiO_2$ |
| 24 | 828.71 | 1296.7 | |
| 25 | −883.05 | 34.0 | $SiO_2$ |
| 26 | −5743.26 | 24.0 | |
| 27 | ∞ | 0.0 | |
| 28 | 833.20 | 24.0 | |
| 29 | 5743.26 | 34.0 | $SiO_2$ |
| 30 | 883.05 | 860.5 | |
| 31 | 528.80 | 60.0 | $CaF_2$ |
| 32 | −447.01 | 7.0 | |
| 33 | −368.84 | 20.0 | |
| 34 | −1406.21 | 1.0 | |
| 35 | 256.78 | 50.0 | $CaF_2$ |

TABLE 3-continued

| i | $r_i$ | $d_i$ | Glass Material |
|---|---|---|---|
| 36 | 2448.55 | 1.0 | |
| 37 | 195.15 | 56.0 | $CaF_2$ |
| 38 | 738.72 | 5.8 | |
| 39 | 2843.45 | 20.0 | |
| 40 | 120.29 | 5.0 | |
| 41 | 121.81 | 60.0 | $CaF_2$ |
| 42 | −833.90 | 5.0 | |
| 43 | −495.91 | 24.0 | $SiO_2$ |
| 44 | 2014.55 | 4.0 | |
| 45 | 117.12 | 36.0 | $CaF_2$ |
| 46 | −1170.37 | 4.0 | |
| 47 | −2005.41 | 20.0 | $SiO_2$ |
| 48 | 886.78 | 23.9 | |

Figure 20:
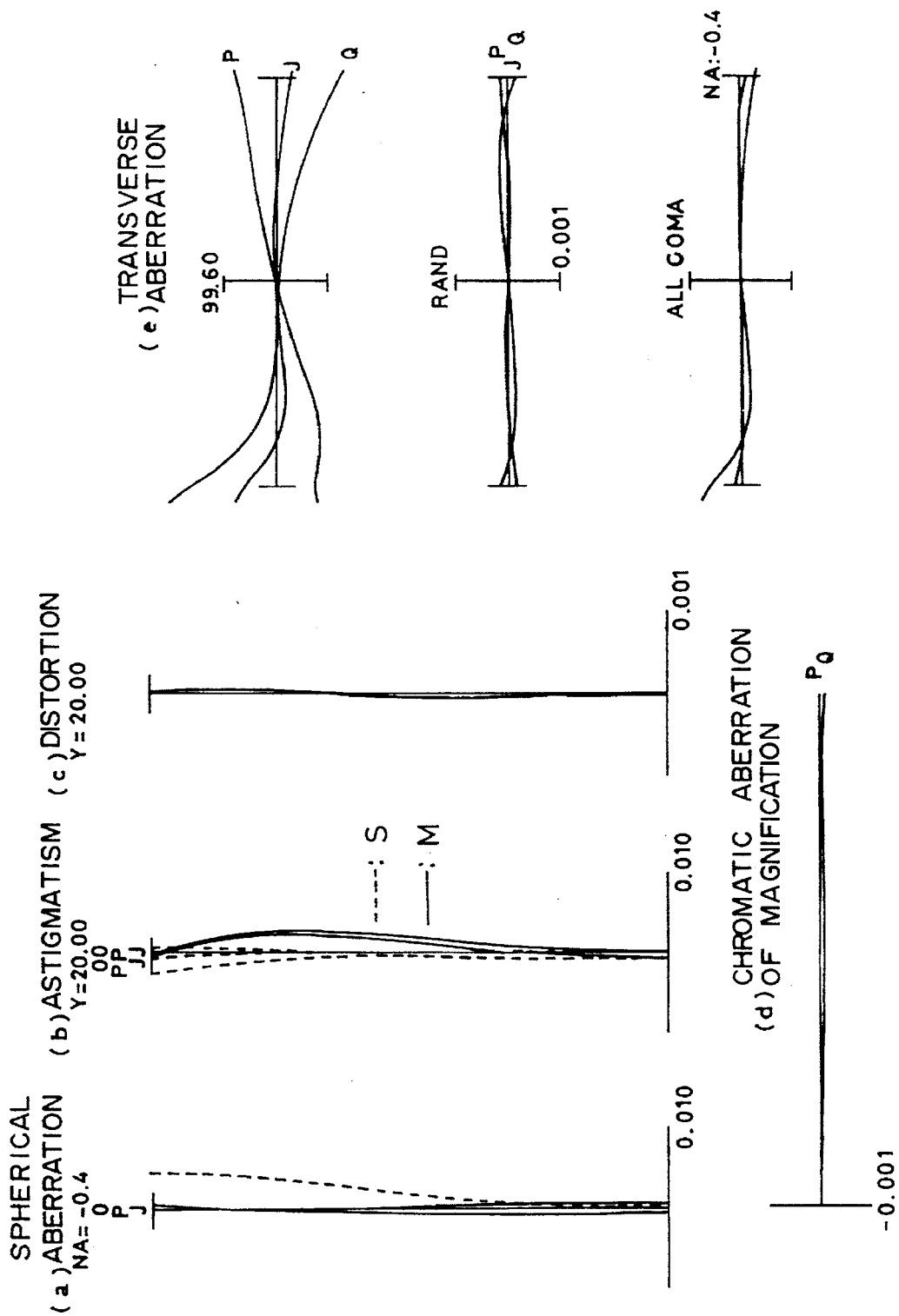
FIG. 20 is aberration diagrams for the projection optical system in the first experimental example in the third embodiment.

Also, FIG. 20 is aberration diagrams, in which (a) to (c) are diagrams of longitudinal aberrations in the first experimental example of the third embodiment, (d) a diagram of a chromatic aberration of magnification in the third experimental example of the first embodiment, and (e) a diagram of a transverse aberration in the first experimental example in the third embodiment. It is seen from these aberration diagrams that the various aberrations are well corrected in the region of wide image circle in this example even with the large numerical aperture of 0.4. The chromatic aberration is also well corrected.

In the second experimental example of the projection optical system in the third embodiment, the imaging magnification is 0.2, the numerical aperture 0.45, the object height 25 mm and the maximum mirror radius 115 mm. Table 4 shows a list of radius of curvature $r_i$, surface separation $d_i$ and glass material in the second experimental example of the third embodiment. In the following table, the twenty first surface and the twenty seventh surface are hypothetical surfaces for representing the two concave reflecting mirrors in the developed optical path.

TABLE 4

| i | $r_i$ | $d_i$ | Glass Material |
|---|---|---|---|
| 0 | — | 121.4 | |
| 1 | 767.44 | 15.0 | $SiO_2$ |
| 2 | 163.77 | 4.0 | |
| 3 | 166.54 | 25.0 | $SiO_2$ |
| 4 | −505.97 | 0.5 | |
| 5 | 233.77 | 18.0 | $SiO_2$ |
| 6 | 149.40 | 6.5 | |
| 7 | 166.94 | 23.5 | $SiO_2$ |
| 8 | 469.37 | 298.5 | |
| 9 | 606.70 | 15.0 | $SiO_2$ |
| 10 | 238.92 | 20.0 | |
| 11 | −359.02 | 30.0 | $SiO_2$ |
| 12 | −210.62 | 100.0 | |
| 13 | 3003.74 | 30.0 | $SiO_2$ |
| 14 | −689.22 | 9.5 | |
| 15 | −329.44 | 20.0 | $SiO_2$ |
| 16 | −896.85 | 1.5 | |
| 17 | 306.66 | 30.0 | $SiO_2$ |
| 18 | 1333.63 | 447.0 | |
| 19 | −414.75 | 17.0 | $SiO_2$ |
| 20 | −1772.13 | 12.0 | |
| 21 | ∞ | 0.0 | |
| 22 | 427.51 | 12.0 | |
| 23 | 1772.13 | 17.0 | $SiO_2$ |
| 24 | 414.75 | 652.6 | |
| 25 | −440.69 | 17.0 | $SiO_2$ |
| 26 | −2852.06 | 12.0 | |
| 27 | ∞ | 0.0 | |

TABLE 4-continued

| i | $r_i$ | $d_i$ | Glass Material |
|---|---|---|---|
| 28 | 416.58 | 12.0 | |
| 29 | 2852.06 | 17.0 | $SiO_2$ |
| 30 | 440.69 | 432.6 | |
| 31 | 289.73 | 30.0 | $CaF_2$ |
| 32 | −246.70 | 3.5 | |
| 33 | −193.54 | 10.0 | $SiO_2$ |
| 34 | −599.60 | 0.5 | |
| 35 | 144.65 | 20.0 | $CaF_2$ |
| 36 | 1180.27 | 0.5 | |
| 37 | 94.98 | 32.0 | $CaF_2$ |
| 38 | 342.58 | 2.9 | |
| 39 | 1588.35 | 12.0 | $SiO_2$ |
| 40 | 61.18 | 3.0 | |
| 41 | 60.40 | 27.0 | $CaF_2$ |
| 42 | −523.49 | 2.5 | |
| 43 | −217.42 | 12.0 | $SiO_2$ |
| 44 | −620.70 | 2.0 | |
| 45 | 62.05 | 18.0 | $CaF_2$ |
| 46 | −518.54 | 2.0 | |
| 47 | −653.52 | 10.0 | $SiO_2$ |
| 48 | 600.35 | 12.0 | |

Figure 21:
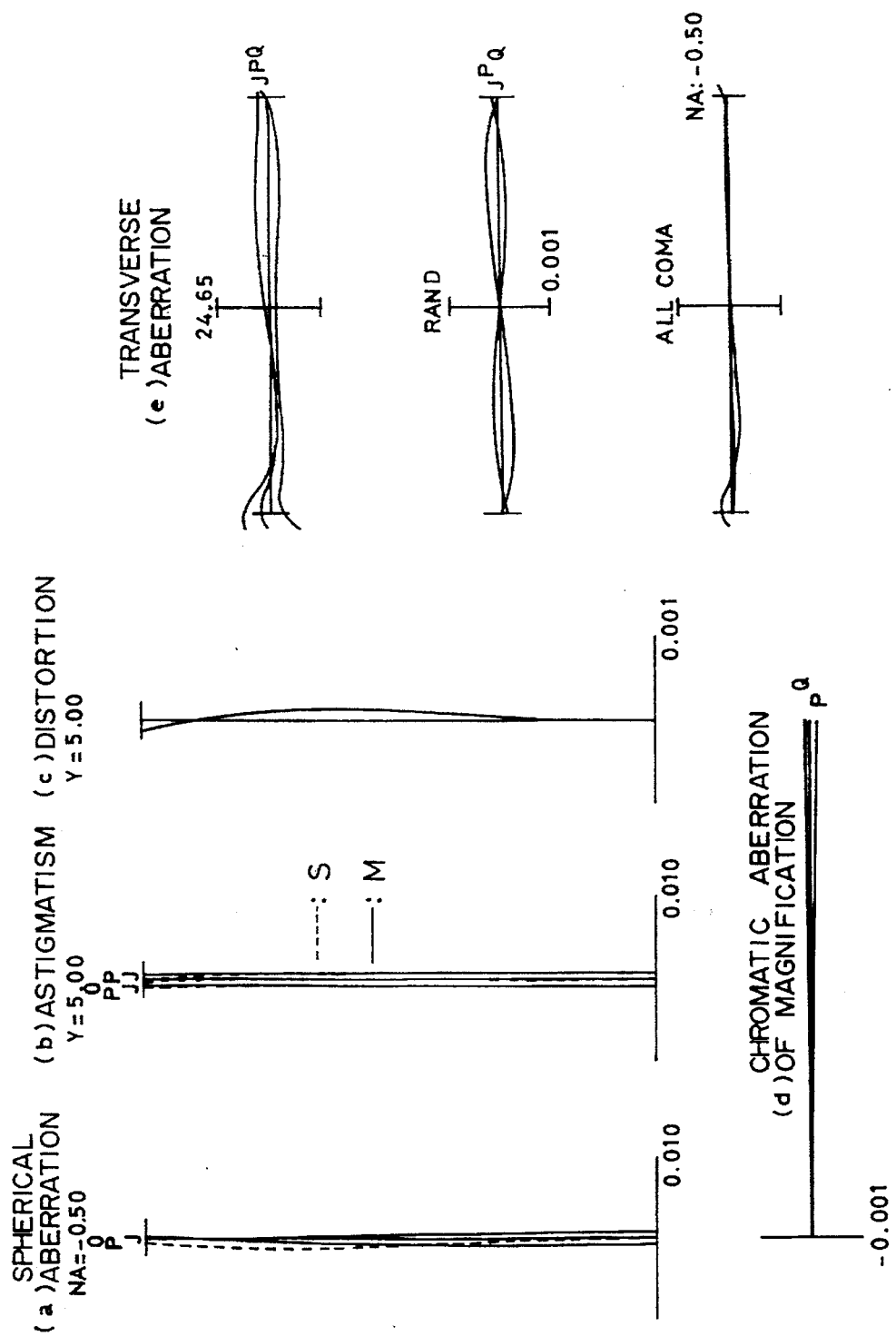
FIG. 21 is aberration diagrams for the projection optical system in the second experimental example in the third embodiment.

Also, FIG. 21 is aberration diagrams, in which (a) to (c) are diagrams of longitudinal aberrations in the second experimental example of the third embodiment, (d) a diagram of a chromatic aberration of magnification in the second experimental example of the third embodiment, and (e) a diagram of a transverse aberration in the second experimental example of the third embodiment. It is seen from these aberration diagrams that the various aberrations are well corrected in the region of wide image circle in this example even with the large numerical aperture of 0.45. The chromatic aberration is also well corrected.

The plane mirror $M_1$ ($M_3$) with aperture in FIG. 14 can be replaced by a small plane mirror or elongate plane mirror $M'_1$ ($M'_3$) as shown in FIG. 18, to achieve an equivalent optical system, as described above. Such arrangement can facilitate the production of the selection optical system. Also, the plane mirror $M_1$ ($M_3$) may be replaced by a concave mirror or a convex mirror with aperture, or a small concave mirror or a small convex mirror.

Fourth Embodiment

Figure 22:
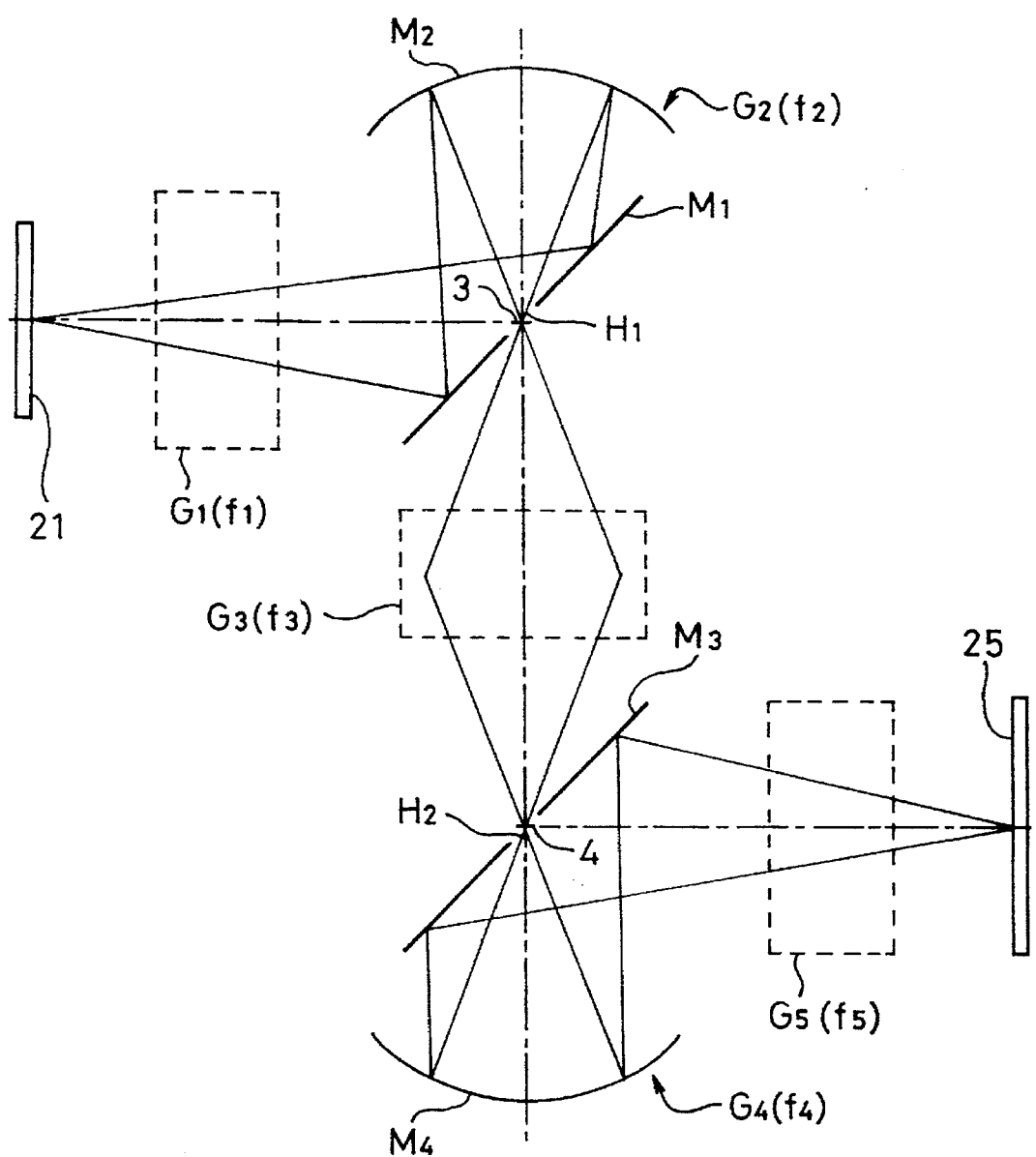
FIG. 22 is a structural drawing to show the basic structure of a catadioptric projection exposure apparatus of full exposure method in the fourth embodiment of the present invention.

In the fourth embodiment of a catadioptric projection exposure apparatus according to the present invention, an apparatus has the basic structure of full exposure method, for example as shown in FIG. 22, provided with a projection optical system for projecting an image of a pattern formed on a reticle (21) onto a wafer (25). The projection optical system includes a first partial imaging optical system for forming a first intermediate image (3) of the pattern present on the reticle (21), and a second partial imaging optical system for re-imaging the first intermediate image (3) to form an image thereof on the wafer (25).

The first partial imaging optical system is composed of a first converging group $G_1$, a plane mirror (selection optical system) $M_1$ and a second converging group $G_2$. The first converging group $G_1$ has a focal length $f_1$ and a positive refracting power, which converges a beam from the pattern on the reticle (21) toward the plane mirror $M_1$. The plane mirror $M_1$ has an aperture $H_1$ at the center and is inclined at 45° relative to the optical axis. The plane mirror $M_1$ reflects a beam from the first converging group $G_1$ toward the second converging group $G_2$ by its surface, and permits a beam from the second converging group $G_2$ to pass through the aperture toward a third converging group $G_3$. The second converging group $G_2$ includes a concave reflecting mirror $M_2$ and has a focal length $f_2$ and a positive refracting power. The second converging group $G_2$ reflects a beam from the plane mirror $M_1$ to form a first intermediate image (3) of the pattern in the aperture $H_1$ of plane mirror $M_1$.

The second partial imaging optical system is composed of the third converging group $G_3$, a fourth converging group $G_4$, a plane mirror (selection optical system) $M_3$ and a fifth converging group $G_5$. The third converging group $G_3$ has a focal length $f_3$ and a positive refracting power and converges a beam from the first intermediate image (3) to form a second intermediate image (4) of the pattern in an aperture $H_2$ of plane mirror $M_3$. The fourth converging group $G_4$ includes a concave reflecting mirror $M_4$ having a focal length $f_4$ and a positive refracting power, which reflects a beam from the second intermediate image (4) toward the selection optical system $M_3$. The plane mirror $M_3$ has an aperture $H_2$ at the center and is inclined at 45° relative to the optical axis. The plane mirror $M_3$ permits a beam from the third converging group $G_3$ to pass through the aperture toward the fourth converging group $G_4$ and reflects a beam from the fourth converging group $G_4$ toward the fifth converging group $G_5$. The fifth converging group $G_5$ has a focal length $f_5$ and a positive refracting power and converges a beam from the plane mirror $M_3$ to form an image of the second intermediate image (4) on the wafer (25).

As so arranged, a beam from the pattern on the reticle (21) advances through the first converging group $G_1$, is reflected at the periphery of plane mirror $M_1$, thereafter is reflected by the second converging group $G_2$ including the concave reflecting mirror $M_2$, and then forms the first intermediate image (3) of the pattern in the aperture $H_1$ of plane mirror $M_1$. Subsequently, the beam from the first intermediate image (3) passes through the third converging group $G_3$ to form the second intermediate image (4) of the pattern in the aperture $H_2$ of plane mirror $M_3$. Then, the beam from the second intermediate image (4) is reflected by the fourth converging group $G_4$ including the concave reflecting mirror $M_4$, thereafter is reflected at the periphery of plane mirror $M_3$, and then passes through the fifth converging group $G_5$ to form an image of the second intermediate image (4) on the surface of wafer (25).

Figure 23:
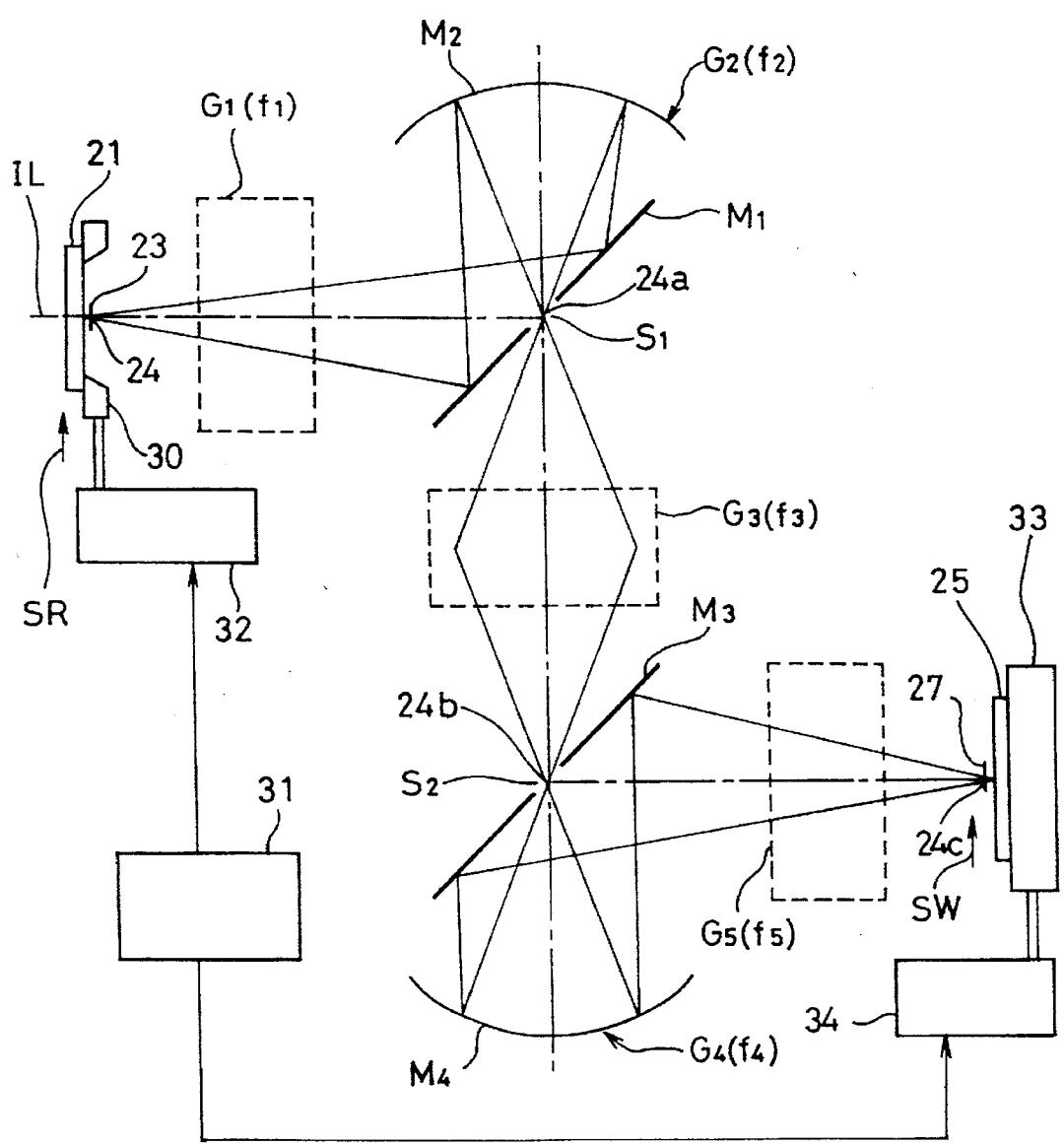
FIG. 23 is a structural drawing to show a stage mechanism in a catadioptric projection exposure apparatus of slit scan exposure method in the fourth embodiment.

In the next place, the basic structure of an apparatus of slit scan exposure method in the fourth embodiment further involves a stage mechanism for consecutively projecting images of segments of a pattern formed on the reticle (21) onto the wafer (25), for example as shown in FIG. 23. The stage mechanism is constructed of a reticle stage (30), a wafer stage (33), a reticle stage control system (32), a wafer stage control system (34) and a main control system (31).

The reticle stage (30) runs the reticle (21) relative to a slit illumination area (23) formed by exposure light IL from an illumination optical system (20) in a pattern area (22) of reticle (21) in the direction of SR perpendicular to the longitudinal direction of the illumination area (23). The wafer stage (33) runs the wafer (25) relative to an exposure area (27) conjugate with the slit illumination area (23) in a shot area (26) in the wafer (25) in the direction of SW conjugate with the direction of SR. The main control system (31) adjusts a relative velocity based on a projection magnification β of the overall projection optical system through the reticle stage control system (32) and the wafer stage control system (34) to set a running velocity V of reticle (21) and a running velocity βV of wafer (25) and also to set running timings of reticle (21) and wafer (25) as synchronized with each other.

In the projection optical system, the illumination area (23) is shaped in an elongate rectangle. The plane mirrors $M_1$ and $M_3$ have a slender aperture $S_1$ and $S_2$ at the center respectively. The longitudinal direction of the apertures $S_1$ and $S_2$ is parallel to the longitudinal direction of the illumination area (23), and the width of each aperture $S_1$ and $S_2$ is set 10 to 20% narrower than the width of a beam incident into the plane mirror $M_1$, $M_3$. Additionally, slender light shield regions (28) and (29) may be provided in the direction perpendicular to the longitudinal direction of the apertures $S_1$, $S_2$ on the plane mirrors $M_1$, $M_3$ to cancel the directionality of imaging properties. Also, the optical axis of the projection optical system is parallel to the plane of the drawing. The longitudinal direction of the illumination area (23) and the longitudinal direction of the apertures $S_1$ and $S_2$ are perpendicular to the plane of the drawing. The plane mirrors $M_1$ and $M_3$ each are set as rotated 45° relative to the optical axis of the projection optical system about the axis perpendicular to the plane of the drawing.

As so arranged, illumination light IL from the illumination optical system (20) is irradiated onto the illumination area (23) on the pattern area (22) of reticle (21). A beam from a pattern (24) in the illumination area (23) advances through the first converging group $G_1$ and is reflected at the periphery of the surface of plane mirror $M_1$. Subsequently, the beam is reflected by the second converging group $G_2$ including the concave reflecting mirror $M_2$ and the reflected beam A forms a first intermediate image (24A) of the pattern in the aperture $S_1$ of plane mirror $M_1$. Then a beam from the first intermediate image (24A) passes through the third converging group $G_3$ to form a second intermediate image (24B) of the pattern in the aperture $S_2$ of plane mirror $M_3$. Next, the beam from the second intermediate image (24B) is reflected by the fourth converging group $G_4$ including the concave reflecting mirror $M_4$. After that, a beam B reflected at the periphery of plane mirror $M_3$ passes through the fifth converging group $G_5$ to form an image (24C) of the second intermediate image (24B) in the exposure area (27) on the exposure field (26) in the wafer (25).

The main control system (31) sets the running velocity V and the running timing of reticle stage (30) through the reticle stage control system (32). With the projection magnification β of the overall projection optical system, the main control system (31) also sets the running velocity of wafer stage (33) to βV while adjusting the relative velocity to the reticle stage (30) through the wafer stage control system (34). The main control system (31) also sets the running timing of wafer stage (33) as synchronized with the running of reticle stage (30) through the wafer stage control system (34). Thus, the reticle (21) is run relative to the illumination area (23) by the reticle stage (30) at the velocity V in the direction of SR perpendicular to the longitudinal direction of the illumination area (23). Also, the wafer (25) is run relative to the exposure area (27) conjugate with the illumination area (23) by the wafer stage (33) in the direction of SW conjugate with the direction of SR.

Figure 24:
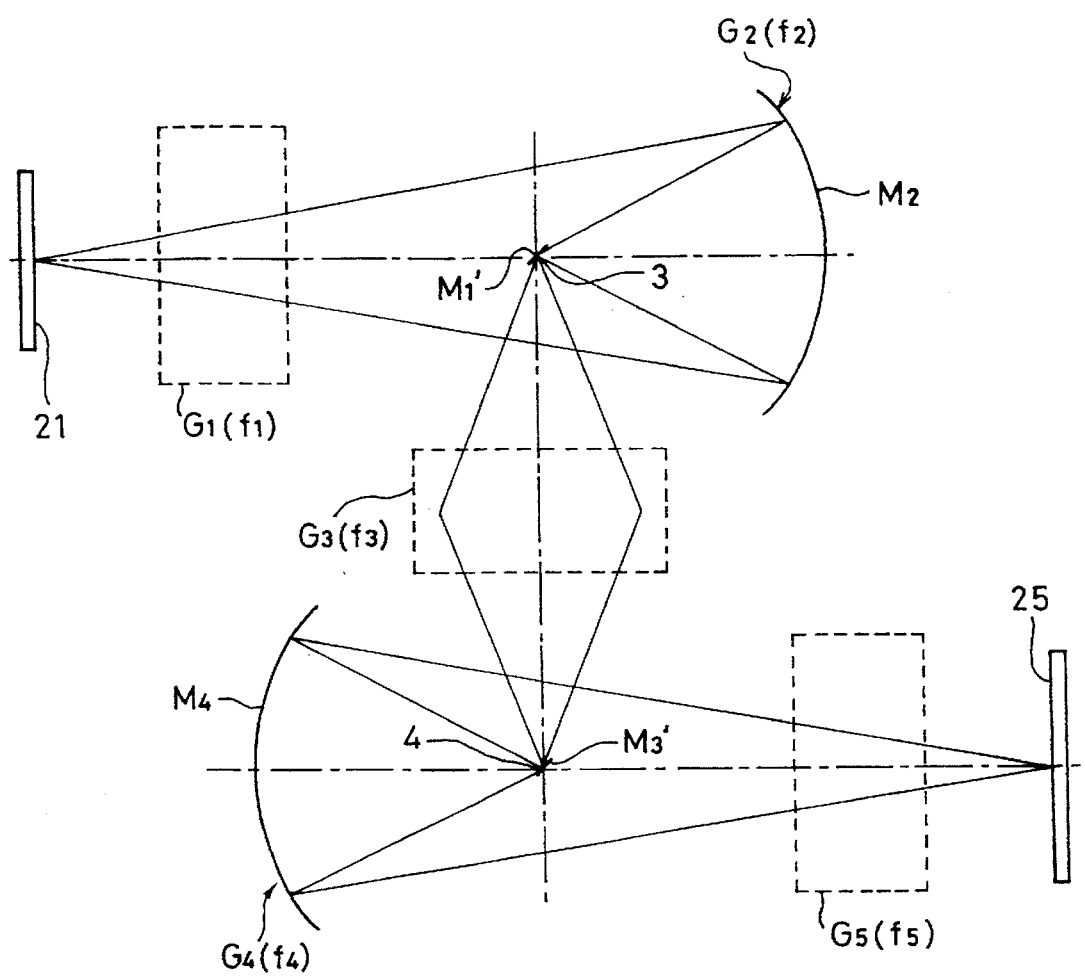
FIG. 24 is a structural drawing to show the basic structure of a catadioptric projection exposure apparatus of full exposure method in a modification of the fourth embodiment.

Next, a modification of the fourth embodiment involves an apparatus having the basic structure of full exposure method, which is provided with a projection optical system for projecting an image of a pattern formed on the reticle (21) onto the wafer (25), for example as shown in FIG. 24. The projection optical system includes a first partial imaging optical system for forming a first intermediate image (3) of a pattern present on the reticle (21) and a second partial imaging optical system for re-imaging the first intermediate image (3) to form an image thereof on the wafer (25).

The first partial imaging optical system is composed of a first converging group $G_1$, a second converging group $G_2$ and a small plane mirror $M'_1$. The first converging group $G_1$ has a focal length $f_4$ and a positive refracting power, which converges a beam from the pattern on the reticle (21) toward the second converging group $G_2$. The second converging group $G_2$ includes a concave reflecting mirror $M_2$ having a focal length $f_2$ and a positive refracting power. The second converging group $G_2$ reflects a beam from the first converging group $G_1$ to form the first intermediate image (3) of the pattern in the small plane mirror $M'_1$. The small plane mirror $M'_1$ is inclined at 45°1 relative to the optical axis and reflects a beam from the second converging group $G_2$ toward a third converging group $G_3$.

The second partial imaging optical system is composed of the third converging group $G_1$, a small plane mirror $M'_3$, a fourth converging group $G_4$ and a fifth converging group $G_5$. The third converging group $G_3$ has a focal length $f_3$ and a positive refracting power and converges a beam from the first intermediate image (3) to form a second intermediate image (4) of the pattern in the small plane mirror $M'_3$. The small plane mirror $M'_3$ is inclined at 45°1 relative to the optical axis and reflects a beam from the second intermediate image (4) toward the fourth converging group $G_4$. The fourth converging group $G_4$ includes a concave reflecting mirror $M_4$ having a focal length $f_4$ and a positive refracting power, which reflects a beam from the small plane mirror $M'_3$ toward the fifth converging group $G_5$. The fifth converging group $G_5$ has a focal length $f_5$ and a positive refracting power and converges a beam from the fourth converging group $G_4$ to form an image of the second intermediate image (4) on the wafer (25).

As so arranged, a beam from the pattern on the reticle (21) advances through the first converging group $G_1$, is then reflected by the second converging group $G_2$ including the concave reflecting mirror $M_2$, and then forms the first intermediate image (3) of the pattern in the small plane mirror $M'_1$. Subsequently, a beam from the first intermediate image (3) passes through the third converging group $G_3$ to form the second intermediate image (4) of the pattern in the small plane mirror $M'_3$. Then, a beam from the second intermediate image (4) is reflected by the fourth converging group $G_4$ including the concave reflecting mirror $M_4$ and passes through the fifth converging group $G_5$ to form an image of the second intermediate image (4) on the surface of wafer (25).

Figure 25:
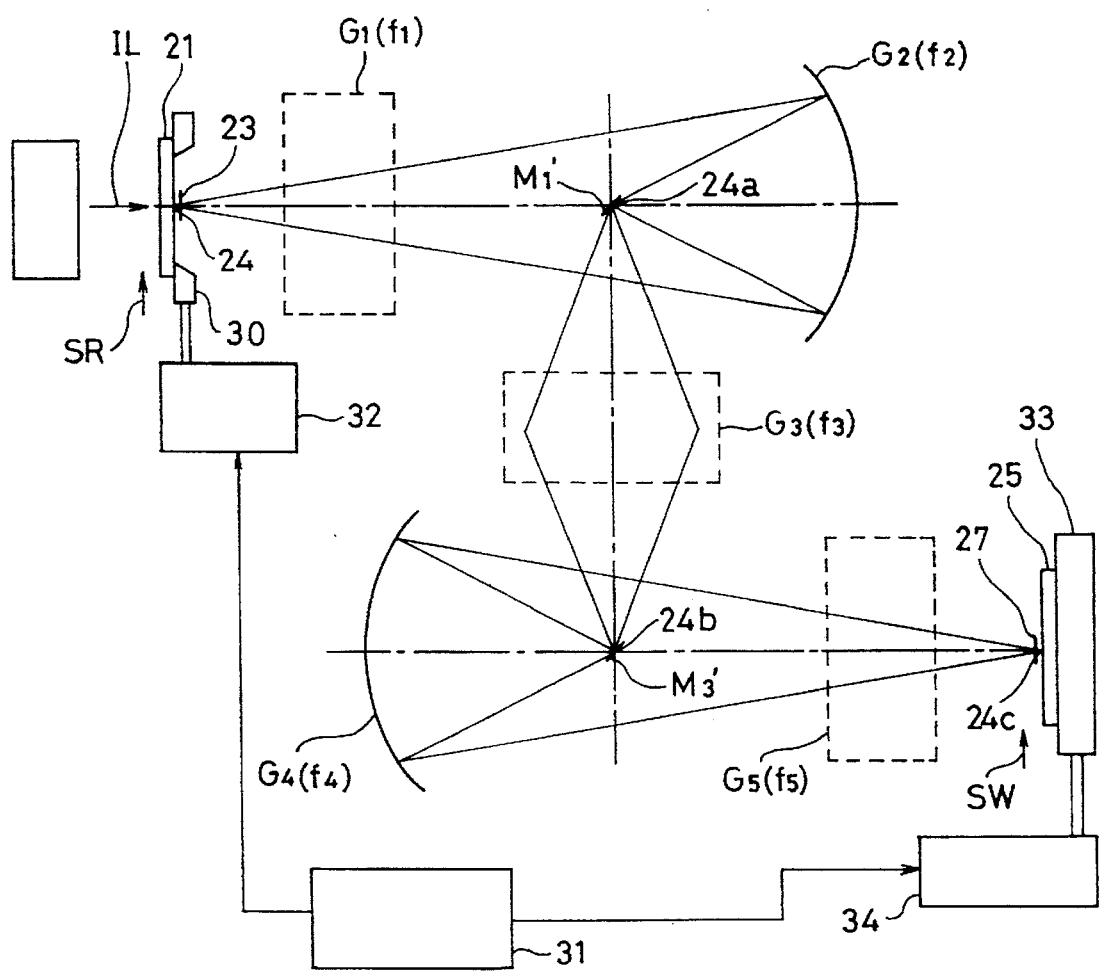
FIG. 25 is a structural drawing to show a stage mechanism in a catadioptric projection exposure apparatus of slit scan exposure method in a modification of the fourth embodiment.

In the modification of the fourth embodiment, an apparatus has the basic structure of slit scan exposure method, which is further provided with a stage mechanism for consecutively projecting images of segments of a pattern formed on the reticle (21) onto the wafer (25), for example as shown in FIG. 25. The stage mechanism is constructed of a reticle stage (30), a wafer stage (33), a reticle stage control system (32), a wafer stage control system (34) and a main control system (31).

In the projection optical system, the illumination area (23) is shaped in an elongate rectangle. The small plane mirrors $M'_1$ and $M'_2$ are formed in the shape of slender slit. The longitudinal direction of the small plane mirror $M'_1$, $M'_3$ is parallel to the longitudinal direction of the illumination area (23). Also, the optical axis of the projection optical system is parallel to the plane of the drawing. Both of the longitudinal direction of the illumination area (23) and the longitudinal direction of the small plane mirror $M'_1$, $M'_3$ both are perpendicular to the plane of the drawing. Each of the small plane mirrors $M'_1$ and $M'_3$ is set as rotated 45° relative to the optical axis of the projection optical system about the axis perpendicular to the plane of the drawing.

As so arranged, illumination light IL from the illumination optical system (20) is irradiated onto the illumination area (23) on the pattern area (22) in the reticle (21). A beam from a pattern (24) in the illumination area (23) passes through the first converging group $G_1$, is reflected by the second converging group $G_2$ including the concave reflecting mirror $M_2$, and then forms a first intermediate image (24A) of the pattern in the small plane mirrors $M'_1$. Subsequently, a beam from the first intermediate image (24A) passes through the third converging group $G_3$ to form a second intermediate image (24B) of the pattern in the small plane mirror $M'_3$. Then a beam from the second intermediate image (24B) is reflected by the fourth converging group $G_4$ including the concave reflecting mirror $M_4$ and passes through the fifth converging group $G_5$ to form an image (24C) of the second intermediate image (24B) in the exposure area (27) on the exposure field (26) of wafer (25).

Figure 26:
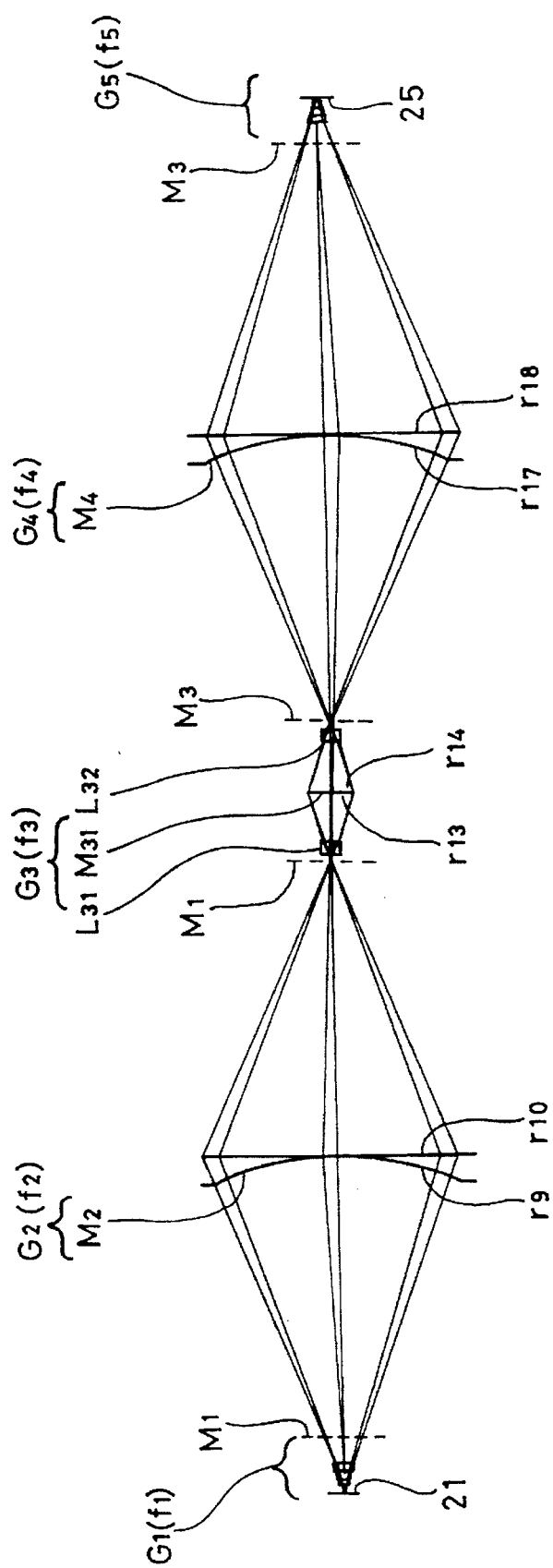
FIG. 26 is a developed path diagram to show a projection optical system in a first experimental example in the fourth embodiment.

FIG. 26 is a developed path diagram to show a projection optical system in a first experimental example of the fourth embodiment.

Light from a pattern on reticle (21) passes through a first converging group $G_1$, is then reflected at the periphery of a first plane mirror $M_1$ having an aperture at the center and inclined at 45° relative to the optical axis, and thereafter reaches a second converging group $G_2$ composed of a first concave reflecting mirror $M_2$. The light reflected by the second converging group $G_2$ forms a first intermediate image of the pattern in the aperture of first plane mirror $M_1$. Then, light from the first intermediate image passes through a third converging group $G_3$ having a concave reflecting mirror $M_{31}$ to form a second intermediate image of the pattern in an aperture of a second plane mirror $M_3$ having the aperture at the center and inclined at 45° relative to the optical axis. Light from the second intermediate image reaches a fourth converging group $G_4$ composed of a second concave reflecting mirror $M_4$ and is reflected thereby. The light reflected by the fourth converging group $G_4$ is reflected at the periphery of the second plane mirror $M_3$. The reflected light passes through a fifth converging group $G_5$ to form an image of the second intermediate image on the surface of wafer (25).

Figure 27:
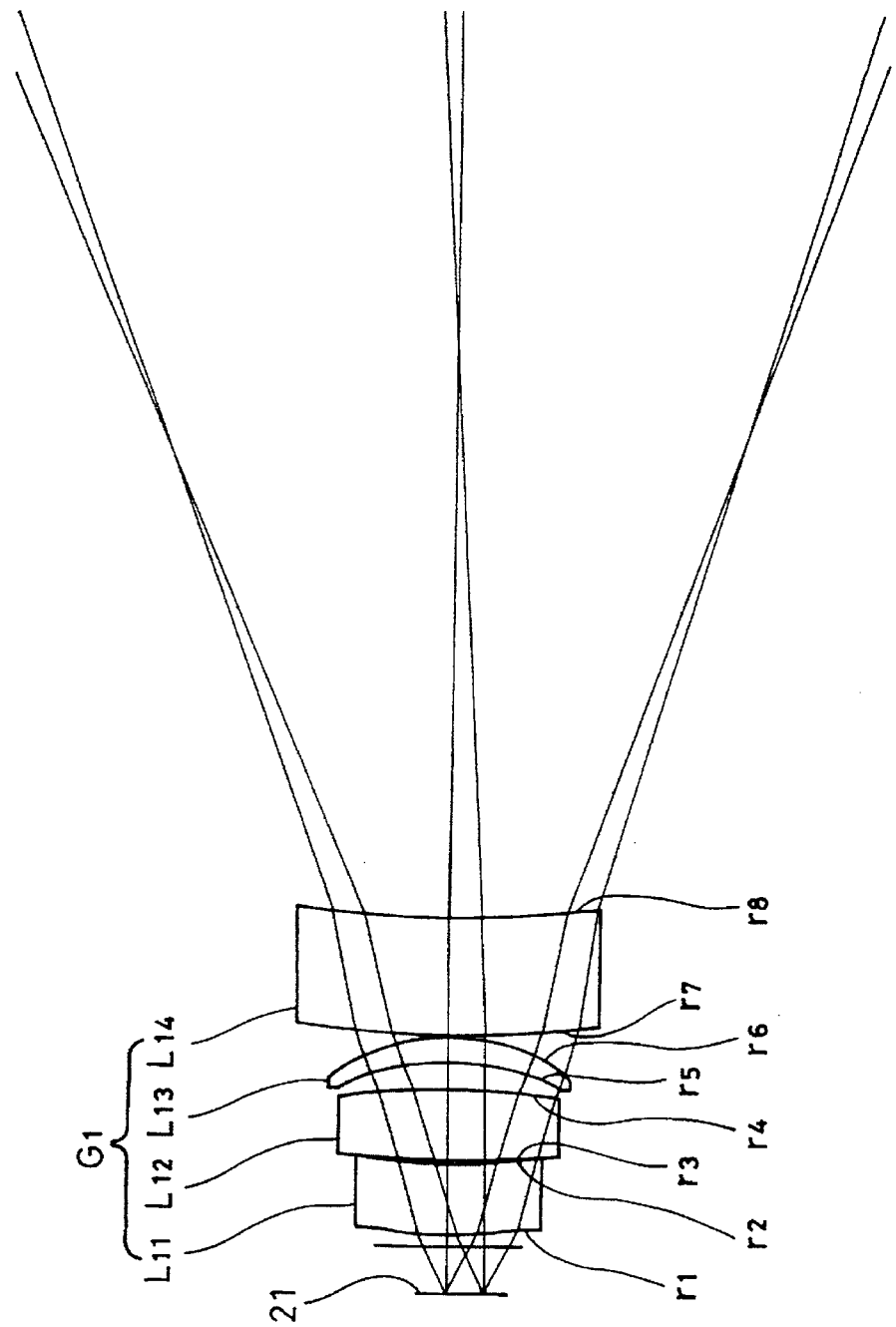
FIG. 27 is a path diagram to show the detailed structure of a first converging group in the projection optical system in the first experimental example in the fourth embodiment.

Also, FIG. 27 shows the detailed structure of the first converging group $G_1$ in FIG. 26. As shown in FIG. 27, the first converging group $G_1$ is composed of a positive meniscus lens $L_{11}$ with a convex surface facing the reticle (21), a double convex lens (hereinafter referred to simply as "convex lens") $L_{12}$, a positive meniscus lens $L_{13}$ with a concave surface facing the reticle (21) and a positive meniscus lens $L_{14}$ with a convex surface facing the reticle (10), which are arranged in the named order from the side of reticle (21). Also, as shown in FIG. 26, the third converging group $G_3$ is composed of a positive meniscus lens $L_{31}$ with a concave surface facing the reticle (21), a concave reflecting mirror $M_{31}$ and a positive meniscus lens $L_{32}$ with a concave surface facing the reticle (21). The fifth converging group $G_5$ has the arrangement symmetric with that of the first converging group $G_1$.

In other words, this example is a symmetric optical system composed of two plane mirrors each having an aperture near the optical axis, three concave reflecting mirrors and ten refracting lenses, arranged such that the numerical aperture is 0.45, the image height 10 mm and the maximum mirror radius 486 mm. Since the optical system has optical properties of nearly zero aberrations, it is apparent that the image height can be doubled or tripled by proportionally enlarging the optical system.

The all refracting lenses are made of fused quartz, and the axial chromatic aberration and the transverse chromatic aberration are corrected for the wavelength band of 1 nm at wavelength of 193 nm of an ultraviolet excimer laser. Also, the spherical aberration, the coma, the astigmatism and the distortion all are well corrected.

Table 5 shows a list of radius of curvature $r_i$, surface separation $d_i$ and glass material in the first experimental example in the fourth embodiment. In the following table, the tenth surface, the fourteenth surface and the eighteenth surface are hypothetical surfaces for representing the respective concave reflecting mirrors in the developed path diagram.

TABLE 5

| i | $r_i$ | $d_i$ | Glass Material |
|---|---|---|---|
| 0 | — | 15.5 | |
| 1 | 125.97 | 18.5 | $SiO_2$ |
| 2 | 138.88 | 1.0 | |
| 3 | 425.68 | 19.0 | $SiO_2$ |
| 4 | −190.98 | 7.0 | |
| 5 | −69.10 | 7.0 | $SiO_2$ |
| 6 | −55.19 | 0.1 | |
| 7 | 310.82 | 31.0 | $SiO_2$ |
| 8 | 327.82 | 1188.0 | |
| 9 | −1189.91 | 0.0 | |
| 10 | ∞ | 1148.7 | |
| 11 | −206.41 | 53.0 | $SiO_2$ |
| 12 | −137.56 | 1191.0 | |
| 13 | −277.08 | 0.0 | |
| 14 | ∞ | 1191.0 | |
| 15 | 137.56 | 53.0 | |
| 16 | 206.41 | 1148.7 | |
| 17 | −1189.91 | 0.0 | |
| 18 | ∞ | 1188.0 | |
| 19 | −327.82 | 31.0 | $SiO_2$ |
| 20 | −310.82 | 0.1 | |
| 21 | 55.19 | 7.0 | $SiO_2$ |
| 22 | 69.10 | 7.0 | |
| 23 | 190.98 | 19.0 | $SiO_2$ |
| 24 | −425.68 | 1.0 | |
| 25 | −138.88 | 18.5 | $SiO_2$ |
| 26 | −125.97 | 15.4 | |

Figure 28:
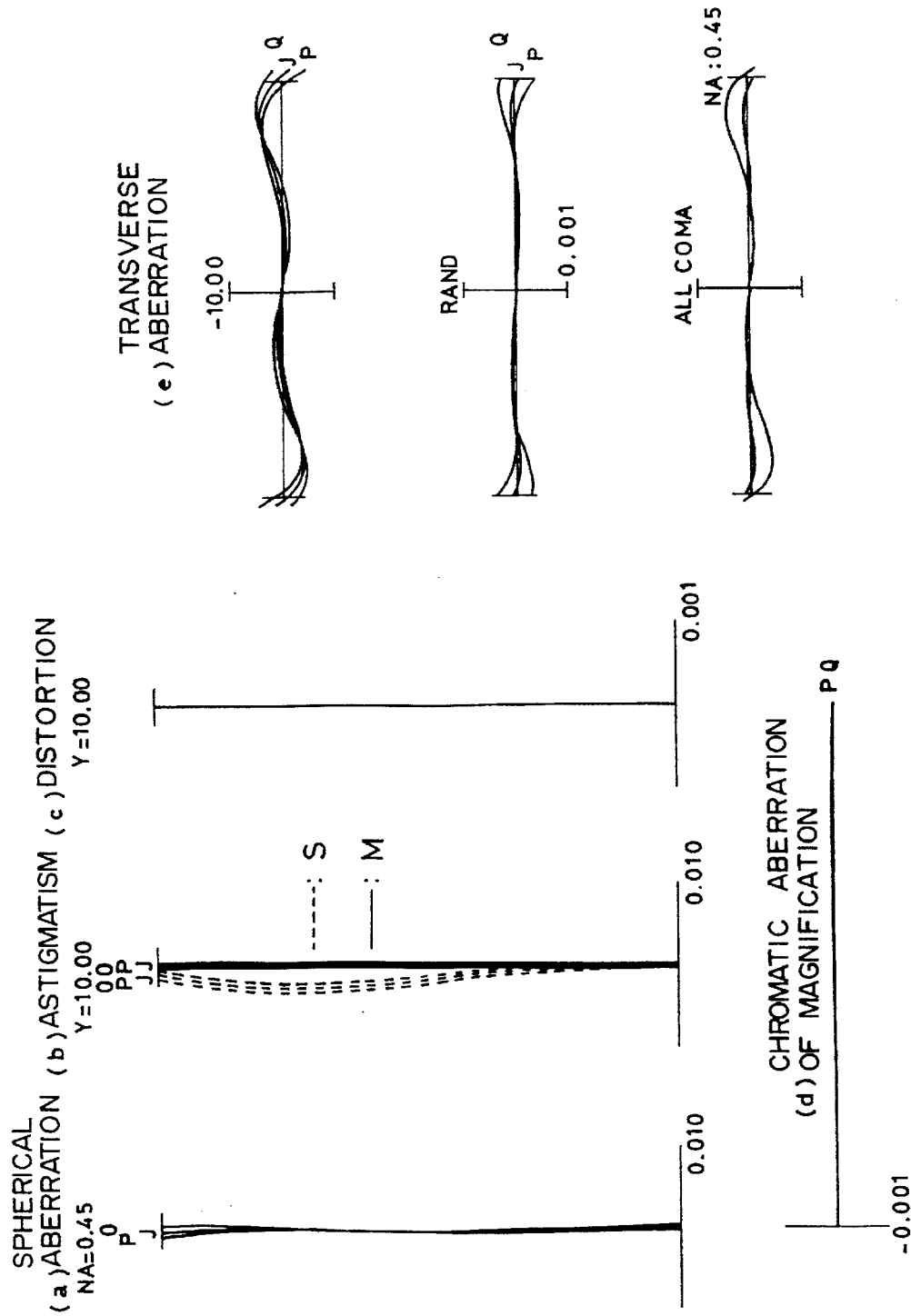
FIG. 28 is aberration diagrams for the projection optical system in the first experimental example in the fourth embodiment.

Also, FIG. 28 is aberration diagrams, in which (a) to (c) are diagrams of longitudinal aberrations in the first experimental example in the fourth embodiment, (d) a diagram of chromatic aberration of magnification in the first experimental example of the fourth embodiment, and (e) a diagram of a transverse aberration in the first experimental example of the fourth embodiment. In the aberration diagrams, symbols J, P and Q represent operating wavelengths of 248.4 nm, 247.9 nm and 248.9 nm, respectively. It is seen from these aberration diagrams that the various aberrations are well corrected in the region of wide image circle in this example even with the large numerical aperture of 0.45. The chromatic aberration is also well corrected.

Figure 29:
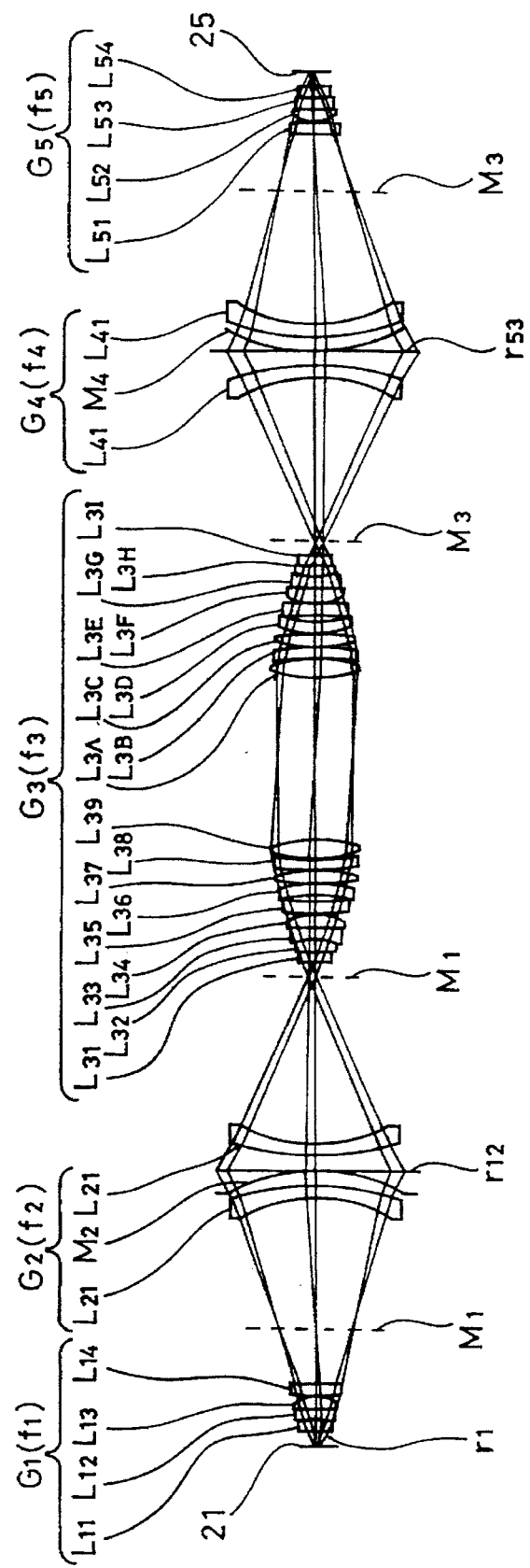
FIG. 29 is a developed path diagram to show a projection optical system in a second experimental example in the fourth embodiment.

FIG. 29 is a developed path diagram to show a projection optical system in a second experimental example of the fourth embodiment. Light from the pattern on reticle (21) passes through a first converging group $G_1$, is then reflected at the periphery of a first plane mirror $M_1$ having an aperture at the center and inclined at 45° relative to the optical axis, and thereafter reaches a second converging group $G_2$ including a first concave reflecting mirror $M_2$. The light reflected by the second converging group $G_2$ forms a first intermediate image of the pattern in the aperture of first plane mirror $M_1$. The light from the first intermediate image passes through a third converging group $G_3$ to form a second intermediate image of the pattern in an aperture of a second plane mirror $M_3$ having the aperture at the center and inclined at 45° relative to the optical axis. The light from the second intermediate image reaches a fourth converging group $G_4$ including a second concave reflecting mirror $M_4$ and is reflected thereby. The light reflected by the fourth converging group $G_4$ is then reflected at the periphery of second plane mirror $M_3$. The thus reflected light passes through a fifth converging group $G_5$ to form an image of the second intermediate image of the pattern on the surface of wafer (25).

The first converging group $G_1$ is composed of a convex lens $L_{11}$, a double concave lens (hereinafter referred to simply as "concave lens") $L_{12}$, a positive meniscus lens $L_{13}$ with a concave surface facing the reticle (21) and a negative meniscus lens $L_{14}$ with a convex surface facing the reticle (21), which are arranged in the named order from the side of reticle (21). The second converging group $G_2$ is a Mangin mirror composed of a negative meniscus lens $L_{21}$ with a concave surface facing the reticle (21) and a concave reflecting mirror $M_2$. Also, the third converging group $G_3$ is composed of a concave lens $L_{31}$, a convex lens $L_{32}$, a concave lens $L_{33}$, a positive meniscus lens $L_{34}$ with a concave surface facing the reticle (21), a negative meniscus lens $L_{35}$ with a convex surface facing the reticle (21), a positive meniscus lens $L_{36}$ with a concave surface facing the reticle (21), a convex lens $L_{37}$, a negative meniscus lens $L_{38}$ with a convex surface facing the reticle (21), a convex lens $L_{39}$ and lenses $L_{3A}$ to $L_{3I}$ symmetric with the lenses $L_{31}$ to $L_{39}$.

Further, the fourth converging group $G_4$ is a Mangin mirror composed of a negative meniscus lens $L_{41}$ with a concave surface facing the reticle (21) and a second concave reflecting mirror $M_4$. The fifth converging group $G_5$ has the arrangement symmetric with that of the first converging group $G_1$.

In other words, this example is a symmetric optical system composed of two plane mirrors each having an aperture at the center, two concave reflecting mirrors and twenty eight refracting lenses, arranged such that the numerical aperture is 0.45, the image height 5 mm and the maximum mirror radius 75 mm. Since the optical system in this example also has optical properties of nearly zero aberrations, it is apparent that the image height can be doubled or tripled by proportionally enlarging the optical system.

Also, the second converging group $G_2$ and the fourth converging group $G_4$ respectively include a negative meniscus lens and are of a Mangin mirror of the type in which the refracting lens and the concave reflecting mirror are separated from each other. If the second converging group $G_2$ including the second concave reflecting mirror $M_2$ is arranged as a Mangin mirror including a negative meniscus lens $L_{21}$, the axial chromatic aberration can be readily removed even by a small number of types of optical glass. Similarly, if the fourth converging group $G_4$ including the second concave reflecting mirror $M_4$ is arranged as a Mangin mirror including a negative meniscus lens $L_{41}$, the axial chromatic aberration can be readily removed even by a small number of types of optical glass.

Accordingly, if the second converging group $G_2$ is a Mangin mirror including a negative meniscus lens and the fourth converging group $G_4$ is also a Mangin mirror including a negative meniscus lens, as in the second experimental example, the axial chromatic aberration can be readily removed by a small number of types of optical glass in total.

Also in the optical system in this example, the all refracting lenses are made of fused quartz, and the axial and transverse chromatic aberrations are corrected for the wavelength band of 1 nm at wavelength of 248 nm of an ultraviolet excimer laser beam. Also, the spherical aberration, the coma, the astigmatism and the distortion all are well corrected to enable to provide a projection optical system with an excellent performance.

Table 6 shows a list of radius of curvature $r_i$, the surface separation $d_i$ and glass material in the second experimental example in the fourth embodiment. In the following table, the twelfth surface and the fifty third surface are hypothetical surfaces for representing the concave reflecting mirrors in the developed path diagram.

TABLE 6

| i | $r_i$ | $d_i$ | Glass Material |
|---|---|---|---|
| 0 | — | 12.0 | |
| 1 | 259.01 | 10.0 | $SiO_2$ |
| 2 | −55.98 | 1.0 | |
| 3 | −77.91 | 7.0 | $SiO_2$ |
| 4 | 265.03 | 2.0 | |
| 5 | −235.04 | 10.0 | $SiO_2$ |
| 6 | −32.95 | 0.1 | |
| 7 | 383.80 | 10.0 | $SiO_2$ |
| 8 | 190.09 | 161.5 | |
| 9 | −129.13 | 10.0 | $SiO_2$ |
| 10 | −222.54 | 12.0 | |
| 11 | −158.01 | 0.0 | |
| 12 | ∞ | 12.0 | |
| 13 | 222.54 | 10.0 | $SiO_2$ |
| 14 | 129.13 | 154.4 | |
| 15 | −42.66 | 7.5 | $SiO_2$ |
| 16 | 862.47 | 0.3 | |
| 17 | 146.57 | 11.2 | $SiO_2$ |
| 18 | −33.24 | 0.3 | |
| 19 | −35.03 | 7.5 | $SiO_2$ |
| 20 | 3429.20 | 2.1 | |
| 21 | −182.94 | 11.2 | $SiO_2$ |
| 22 | −56.77 | 0.3 | |
| 23 | 1584.18 | 9.3 | $SiO_2$ |
| 24 | 144.67 | 5.0 | |
| 25 | −159.04 | 11.2 | $SiO_2$ |
| 26 | −108.51 | 0.5 | |
| 27 | 523.65 | 11.1 | $SiO_2$ |
| 28 | −104.95 | 0.1 | |
| 29 | 437.70 | 7.5 | $SiO_2$ |
| 30 | 213.06 | 2.5 | |
| 31 | 169.96 | 15.0 | $SiO_2$ |
| 32 | −129.52 | 135.0 | |
| 33 | 129.52 | 15.0 | $SiO_2$ |
| 34 | −169.96 | 2.5 | |
| 35 | −213.06 | 7.5 | $SiO_2$ |
| 36 | −437.70 | 0.1 | |
| 37 | 104.95 | 11.1 | $SiO_2$ |
| 38 | −523.65 | 0.5 | |
| 39 | 108.51 | 11.2 | $SiO_2$ |
| 40 | 159.04 | 5.0 | |
| 41 | −144.67 | 9.3 | $SiO_2$ |
| 42 | −1584.18 | 0.3 | |
| 43 | 56.77 | 11.2 | $SiO_2$ |
| 44 | 182.94 | 2.1 | |
| 45 | −3429.20 | 7.5 | $SiO_2$ |
| 46 | 35.03 | 0.3 | |
| 47 | 33.24 | 11.2 | $SiO_2$ |
| 48 | −146.57 | 0.3 | |
| 49 | −862.47 | 7.5 | $SiO_2$ |
| 50 | 42.66 | 154.4 | |
| 51 | −129.13 | 10.0 | $SiO_2$ |
| 52 | −222.54 | 12.0 | |
| 53 | ∞ | 0.0 | |
| 54 | 158.01 | 12.0 | |
| 55 | 222.54 | 10.0 | $SiO_2$ |
| 56 | 129.13 | 161.5 | |
| 57 | −190.09 | 10.0 | $SiO_2$ |
| 58 | −383.80 | 0.1 | |
| 59 | 32.95 | 10.0 | $SiO_2$ |
| 60 | 235.04 | 2.0 | |
| 61 | −265.03 | 7.0 | $SiO_2$ |
| 62 | 77.91 | 1.0 | |
| 63 | 55.98 | 10.0 | $SiO_2$ |
| 64 | −259.01 | 11.9 | |

Figure 30:
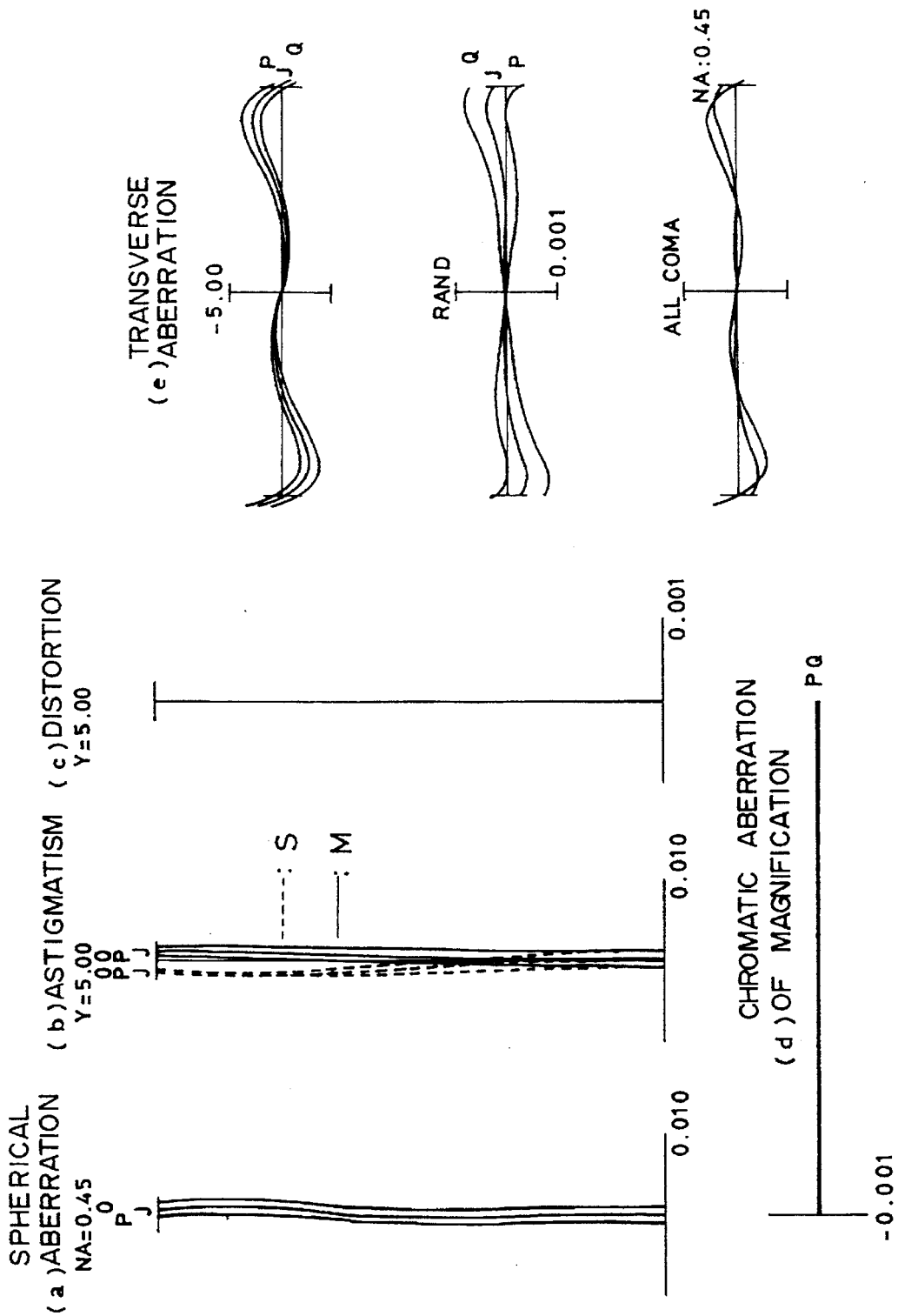
FIG. 30 is aberration diagrams for the projection optical system in the second experimental example in the fourth embodiment.

Also, FIG. 30 is aberration diagrams, in which (a) to (c) are diagrams of longitudinal aberrations in the second experimental example of the fourth embodiment, (d) a diagram of a chromatic aberration of magnification in the second experimental example of the fourth embodiment, and (e) a diagram of a transverse aberration in the second experimental example of the fourth embodiment. It is seen from these aberration diagrams that the various aberrations are well corrected in the region of wide image circle in this example even with the large numerical aperture of 0.45. The chromatic aberration is also well corrected.

Figure 31:
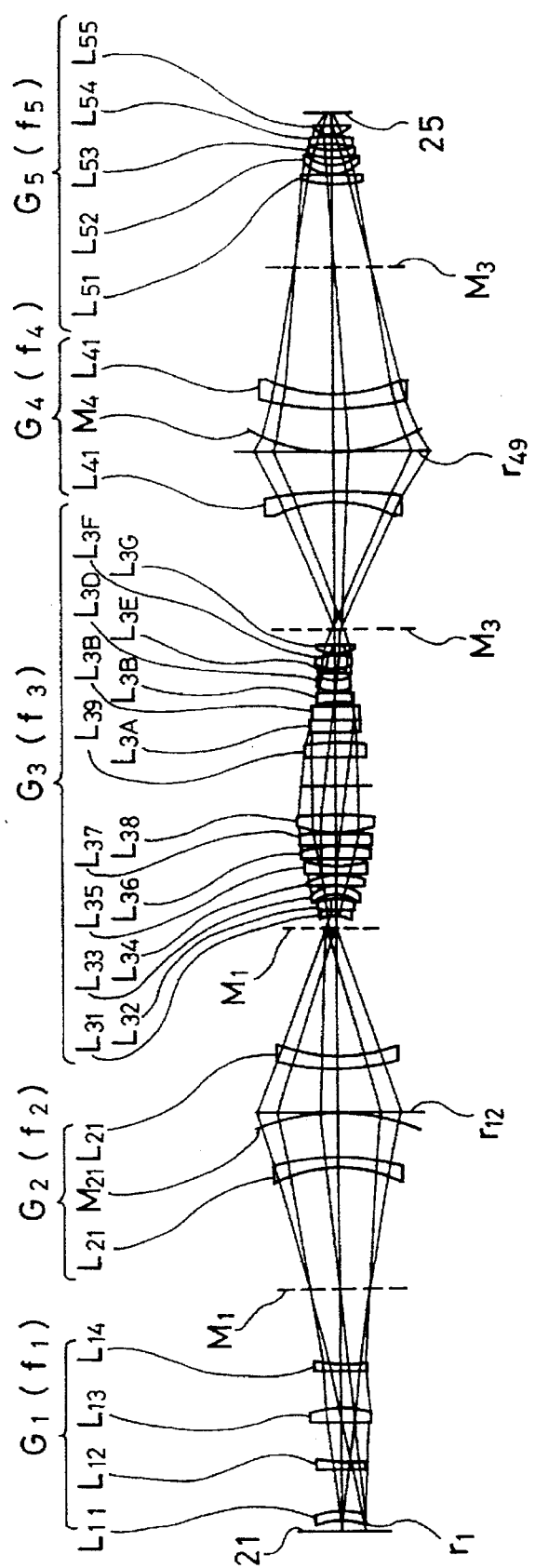
FIG. 31 is a developed path diagram to show a projection optical system in a third experimental example in the fourth embodiment.

FIG. 31 is a developed path diagram to show a projection optical system in a third experimental example of the fourth embodiment. As shown in FIG. 31, light from a pattern on reticle (21) passes through a first converging group $G_1$ composed of four refracting lenses, is then reflected at the periphery of a plane mirror $M_1$ having an aperture at the center and inclined at 45° relative to the optical axis, and thereafter reaches a second converging group $G_2$ composed of a first concave reflecting mirror $M_{21}$ and a negative meniscus lens. The light reflected by the second converging group $G_2$ forms a first intermediate image of the pattern in the aperture of plane mirror $M_1$. Then, light from the first intermediate image passes through a third converging group $G_3$ composed of sixteen refracting lenses to form a second intermediate image of the pattern in an aperture of a plane mirror $M_3$ having the aperture at the center and inclined at 45° relative to the optical axis. Light from the second intermediate image reaches a fourth converging group $G_4$ composed of a second concave reflecting mirror $M_{41}$ and a negative meniscus lens and is reflected thereby. The light reflected by the fourth converging group $G_4$ is reflected at the periphery of plane mirror $M_3$. The reflected light passes through a fifth converging group $G_5$ composed of five refracting lenses to form an image of the pattern on the surface of wafer (25).

Also, as shown in FIG. 31, the first converging group $G_1$ is composed of a positive meniscus lens $L_{11}$ with a concave surface facing the reticle 21, a negative meniscus lens $L_{12}$ with a convex surface facing the reticle (21), a convex lens $L_{13}$ and a negative meniscus lens $L_{14}$ with a convex surface facing the reticle (21), which are arranged in the named order from the side of reticle (21). The second converging group $G_2$ is composed of a negative meniscus lens $L_{21}$ with a concave surface facing the reticle (21) and a concave reflecting mirror $M_{21}$. Also, the third converging group $G_3$ is composed of a negative meniscus lens $L_{31}$ with a concave surface facing the reticle (21), a positive meniscus lens $L_{32}$ with a concave surface facing the reticle (21), a negative meniscus lens $L_{33}$ with a concave surface facing the reticle (21), a positive meniscus lens $L_{34}$ with a concave surface facing the reticle (21), a negative meniscus lens $L_{35}$ with a convex surface facing the reticle (21), a positive B meniscus lens $L_{36}$ with a concave surface facing the reticle (21), a positive meniscus lens $L_{37}$ with a concave surface facing the reticle (21), a convex lens $L_{38}$, a convex lens $L_{39}$, a convex lens $L_{3A}$, a positive meniscus lens $L_{3B}$ with a convex surface facing the reticle (21), a negative meniscus lens $L_{3C}$ with a concave surface facing the reticle (21), a positive meniscus lens $L_{3D}$ with a convex surface facing the reticle (21), a concave lens $L_{3E}$, a convex lens $L_{3F}$ and a positive meniscus lens $L_{3G}$ with a convex surface facing the reticle (21).

Further, the fourth converging group $G_4$ is composed of a negative meniscus lens $L_{41}$ with a concave surface facing the reticle (21) and a second concave reflecting mirror $M_{41}$. The fifth converging group $G_5$ is composed of a positive meniscus lens $L_{51}$ with a convex surface facing the reticle (21), a negative meniscus lens $L_{52}$ with a convex surface facing the reticle (21), a positive meniscus lens $L_{53}$ with a convex surface facing the reticle (21), a negative meniscus lens $L_{54}$ with a concave surface facing the reticle (21) and a positive meniscus lens $L_{55}$ with a convex surface facing the reticle (21).

In other words, this example is composed of two plane mirrors each having an aperture at the center, two concave reflecting mirrors and twenty seven refracting lenses, arranged such that the imaging magnification is 0.25, the numerical aperture 0.45, the object height 20 mm and the maximum mirror radius 75 mm. Also, the second converging group $G_2$ and the fourth converging group $G_4$ include a negative meniscus lens, so that each group has the structure of Mangin mirror of the type in which the refracting lens and the reflecting mirror are separated from each other. In the optical system in this example, the refracting lenses are made of fused quartz, and the axial chromatic aberration and the chromatic aberration of magnification are corrected for the wavelength band of 1 nm at wavelength of 193 nm of an ultraviolet excimer laser. Also, the spherical aberration, the coma, the astigmatism and the distortion all are well corrected as deemed as negligible, which thus enables to provide a projection optical system with an excellent performance. Then, the excellent performance can be maintained even if the image height is doubled or tripled in proportion.

Table 7 shows a list of radius of curvature $r_i$, the surface separation $d_i$ and glass material in the third experimental example in the fourth embodiment. In the following table, the twelfth surface and the forty ninth surface are hypothetical surfaces for representing the concave reflecting mirrors in the developed path diagram.

TABLE 7

| i | $r_i$ | $d_i$ | Glass Material |
|---|---|---|---|
| 0 | — | 10.0 | |
| 1 | −71.38 | 8.0 | SiO$_2$ |
| 2 | −61.85 | 35.0 | |
| 3 | 231.03 | 6.0 | SiO$_2$ |
| 4 | 71.51 | 35.0 | |
| 5 | 4288.57 | 12.0 | SiO$_2$ |
| 6 | −77.96 | 33.1 | |
| 7 | 552.21 | 6.0 | SiO$_2$ |
| 8 | 78.03 | 170.0 | |
| 9 | −140.25 | 10.0 | SiO$_2$ |
| 10 | −215.61 | 39.9 | |
| 11 | −186.04 | 0.0 | SiO$_2$ |
| 12 | ∞ | 39.9 | |
| 13 | 215.61 | 10.0 | SiO$_2$ |
| 14 | 140.25 | 125.0 | |
| 15 | −16.54 | 5.0 | SiO$_2$ |
| 16 | −72.83 | 0.3 | |
| 17 | −638.23 | 10.0 | SiO$_2$ |
| 18 | −33.20 | 5.0 | |
| 19 | −23.16 | 5.0 | SiO$_2$ |
| 20 | −36.09 | 0.3 | |
| 21 | −592.11 | 11.0 | SiO$_2$ |
| 22 | −56.28 | 0.3 | |
| 23 | 2342.59 | 7.0 | SiO$_2$ |
| 24 | 97.46 | 7.0 | |
| 25 | −363.12 | 11.0 | SiO$_2$ |
| 26 | −104.21 | 0.5 | |
| 27 | −1285.64 | 11.0 | SiO$_2$ |
| 28 | −166.22 | 0.3 | |
| 29 | 116.73 | 15.0 | SiO$_2$ |
| 30 | −222.57 | 50.0 | |
| 31 | 945.64 | 14.0 | SiO$_2$ |
| 32 | −133.90 | 8.0 | |
| 33 | 172.29 | 11.0 | SiO$_2$ |
| 34 | −944.95 | 0.5 | |
| 35 | 99.77 | 11.2 | SiO$_2$ |
| 36 | 319.67 | 4.0 | |
| 37 | −143.57 | 9.0 | SiO$_2$ |
| 38 | −2409.53 | 0.3 | |
| 39 | 54.72 | 10.0 | SiO$_2$ |

TABLE 7-continued

| i | $r_i$ | $d_i$ | Glass Material |
|---|---|---|---|
| 40 | 56.03 | 5.0 | |
| 41 | −61.33 | 4.0 | SiO$_2$ |
| 42 | 45.57 | 1.5 | |
| 43 | 50.21 | 12.0 | SiO$_2$ |
| 44 | −46.06 | 0.3 | |
| 45 | 26.02 | 7.5 | SiO$_2$ |
| 46 | 113.79 | 127.3 | |
| 47 | −130.37 | 10.0 | SiO$_2$ |
| 48 | −279.95 | 35.9 | |
| 49 | ∞ | 0.0 | |
| 50 | 167.11 | 35.9 | |
| 51 | 279.95 | 10.0 | SiO$_2$ |
| 52 | 130.37 | 184.6 | |
| 53 | 102.70 | 8.0 | SiO$_2$ |
| 54 | 298.78 | 0.5 | |
| 55 | 31.06 | 8.0 | SiO$_2$ |
| 56 | 30.01 | 7.0 | |
| 57 | 56.85 | 7.5 | SiO$_2$ |
| 58 | 140.95 | 5.0 | |
| 59 | −92.02 | 7.0 | SiO$_2$ |
| 60 | −103.29 | 0.5 | |
| 61 | 24.55 | 8.0 | SiO$_2$ |
| 62 | 51.79 | 12.0 | |

Figure 32:
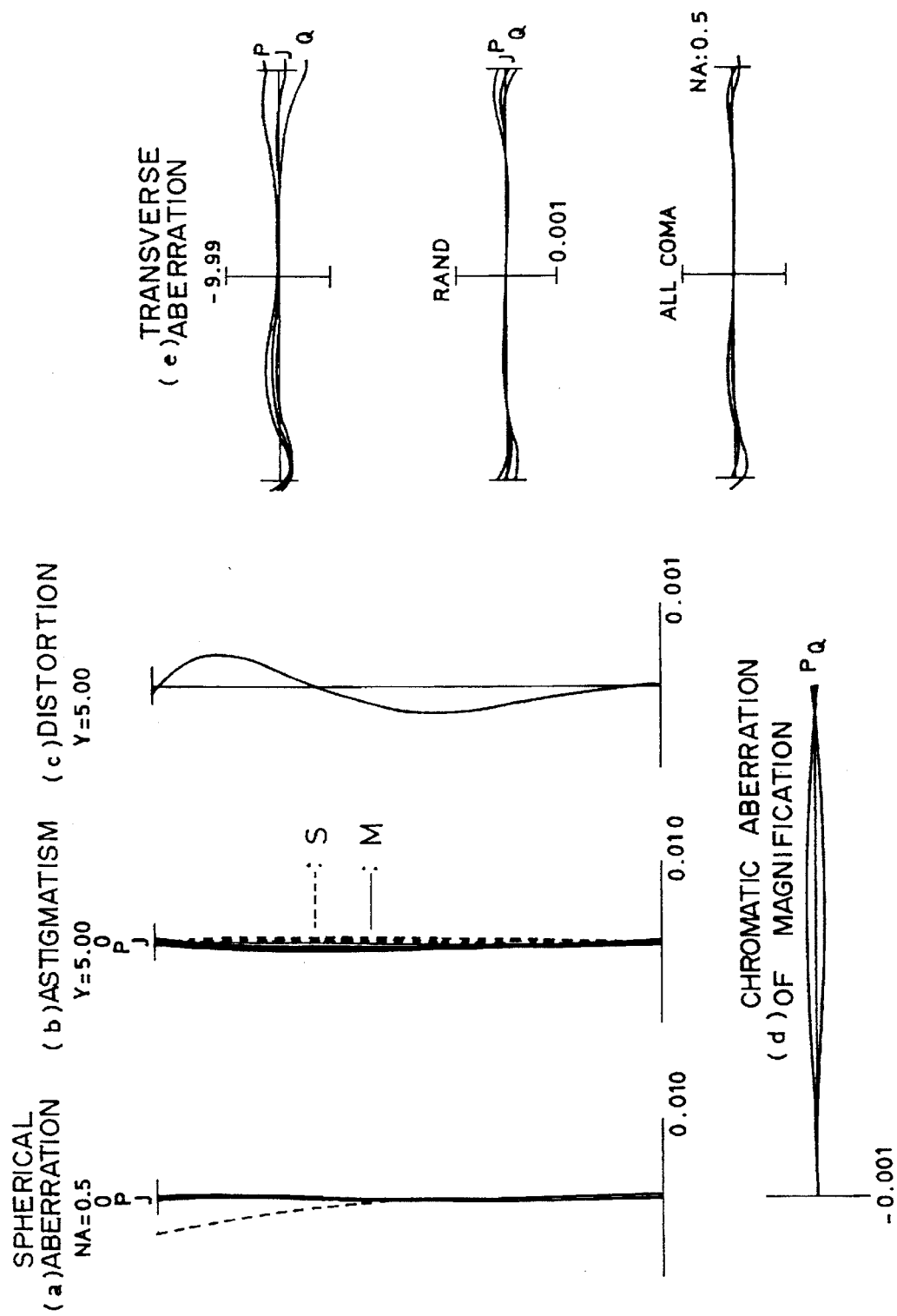
FIG. 32 is aberration diagrams for the projection optical system in the third experimental example in the fourth embodiment.

Also, FIG. 32 is aberration diagrams, in which (a) to (c) are diagrams of longitudinal aberrations in the third experimental example of the fourth embodiment, (d) a diagram of a chromatic aberration of magnification in the third experimental example of the fourth embodiment, and (e) a diagram of a transverse aberration in the third experimental example of the fourth embodiment. It is seen from these aberration diagrams that the various aberrations are well corrected in the region of wide image circle in this example even with the large numerical aperture of 0.5. The chromatic aberration is also well corrected.

It should be noted in FIG. 22 that the plane mirrors $M_3$ and $M_4$ having the aperture can be replaced by the small plane mirrors or elongate plane mirrors $M'_1$ and $M'_3$ as shown in FIG. 24 to achieve an equivalent optical system, as described above. This facilitates the production of the selection optical system. Also, the plane mirrors $M_3$ and $M_4$ may be replaced by concave mirrors or convex mirrors having an aperture or further by small concave mirrors or small convex mirrors.

It is preferred that the conditions of Equations (1) to (8) are satisfied in the present invention. Then, the above-described embodiments will be further described as to the conditions. First, let $f_i$ (i=1 to 5) be a focal length of each of the first converging group $G_1$ to the fifth converging group $G_5$ in each embodiment, $P_i$ (i=1 to 5) be a Petzval sum of each group, $n_i$ (i=1 to 5) be an apparent index of refraction of each group, and $\beta_i$ (i=1 to 5) be an imaging magnification of each group. Also, let $R_i$ (i=2, 4) be a radius of curvature of the first concave reflecting mirror $M_2$ in the second converging group $G_2$ or the second concave reflecting mirror $M_4$ in the fourth converging group $G_4$, $\beta_{12}$ be a synthetic imaging magnification of the first converging group $G_1$ and the second converging group $G_2$, and $\beta_{45}$ be a synthetic imaging magnification of the fourth converging group $G_4$ and the fifth converging group $G_5$. These imaging magnifications $\beta_{12}$ and $\beta_{45}$ will be represented by $\beta_{ij}$. Table 8 to Table 14 list specifications for each experimental example in the first to fourth embodiments as described above. In the tables, $G_T$ represents the total system, and the Petzval sum $P_i$ and the imaging magnification $\beta_i$ for the total system $G_T$ indicate a Petzval sum and an imaging magnification of the total system, respectively.

TABLE 8

Specifications in Example in First Embodiment

|  | $R_i$ | $f_i$ | $p_i$ | $n_i$ | $\beta_i$ | $\beta_{ij}$ |
|---|---|---|---|---|---|---|
| $G_1$ | — | −132.32 | −0.00865 | 0.8737 | 0.5585 | −0.254 |
| $G_2$ | −127 | 82.86 | −0.01909 | −0.6322 | −0.455 | |
| $G_3$ | — | 144.58 | 0.02795 | 0.2475 | −0.9837 | −0.9837 |
| $G_4$ | — | — | — | — | — | — |
| $G_5$ | — | — | — | — | — | — |
| $G_T$ | — | — | 0.00058 | — | 0.25 | 0.25 |

TABLE 9

Specifications in Example in Second Embodiment

|  | $R_i$ | $f_i$ | $p_i$ | $n_i$ | $\beta_i$ | $\beta_{ij}$ |
|---|---|---|---|---|---|---|
| $G_1$ | — | — | — | — | — | — |
| $G_2$ | — | — | — | — | — | |
| $G_3$ | — | 25.004 | 0.01409 | 2.8384 | −0.2847 | −0.2847 |
| $G_4$ | −143 | 94.979 | −0.01687 | −0.6241 | −2.2162 | −0.8783 |
| $G_5$ | — | 84.227 | 0.00306 | 3.87995 | 0.3963 | |
| $G_T$ | — | — | 0.00028 | — | 0.25 | 0.25 |

TABLE 10

Specifications in Example 1 in Third Embodiment

|  | r | $f_i$ | $p_i$ | $n_i$ | $\beta_i$ | $\beta_{ij}$ |
|---|---|---|---|---|---|---|
| $G_1$ | — | 961.78 | 0.00105 | 0.99022 | 4.37 | −0.620 |
| $G_2$ | −858 | 668.88 | −0.00295 | −0.50679 | −0.141 | |
| $G_3$ | — | — | — | — | — | |
| $G_4$ | −833 | 656.08 | −0.00305 | −0.49974 | 20.262 | −0.323 |
| $G_5$ | — | 201.21 | 0.00487 | 1.02054 | −0.015 | |
| $G_T$ | — | — | −0.00008 | — | 0.20 | −0.20 |

TABLE 11

Specifications in Example 2 in Third Embodiment

|  | $R_i$ | $f_i$ | $p_i$ | $n_i$ | $\beta_i$ | $\beta_{ij}$ |
|---|---|---|---|---|---|---|
| $G_1$ | — | 508.51 | 0.00216 | 0.91045 | 35.70 | −0.645 |
| $G_2$ | −428 | 333.45 | −0.00592 | −0.50658 | −0.0181 | |
| $G_3$ | — | — | — | — | — | |
| $G_4$ | −417 | 328.19 | −0.00609 | −0.5003 | −10.836 | −0.313 |
| $G_5$ | — | 100.04 | 0.00983 | 1.01689 | 0.029 | |
| $G_T$ | — | — | −0.00003 | — | 0.20 | −0.20 |

TABLE 12

Specifications in Example 1 in Fourth Embodiment

|  | $R_i$ | $f_i$ | $p_i$ | $n_i$ | $\beta_i$ | $\beta_{ij}$ |
|---|---|---|---|---|---|---|
| $G_1$ | — | 145.01 | 0.00436 | 1.581705 | 1.33 | −1.17 |
| $G_2$ | −1190 | 594.96 | −0.00168 | −1.000000 | −0.876 | |
| $G_3$ | — | 146.71 | −0.00548 | −1.243795 | −1.00 | −1.00 |
| $G_4$ | −1190 | 594.96 | −0.00168 | −1.000000 | −1.14 | −0.85 |
| $G_5$ | — | 145.01 | 0.00436 | 1.581705 | 0.75 | |
| $G_T$ | — | — | −0.0001 | — | −1.00 | −1.00 |

TABLE 13

Specifications in Example 2 in Fourth Embodiment

|  | $R_i$ | $f_i$ | $p_i$ | $n_i$ | $\beta_i$ | $\beta_{ij}$ |
|---|---|---|---|---|---|---|
| $G_1$ | — | 70.19 | 0.00960 | 1.483971 | 1.70 | −1.12 |
| $G_2$ | −158 | 95.26 | −0.01485 | −0.70688 | −0.66 | |
| $G_3$ | — | 114.70 | 0.01008 | 0.86487 | −1.00 | −1.00 |
| $G_4$ | −158 | 95.26 | −0.01485 | −0.70688 | −1.52 | −0.90 |
| $G_5$ | — | 70.19 | 0.00960 | 1.483971 | 0.59 | |
| $G_T$ | — | — | −0.0004 | — | −1.01 | −1.01 |

TABLE 14

Specifications in Example 3 in Fourth Embodiment

|  | r | $f_i$ | $p_i$ | $n_i$ | $\beta_i$ | $\beta_{ij}$ |
|---|---|---|---|---|---|---|
| $G_1$ | — | −793.98 | −0.00196 | 0.642 | 0.826 | −0.412 |
| $G_2$ | −186 | 103.76 | −0.01254 | −0.768 | −0.4988 | |
| $G_3$ | — | 104.63 | 0.01688 | 0.566 | −0.7755 | −0.7755 |
| $G_4$ | −167 | 102.82 | −0.01491 | −0.653 | −2.425 | −0.7828 |
| $G_5$ | — | 52.26 | 0.01294 | 1.483 | 0.3228 | |
| $G_T$ | — | — | 0.00040 | — | −0.25 | −0.25 |

Table 15 and Table 16 list values of parameters in the conditional Equations (1) to (6) in each embodiment, based on Table 8 to Table 14.

TABLE 15

Correspondence Table (A) for Conditional Equations (1) to (6)

| Conditional Equation | Embodiment | | | |
|---|---|---|---|---|
| | 1 | 2 | 3-1 | 3-2 |
| (1) $p_1 + p_3 + p_5 > 0$ | 0.0193 | 0.017 | 0.00592 | 0.01199 |
| (2) $p_2 + p_4 < 0$ | −0.0191 | −0.017 | −0.006 | −0.01201 |
| (3) $|p_1 + p_2 + p_3 + p_4 + p_5| < 0.01$ | 0.0002 | 0.000 | 0.00008 | −0.00002 |

TABLE 15-continued

Correspondence Table (A) for Conditional Equations (1) to (6)

| Conditional Equation | Embodiment | | | |
|---|---|---|---|---|
| | 1 | 2 | 3-1 | 3-2 |
| (4) $0.1 \leq |\beta_{12}| \leq 2$ | 0.25 | — | 0.62 | 0.65 |
| (5) $0.1 \leq |\beta_3| \leq 2$ | 0.98 | 0.28 | — | — |
| (6) $0.1 \leq |\beta_{45}| \leq 2$ | — | 0.88 | 0.32 | 0.31 |

TABLE 16

Correspondence Table (B) for Conditional Equations (1) to (6)

| Conditional Equation | Embodiment | | |
|---|---|---|---|
| | 4-1 | 4-2 | 4-3 |
| (1) $p_1 + p_3 + p_5 > 0$ | 0.00324 | 0.02928 | 0.02786 |
| (2) $p_2 + p_4 < 0$ | −0.00336 | −0.02970 | −0.02745 |
| (3) $|p_1 + p_2 + p_3 + p_4 + p_5| < 0.01$ | −0.00012 | −0.00042 | 0.00041 |
| (4) $0.1 \leq |\beta_{12}| \leq 2$ | 1.17 | 1.12 | 0.4 |
| (5) $0.1 \leq |\beta_3| \leq 2$ | 1.0 | 1.0 | 0.77 |
| (6) $0.1 \leq |\beta_{45}| \leq 2$ | 0.85 | 0.9 | 0.78 |

Also, the conditional Equations (7) and (8) are preferably satisfied in the present invention. Table 17 lists values of parameters $R_2$, $p_2$, $n_2$, $R_4$, $p_4$, $n_4$ for the second converging group $G_2$ and the fourth converging group $G_4$ in the conditional Equations (7) and (8) in each embodiment.

TABLE 17

Correspondence Table (A) for Parameters in Conditional Equations (7) and (8)

| Embodiment | Parameters | | | | | |
|---|---|---|---|---|---|---|
| | $|R_2|$ | $p_2$ | $n_2$ | $|R_4|$ | $p_4$ | $n_4$ |
| 1 | 127. | −0.01909 | −0.6322 | — | — | — |
| 2 | — | — | — | 143. | −0.01687 | −0.6241 |
| 3-2 | 428. | −0.00592 | −0.50658 | 417. | −0.00609 | −0.5003 |
| 4-1 | 1190. | −0.00168 | −1.0 | 1190. | −0.00168 | −1.0 |
| 4-2 | 158. | −0.01485 | −0.70688 | 158. | −0.01485 | −0.70688 |
| 4-3 | 186. | −0.01254 | −0.768 | 167. | −0.01491 | −0.653 |

Also, values of $n_2p_2$, $2/|R_2|$, $n_4p_4$ and $2/|R_4|$ in the conditional Equations (7) and (8) are obtained as follows from Table 17 in each embodiment.

TABLE 18

Correspondence Table (B) for Parameters in Conditional Equations (7) and (8)

| Embodiment | Parameters | | | |
|---|---|---|---|---|
| | $n_2p_2$ | $2/|R_2|$ | $n_4p_4$ | $2/|R_4|$ |
| 1 | 0.0120686 | 0.0157778 | — | — |
| 2 | — | — | 0.0105285 | 0.0139703 |
| 3-2 | 0.0029989 | 0.0046782 | 0.0030468 | 0.0048009 |
| 4-1 | 0.00168 | 0.00168 | 0.00168 | 0.00168 |
| 4-2 | 0.0104971 | 0.0126574 | 0.0104971 | 0.0126574 |
| 4-3 | 0.0096307 | 0.0107503 | 0.0097362 | 0.0107503 |

It is seen from these tables that the above-described embodiments satisfy the conditions in Equations (1) and (8).

In the above-described embodiments, the glass material for the refracting optical system is optical glass such as quartz and fluorite. The optical glass such as quartz and fluorite is appropriate in which it can transmit the ultraviolet rays.

In case illumination light employed is infrared rays, the material for the refracting optical system may be optical glass such as silicon (Si), germanium (Ge), zinc sulfide (ZnS) or zinc selenide (ZnSe). These materials have a large transmittance for infrared rays.

Plastic optical materials such as acrylic, polystyrene or polycarbonate resins may be used as the material for the refracting optical system. Such materials permit the optical system to be mass-producible and to be produced at low cost.

Further, the present invention can be applied to so-called ordinary imaging lenses for forming an image of an object at the infinity on a predetermined observing surface instead of forming an image of a pattern on the reticle (21) at a finite distance.

Also, the above-described embodiments showed the examples of 1:1 or reduction projection optical system, but it is clear that they can be used as a magnifying projection optical system by simply inverting the positional relation between the reticle (21) and the wafer (25). Such a magnifying optical system may be profitable in use as an ultraviolet microscope.

Thus, the present invention is not limited to the above-described embodiments, but may have many embodiments and modifications within the essence of the present invention.

The catadioptric projection exposure apparatus of the present invention is so arranged that an optical path of beam is bent by a selection optical system having a transmitting portion and a reflecting portion or by a reflecting mirror, and either that a beam from a concave reflecting mirror is guided to form an intermediate image near the optical axis of the selection optical system or the reflecting mirror or that a beam from an intermediate image located near the optical axis of the selection optical system or the reflecting mirror is guided toward the concave reflecting mirror. This arrangement permits the Petzval sum and the axial chromatic aberration to be well corrected. Also, in a combination with a part of the refracting optical system, the distortion and the chromatic aberration of magnification, which are often observed in an asymmetric optical system, can be well corrected, and the spherical aberration and the coma can be well corrected as well. Accordingly, the present invention can provide the apparatus with an excellent imaging performance, without using a beam splitter. Also, in case two concave reflecting mirrors are used as first and second concave reflecting mirrors, a radius of curvature of each concave reflecting mirror can be set larger to reduce the various aberrations. Further, in case a third converging group is disposed between the first and second selection optical systems or between the first and second reflecting mirrors, the imaging magnification and the various aberrations can be controlled in a wide range.

In the case of the conventional catadioptric projection exposure apparatus using a beam splitter, the utilization of light will be lowered by about 10 to 25% because of a loss in quantity of light in the beam splitter. For example, if a ratio between transmitted light and reflected light is 50%:50% in the beam splitter, and after exposure light passes the beam splitter twice, an obtainable quantity of light is 25%. Such a reduction in quantity of light causes a decrease in exposure energy. If the decrease in exposure energy is supplemented by increasing a quantity of incident light, a quantity of light passing through the refracting optical system will greatly change before and after the beam splitter. Then, a difference in thermal variation in refracting lens gives great influence on the imaging properties.

In the conventional apparatus, reflected light on refracting surfaces in the optical system after the beam splitter or reflected light on the wafer surface could return in the coming optical path and be again reflected by the concave reflecting mirror to reach the wafer surface again. Such stray light causes a lot of flare. Also, there are factors to degrade the imaging properties, for example, unevenness of reflection properties of beam splitter depending upon the incident angle of beam, absorption of light by a reflecting film of beam splitter, a phase change of light by the reflecting film, and unevenness of the reflecting film itself. The imaging properties degraded by these factors greatly affected the resolving power of the total projection optical system in the conventional apparatus.

In contrast, the catadioptric projection exposure apparatus of the present invention employs the selection optical system or the reflecting mirror instead of the beam splitter to separate an incident beam from a reflected beam. This arrangement can rather suppress the reduction in quantity of light and the unevenness of light quantity, which reduces the influence on the imaging properties by the thermal change of refracting lenses or the change of optical properties.

Also, the conventional catadioptric projection exposure apparatus uses off-axial beams to avoid interference between incident light and reflected light in case of a ring field optical system being employed as the projection optical system. In that case, a beam must be reflected many times using a lot of mirrors to avoid interruption between the beams. This makes the total optical system complicated and the numerical aperture relatively smaller. Also, the asymmetry of optical members with respect to the optical axis makes hard machining, inspection, adjustment, accuracy seeking, and accuracy maintenance of optical members. Further, since the exposure area is narrow, the arrangement of stage mechanism is complicated, which is disadvantageous in respect of production cost and exposure accuracy.

In contrast, the catadioptric projection exposure apparatus of the present invention uses the off-axial beams while using as the selection optical system the plane mirror having an aperture at the center for example. In this case, the unevenness of image due to the change of imaging properties can be supplemented by the properties of photosensitive material on the substrate or by design of mask pattern. In some recent cases, the pupil of illumination optical system is partially shielded on purpose to increase the resolving power even in a projection exposure apparatus having an ordinary refracting optical system with no need to shield. For example, the so-called irregular illumination method employed a cross shield on the pupil plane of illumination optical system to enhance the resolving power and to deepen the depth of focus. Setting the aperture of plane mirror or the small plane mirror in a cross shield portion, the beam can pass there as enhancing the imaging performance.

What is claimed is:

1. A projection exposure apparatus comprising a projection optical system having a first partial imaging optical system for forming a first intermediate image of a pattern existing on a first surface and a second partial imaging optical system for re-imaging said first intermediate image to form an image thereof on a second surface;

wherein said first partial imaging optical system comprises a first selection optical system obliquely arranged relative to an optical axis of said first partial imaging optical system and having a reflecting portion and a transmitting portion, a first converging group for converging a beam from said pattern toward said first selection optical system, and a second converging group having a first concave reflecting mirror, for reflecting a beam reflected by said first selection optical system to form said first intermediate image of said pattern in said transmitting portion of the first selection optical system, and wherein said first selection optical system is a reflecting mirror having an aperture of a predetermined shape as said transmitting portion.

2. A projection exposure apparatus according to claim 1, wherein said second partial imaging optical system comprises a third converging group having a second concave reflecting mirror, for reflecting a beam from said first intermediate image again toward said first selection optical system, and a fourth converging group for converging a beam again reflected by said first selection optical system to form an image of said first intermediate image.

3. A projection exposure apparatus according to claim 1, wherein said second partial imaging optical system comprises a second selection optical system obliquely arranged relative to the optical axis of said second partial imaging optical system and having a reflecting portion and a transmitting portion, a third converging group for converging a beam from said first intermediate image to form a second intermediate image of said pattern in said transmitting portion of the second selection optical system, a fourth converging group having a second concave reflecting mirror, for reflecting a beam from said second intermediate image again toward said second selection optical system, and a fifth converging group for converging a beam reflected by said second selection optical system to form an image of said second intermediate image.

4. A projection exposure apparatus according to claim 1, wherein said projection optical system further comprises first running means for running said first surface in a first direction with respect to a slit illumination area on said first surface, second running means for running said second surface in a second direction conjugate with said first direction with respect to an exposure area conjugate with said illumination area on said second surface, and controlling means for controlling said first running means and said second running means to synchronize the running of said first surface with the running of said second surface.

5. An projection exposure apparatus according to claim 1, wherein Petzval sums $p_1$, $p_2$ and $p_3$ of said first converging group, said second converging group and said second partial imaging optical system satisfy the following conditional equations:

$p_1+p_3>0$, $p_2<0$ and $|p_1+p_2+p_3|<0.1$.

6. A projection exposure apparatus according to claim 1, wherein an imaging magnification $\beta_{12}$ of said first intermediate image by said first converging group and said second converging group, and an imaging magnification $\beta_3$ of the image of said first intermediate image by said second partial imaging optical system satisfy the following conditional equations:

$0.1 \leq |\beta_{12}| \pm 2$ and $0.1 \leq |\beta_3| \leq 2$.

7. A projection exposure apparatus according to claim 1, wherein an apparent index of refraction $n_2$, a Petzval sum $p_2$ and a radius of curvature $R_2$ of said first concave reflecting mirror in said second converging group satisfy the following conditional equation:

$0 \leq n_2 p_2 \leq 2/|R_2|$.

8. A projection exposure apparatus according to claim 1, wherein a conjugate relation is established between a peripheral portion where said first intermediate image is focused in said first selection optical system, and a pupil plane of said second partial imaging optical system.

9. A projection exposure apparatus according to claim 1, wherein a distance between a rear principal point of said first converging group and a focused position of said first intermediate image in said first selection optical system is set approximately equal to a focal length of said first converging group so that the projection optical system may be substantially telecentric on the side of said first surface.

10. A projection exposure according to claim 1, wherein a distance between a focused position of said first intermediate image in said first selection optical system and a front principal point of said second partial imaging optical system is set approximately equal to a focal length of said second partial imaging optical system so that said projection optical system is substantially telecentric on the side of said second surface.

11. A projection exposure apparatus according to claim 1, wherein a distance between a rear principal point of said first converging group and a focused position of said first intermediate image in said first selection optical system is set approximately equal to a focal length of said first converging group and a distance between a focused position of said first intermediate image in said first selection optical system and a front principal point of said second partial imaging optical system is set approximately equal to a focal length of said second partial imaging optical system so that the projection optical system is substantially telecentric on the side of said first surface and on the side of said second surface.

12. A projection exposure apparatus according to claim 2, wherein said second selection optical system is a reflecting mirror having an aperture of a predetermined shape as said transmitting portion.

13. A projection exposure apparatus according to claim 2, wherein Petzval sums $p_1$, $p_2$, $p_4$ and $p_5$ of said first converging group, said second converging group, said third converging group and said fourth converging group satisfy the following conditional equations:

$p_1+p_3>0$, $p_2+p_4>0$ and $|p_1+p_2+p_4+p_5|<0.1$.

14. A projection exposure apparatus according to claim 2, wherein an imaging magnification $\beta_{12}$ of said first intermediate image by said first converging group and said second converging group, and an imaging magnification $\beta_{45}$ of the image of said first intermediate image by said third converging group and said fourth converging group satisfy the following conditional equations:

$0.1 \leq |\beta_{12}| \leq 2$ and $0.1 \leq |\beta_{45}| \leq 2$.

15. A projection exposure apparatus according to claim 2, wherein an apparent index of refraction $n_2$, a Petzval sum $p_2$ and a radius of curvature $R_2$ of said first concave reflecting mirror in said second converging group satisfy the following conditional equation:

$0 \leq n_2 p_2 \leq 2/|R_2|$; and wherein an apparent index of refraction $n_4$, a Petzval sum $p_4$ and a radius of curvature $R_4$ of said second concave reflecting mirror in said third converging group satisfy the following conditional equation:

$0 \leq n_4 p_4 \leq 2/|R_4|$.

16. A projection exposure apparatus according to claim 2, wherein a distance between a focused position of said first intermediate image in said first selection optical system and a front principal point of said fourth converging group is set approximately equal to a focal length of said fourth converging group so that said projection optical system may be substantially telecentric on the side of said second surface.

17. A projection exposure apparatus according to claim 2, wherein a distance between a rear principal point of said first converging group and a focused position of said first intermediate image in said first selection optical system is set approximately equal to a focal length of said first converging group and a distance between a focused position of said first intermediate image in said first selection optical system and a front principal point of said fourth converging group is set approximately equal to a focal length of said fourth converging group so that the projection optical system is substantially telecentric on the side of said first surface and on the side of said second surface.

18. A projection exposure apparatus according to claim 3, wherein Petzval sums $p_1$, $p_2$, $p_3$, $p_4$ and $p_5$ of said first converging group, said second converging group, said third converging group, said fourth converging group and said fifth converging group satisfy the following conditional equations:

$$p_1+p_3+p_5>0,\ p_2+p_4>0,\ \text{and}\ |p_1+p_2+p_3+p_4+p_5|<0.1.$$

19. A projection exposure apparatus according to claim 3, wherein an imaging magnification $\beta_{12}$ of said first intermediate image by said first converging group and said second converging group, an imaging magnification $\beta_3$ of said second intermediate image by said third converging group, and an imaging magnification $\beta_{45}$ of the image of said second intermediate image by said fourth converging group and said fifth converging group satisfy the following conditional equations:

$$0.1\leq|\beta_{12}|\leq 2,\ 0.1\leq|\beta_3|\leq 2,\ \text{and}\ 0.1\leq|\beta_{45}|\leq 2.$$

20. A projection exposure apparatus according to claim 3, wherein an apparent index of refraction $n_2$, a Petzval sum $p_2$ and a radius of curvature $R_2$ of said first concave reflecting mirror in said second converging group satisfy the following conditional equation:

$$0\leq n_2 p_2 \leq 2/|R_2|;\ \text{and}$$

wherein an apparent index of refraction $n_4$, a Petzval sum $p_4$ and a radius of curvature $R_4$ of said second concave reflecting mirror in said fourth converging group satisfy the following conditional equation:

$$0\leq n_4 p_4 \leq 2/|R_4|.$$

21. A projection exposure apparatus according to claim 3, wherein a conjugate relation is established between a peripheral portion where said first intermediate image is focused in said first selection optical system, and a pupil plane of said third converging group and wherein another conjugate relation is also established between a peripheral portion where said second intermediate image is focused in said second selection optical system, and the pupil plane of said third converging group.

22. A projection exposure apparatus according to claim 3, wherein a distance between a focused position of said second intermediate image in said second selection optical system and a front principal point of said fifth converging group is set approximately equal to a focal length of said fifth converging group so that said projection optical system may be substantially telecentric on the side of said second surface.

23. A projection exposure apparatus according to claim 3, wherein a distance between a rear principal point of said first converging group and a focused position of said first intermediate image in said first selection optical system is set approximately equal to a focal length of said first converging group and a distance between a focused position of said second intermediate image in said second selection optical system and a front principal point of said fifth converging group is set approximately equal to a focal length of said fifth converging group so that said projection optical system may be substantially telecentric on the side of said first surface and on the side of said second surface.

24. A projection exposure apparatus comprising a projection optical system having a first partial imaging optical system for forming an intermediate image of a pattern existing on a first surface and a second partial imaging optical system for re-imaging said intermediate image to form an image thereof on a second surface;

wherein said second partial imaging optical system comprises a selection optical system obliquely arranged relative to an optical axis of said second partial imaging optical system and having a reflecting portion and a transmitting portion, a first converging group having a concave reflecting mirror, for reflecting a beam from said intermediate image focused in said transmitting portion of the selection optical system again toward said selection optical system, a second converging group for converging a beam reflected by said selection optical system to form an image of said intermediate image, and wherein said selection optical system is a reflecting mirror having an aperture of a predetermined shape as said transmitting portion.

25. A projection exposure apparatus according to claim 24, wherein said projection optical system further comprises first running means for running said first surface in a first direction with respect to a slit illumination area on said first surface, second running means for running said second surface in a second direction conjugate with said first direction with respect to an exposure area conjugate with said illumination area, on said second surface, and controlling means for controlling said first running means and said second running means to synchronize the running of said first surface with the running of said second surface.

26. A projection exposure apparatus according to claim 24, wherein Petzval sums $p_3$, $p_4$ and $p_5$ of said first partial imaging optical system, said first converging group and said second converging group satisfy the following conditional equations:

$$p_3+p_5>0,\ p_4<0\ \text{and}\ |p_3+p_4+p_5|<0.1.$$

27. A projection exposure apparatus according to claim 24, wherein an imaging magnification $\beta_3$ of said intermediate image by said first partial imaging optical system, and an imaging magnification $\beta_{45}$ of the image of said intermediate image by said first converging group and said second converging group satisfy the following conditional equations:

$$0.1\leq|\beta_3|\leq 2\ \text{and}\ 0.1\leq|\beta_{45}|\leq 2.$$

28. A projection exposure apparatus according to claim 24, wherein an apparent index of refraction $n_4$, a Petzval sum $p_4$ and a radius of curvature $R_4$ of said concave reflecting mirror in said first converging group satisfy the following conditional equation:

$$0\leq n_4 p_4 \leq 2/|R_4|.$$

29. A projection exposure apparatus according to claim 24, wherein a conjugate relation is established between a pupil plane of said first partial imaging optical system and a peripheral portion where said intermediate image is focused in said selection optical system.

30. A projection exposure apparatus according to claim 24, wherein a distance between a rear principal point of said first partial imaging optical system and a focused position of said intermediate image in said selection optical system is set approximately equal to a focal length of said first partial imaging optical system so that said projection optical system may be substantially telecentric on the side of said first surface.

31. A projection exposure apparatus according to claim 24, wherein a distance between a focused position of said intermediate image in said selection optical system and a front principal point of said second converging group is set approximately equal to a focal length of said second converging group so that said projection optical system may be substantially telecentric on the side of said second surface.

32. A projection exposure apparatus according to claim 24, wherein a distance between a rear principal point of said first partial imaging optical system and a focused position of said intermediate image in said selection optical system is set approximately equal to a focal length of said first partial imaging optical system and a distance between the focused position of said intermediate image in said selection optical system and a front principal point of said second converging group is set approximately equal to a focal length of said second converging group so that said projection optical system may be substantially telecentric on the side of said first surface and on the side of said second surface.

33. A projection exposure apparatus comprising a projection optical system having a first partial imaging optical system for forming a first intermediate image of a pattern existing on a first surface and a second partial imaging optical system for re-imaging said first intermediate image to form an image thereof on a second surface;
wherein said first partial imaging optical system comprises a first reflecting mirror obliquely arranged relative to an optical axis of said first partial imaging optical system, a first converging group for converging a beam from said pattern, and a second converging group having a first concave reflecting mirror, for reflecting a beam from said first converging group to form said first intermediate image of said pattern in said first reflecting mirror, and wherein said first reflecting mirror is a small reflecting mirror of a predetermined shape.

34. A projection exposure apparatus according to claim 33, wherein said second partial imaging optical system comprises a third converging group having a second concave reflecting mirror for reflecting a beam from said first intermediate image, and a fourth converging group for converging a beam from said third converging group to form an image of said first intermediate image of said pattern.

35. A projection exposure apparatus according to claim 33, wherein said second partial imaging optical system comprises a second reflecting mirror obliquely arranged relative to the optical axis of said second partial imaging optical system, a third converging group for converging a beam from said first intermediate image to form a second intermediate image of said pattern in said second reflecting mirror, a fourth converging group having a second concave reflecting mirror, for reflecting a beam from said second intermediate image, and a fifth converging group for converging a beam from the fourth converging group to form an image of said second intermediate image of said pattern.

36. A projection exposure apparatus according to claim 33, wherein said projection optical system further comprises first running means for running said first surface in a first direction with respect to a slit illumination area on said first surface, second running means for running said second surface in a second direction conjugate with said first direction with respect to an exposure area conjugate with said illumination area, on said second surface, and controlling means for controlling said first running means and said second running means to synchronize the running of said first surface with the running of said second surface.

37. A projection exposure apparatus according to claim 33, wherein Petzval sums $p_1$, $p_2$ and $p_3$ of said first converging group, said second converging group and said second partial imaging optical system satisfy the following conditional equations:

$$p_1+p_3>0,\ p_2<0\ \text{and}\ |p_1+p_2+p_3|<0.1.$$

38. A projection exposure apparatus according to claim 33, wherein an imaging magnification $\beta_{12}$ of said first intermediate image by said first converging group and said second converging group, and an imaging magnification $\beta_3$ of the image of said first intermediate image by said second partial imaging optical system satisfy the following conditional equations:

$$0.1 \leq |\beta_{12}| \leq 2\ \text{and}\ 0.1 \leq |\beta_3| \leq 2.$$

39. A projection exposure apparatus according to claim 33, wherein an apparent index of refraction $n_2$, a Petzval sum $p_2$ and a radius of curvature $R_2$ of said first concave reflecting mirror in said second converging group satisfy the following conditional equation:

$$0 \leq n_2 p_2 \leq 2/|R_2|.$$

40. A projection exposure apparatus according to claim 33, wherein a conjugate relation is established between a peripheral portion where said first intermediate image is focused in said first reflecting mirror, and a pupil plane of said second partial imaging optical system.

41. A projection exposure apparatus according to claim 33, wherein a distance between a rear principal point of said first converging group and a focused position of said first intermediate image in said first reflecting mirror is set approximately equal to a focal length of said first converging group so that the projection optical system may be substantially telecentric on the side of said first surface.

42. A projection exposure apparatus according to claim 33, wherein a distance between a focused position of said first intermediate image in said first reflecting mirror and a front principal point of said second partial imaging optical system is set approximately equal to a focal length of said second partial imaging optical system so that said projection optical system is substantially telecentric on the side of said second surface.

43. A projection exposure apparatus according to claim 33, wherein a distance between a rear principal point of said first converging group and a focused position of said first intermediate image in said first reflecting mirror is set approximately equal to a focal length of said first converging group and a distance between a focused position of said first intermediate image in said first reflecting mirror and a front principal point of said second partial imaging optical system is set approximately equal to a focal length of said second partial imaging optical system so that the projection optical system is substantially telecentric on the side of said first surface and on the side of said second surface.

44. A projection exposure apparatus according to claim 34, wherein said second reflecting mirror is a small reflecting mirror of a predetermined shape.

45. A projection exposure apparatus according to claim 34, wherein Petzval sums $p_1$, $p_2$, $p_4$ and $p_5$ of said first converging group, said second converging group, said third converging group and said fourth converging group satisfy the following conditional equations:

$$p_1+p_3>0,\ p_2+p_4>0\ \text{and}\ |p_1+p_2+p_4+p_5|<0.1.$$

46. A projection exposure apparatus according to claim 34, wherein an imaging magnification $\beta_{12}$ of said first intermediate image by said first converging group and said second converging group, and an imaging magnification $\beta_{45}$ of the image of said first intermediate image by said third converging group and said fourth converging group satisfy the following conditional equations:

$$0.1 \leq |\beta_{12}| \leq 2\ \text{and}\ 0.1 \leq |\beta_{45}| \leq 2.$$

47. A projection exposure apparatus according to claim 34, wherein an apparent index of refraction $n_2$, a Petzval sum $p_2$ and a radius of curvature $R_2$ of said first concave reflecting mirror in said second converging group satisfy the following conditional equation:

$$0 \leq n_2 p_2 \leq 2/|R_2|;\ \text{and}$$

wherein an apparent index of refraction $n_4$, a Petzval sum $p_4$ and a radius of curvature $R_4$ of said second concave reflecting mirror in said third converging group satisfy the following conditional equation:

$$0 \leq n_4 p_4 \leq 2/|R_4|.$$

48. A projection exposure apparatus according to claim 34, wherein a distance between a focused position of said first intermediate image in said first reflecting mirror and a front principal point of said fourth converging group is set approximately equal to a focal length of said fourth converging group so that said projection optical system may be substantially telecentric on the side of said second surface.

49. A projection exposure apparatus according to claim 34, wherein a distance between a rear principal point of said first converging group and a focused position of said first intermediate image in said first reflection mirror is set approximately equal to a focal length of said first converging group and a distance between a focused position of said first intermediate image in said first selection optical system and a front principal point of said fourth converging group is set approximately equal to a focal length of said fourth converging group so that the projection optical system is substantially telecentric on the side of said first surface and on the side of said second surface.

50. An projection exposure apparatus according to claim 35, wherein Petzval sums $p_1$, $p_2$, $p_3$, $p_4$ and $p_5$ of said first converging group, said second converging group, said third converging group, said fourth converging group and said fifth converging group satisfy the following conditional equations:

$$p_1+p_3+p_5>0,\ p_2+p_4>0,\ \text{and}\ |p_1+p_2+p_3+p_4+p_5|<0.1.$$

51. An projection exposure apparatus according to claim 35, wherein an imaging magnification $\beta_{12}$ of said first intermediate image by said first converging group and said second converging group, an imaging magnification $\beta_3$ of said second intermediate image by said third converging group, and an imaging magnification $\beta_{45}$ of said third intermediate image by said fourth converging group and said fifth converging group satisfy the following conditional equations:

$$0.1 \leq |\beta_{12}| \leq 2,\ 0.1 \leq |\beta_3| \leq 2,\ \text{and}\ 0.1 \leq |\beta_{45}| \leq 2.$$

52. An projection exposure apparatus according to claim 35, wherein an apparent index of refraction $n_2$, a Petzval sum $p_2$ and a radius of curvature $R_2$ of said first concave reflecting mirror in said second converging group satisfy the following conditional equation:

$$0 \leq n_2 p_2 \leq 2/|R_2|;\ \text{and}$$

wherein an apparent index of refraction $n_4$, a Petzval sum $p_4$ and a radius of curvature $R_4$ of said second concave reflecting mirror in said fourth converging group satisfy the following conditional equation:

$$0 \leq n_4 p_4 \leq 2/|R_4|.$$

53. A projection exposure apparatus according to claim 35, wherein a conjugate relation is established between a peripheral portion where said first intermediate image is focused in said first reflecting mirror, and a pupil plane of said third converging group and wherein another conjugate relation is also established between a peripheral portion where said second intermediate image is focused in said second reflecting mirror, and the pupil plane of said third converging group.

54. A projection exposure apparatus according to claim 35, wherein a distance between a focused position of said second intermediate image in said second reflecting mirror and a front principal point of said fifth converging group is set approximately equal to a focal length of said fifth converging group so that said projection optical system may be substantially telecentric on the side of said second surface.

55. A projection exposure apparatus according to claim 35, wherein a distance between a rear principal point of said first converging group and a focused position of said first intermediate image in said first reflecting mirror is set approximately equal to a focal length of said first converging group and a distance between a focused position of said second intermediate image in said second reflecting mirror and a front principal point of said fifth converging group is set approximately equal to a focal length of said fifth converging group so that said projection optical system may be substantially telecentric on the side of said first surface and on the side of said second surface.

56. A projection exposure apparatus comprising a projection optical system having a first partial imaging optical system for forming an intermediate image of a pattern existing on a first surface and a second partial imaging optical system for re-imaging said intermediate image to form an image thereof on a second surface;

wherein said second partial imaging optical system comprises a reflecting mirror obliquely arranged relative to an optical axis of said second partial imaging optical system, a first converging group having a concave reflecting mirror, for reflecting a beam from said intermediate image focused in said reflecting mirror, and a second converging group for converging a beam from said first converging group to form an image of said intermediate image, and wherein said reflecting mirror is a small reflecting mirror of a predetermined shape.

57. A projection exposure apparatus according to claim 56, wherein said projection optical system further comprises first running means for running said first surface in a first direction with respect to a slit illumination area on said first surface, second running means for running said second surface in a second direction conjugate with said first direction with respect to an exposure area conjugate with said illumination area, on said second surface, and controlling means for controlling said first running means and said second running means to synchronize the running of said first surface with the running of said second surface.

58. A projection exposure apparatus according to claim 56, wherein Petzval sums $p_3$, $p_4$ and $p_5$ of said first partial imaging optical system, said first converging group and said second converging group satisfy the following conditional equations:

$$p_3+p_5>0, \; p_4<0 \text{ and } |p_3+p_4+p_5|<0.1.$$

59. A projection exposure apparatus according to claim 56, wherein an imaging magnification $\beta_3$ of said intermediate image by said first partial imaging optical system, and an imaging magnification $\beta_{45}$ of the image of said intermediate image by said first converging group and said second converging group satisfy the following conditional equations:

$$0.1 \leq |\beta_3| \leq 2 \text{ and } 0.1 \leq |\beta_{45}| \leq 2.$$

60. A projection exposure apparatus according to claim 56, wherein an apparent index of refraction $n_4$, a Petzval sum $p_4$ and a radius of curvature $R_4$ of said concave reflecting mirror in said first converging group satisfy the following conditional equation:

$$0 \leq n_4 p_4 \leq 2/|R_4|.$$

61. A projection exposure apparatus according to claim 56, wherein a conjugate relation is established between a pupil plane of said first partial imaging optical system and a peripheral portion where said intermediate image is focused in said reflecting mirror.

62. A projection exposure apparatus according to claim 56, wherein a distance between a rear principal point of said first partial imaging optical system and a focused position of said intermediate image in said reflecting mirror is set approximately equal to a focal length of said first partial imaging optical system so that said projection optical system may be substantially telecentric on the side of said first surface.

63. A projection exposure apparatus according to claim 56, wherein a distance between a focused position of said intermediate image in said reflecting mirror and a front principal point of said second converging group is set approximately equal to a focal length of said second converging group so that said projection optical system may be substantially telecentric on the side of said second surface.

64. A projection exposure apparatus according to claim 56, wherein a distance between a rear principal point of said first partial imaging optical system and a focused position of said intermediate image in said selection optical system is set approximately equal to a focal length of said first partial imaging optical system and a distance between the focused position of said intermediate image in said reflecting mirror and a front principal point of said second converging group is set approximately equal to a focal length of said second converging group so that said projection optical system may be substantially telecentric on the side of said first surface and on the side of said second surface.

* * * * *